United States Patent
Kosaki et al.

(10) Patent No.: US 8,230,297 B2
(45) Date of Patent: Jul. 24, 2012

(54) ERROR CORRECTION DEVICE

(75) Inventors: Makoto Kosaki, Kasugai (JP); Kazuki Usui, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 997 days.

(21) Appl. No.: 12/182,786

(22) Filed: Jul. 30, 2008

(65) Prior Publication Data

US 2009/0037796 A1  Feb. 5, 2009

(30) Foreign Application Priority Data

Jul. 31, 2007  (JP) .................................. 2007-198462

(51) Int. Cl.
*G06F 11/00* (2006.01)

(52) U.S. Cl. ....................................... 714/755; 380/268

(58) Field of Classification Search .................. None
See application file for complete search history.

(56) References Cited

U.S. PATENT DOCUMENTS

| | | | |
|---|---|---|---|
| 6,772,385 B2 | 8/2004 | Ohyama et al. | |
| 7,181,483 B2 | 2/2007 | Ohyama et al. | |
| 7,607,074 B2 * | 10/2009 | Takeuchi | 714/799 |
| 7,836,375 B2 * | 11/2010 | Ariyama | 714/755 |
| 7,876,638 B2 * | 1/2011 | Pekny | 365/230.03 |
| 2003/0135798 A1 * | 7/2003 | Katayama et al. | 714/710 |
| 2006/0115087 A1 * | 6/2006 | Takeuchi | 380/268 |
| 2006/0156202 A1 * | 7/2006 | Takeuchi | 714/776 |
| 2006/0248427 A1 * | 11/2006 | Katayama et al. | 714/746 |
| 2007/0043999 A1 * | 2/2007 | Ariyama | 714/758 |
| 2008/0152131 A1 * | 6/2008 | Senoo | 380/42 |
| 2008/0205145 A1 * | 8/2008 | Kanno et al. | 365/185.05 |
| 2009/0010117 A1 * | 1/2009 | Kobayashi et al. | 369/47.14 |
| 2009/0052658 A1 * | 2/2009 | Kodama et al. | 380/28 |
| 2009/0067276 A1 * | 3/2009 | Pekny | 365/230.03 |
| 2011/0131476 A1 * | 6/2011 | Ariyama | 714/799 |
| 2011/0153700 A1 * | 6/2011 | Gopal et al. | 708/209 |

FOREIGN PATENT DOCUMENTS

| | | |
|---|---|---|
| JP | 2001-292066 A | 10/2001 |
| JP | 2003-187532 A | 7/2003 |
| JP | 2003-242720 A | 8/2003 |
| JP | 2006-155835 A | 6/2006 |
| JP | 2006-155836 A | 6/2006 |
| JP | 2008-159109 A | 7/2008 |

OTHER PUBLICATIONS

Japanese Office Action dated Nov. 1, 2011 issued in corresponding Japanese application No. 2007-198462.

* cited by examiner

*Primary Examiner* — Christopher McCarthy
(74) *Attorney, Agent, or Firm* — Fujitsu Patent Center

(57) ABSTRACT

An error correction device for reducing the amount of access to an external memory while preventing the capacity of an internal memory from increasing. An optical disc stores scramble data for each data block. A descramble circuit reads scramble data in the data blocks from the optical disc as read blocks and applies a predetermined scramble value to the scramble data of each read block to generate descramble data. A 1-shift calculator generates a first calculated value by shifting the scramble value by one byte using a generation polynomial. A second shift calculator generates a second calculated value by shifting the scramble value by a number of bytes corresponding to {(total bytes of the data block in the column direction)+1−(total bytes of each read block in the column direction)} using the generation polynomial. An EOR circuit generates descramble data by applying the first or second calculated value as the scramble value to the input scramble data.

19 Claims, 38 Drawing Sheets

Fig.4

| | 0 | 1 | 2 | 3 | ... | 302 | 303 |
|---|---|---|---|---|---|---|---|
| 0 | e(0,0) | e(0,1) | e(0,2) | e(0,3) | | e(0,302) | e(0,303) |
| 1 | e(1,0) | e(1,1) | e(1,2) | e(1,3) | | e(1,302) | e(1,303) |
| 2 | e(2,0) | e(2,1) | e(2,2) | e(2,3) | e(i,j) | e(2,302) | e(2,303) |
| 3 | e(3,0) | e(3,1) | e(3,2) | e(3,3) | | e(3,302) | e(3,303) |
| 4 | e(4,0) | e(4,1) | e(4,2) | e(4,3) | | e(4,302) | e(4,303) |
| ... | | | | | | | |
| 213 | e(213,0) | e(213,1) | e(213,2) | e(213,3) | | e(213,302) | e(213,303) |
| 214 | e(214,0) | e(214,1) | e(214,2) | e(214,3) | | e(214,302) | e(214,303) |
| 215 | e(215,0) | e(215,1) | e(215,2) | e(215,3) | | e(215,302) | e(215,303) |
| 216 | p(216,0) | p(216,1) | p(216,2) | p(216,3) | p(i,j) | p(216,302) | p(216,303) |
| 217 | p(217,0) | p(217,1) | p(217,2) | p(217,3) | | p(217,302) | p(217,303) |
| ... | | | | | | | |
| 246 | p(246,0) | p(246,1) | p(246,2) | p(246,3) | | p(246,302) | p(246,303) |
| 247 | p(247,0) | p(247,1) | p(247,2) | p(247,3) | | p(247,302) | p(247,303) |

216Byte / 32Byte

PB

Fig.7
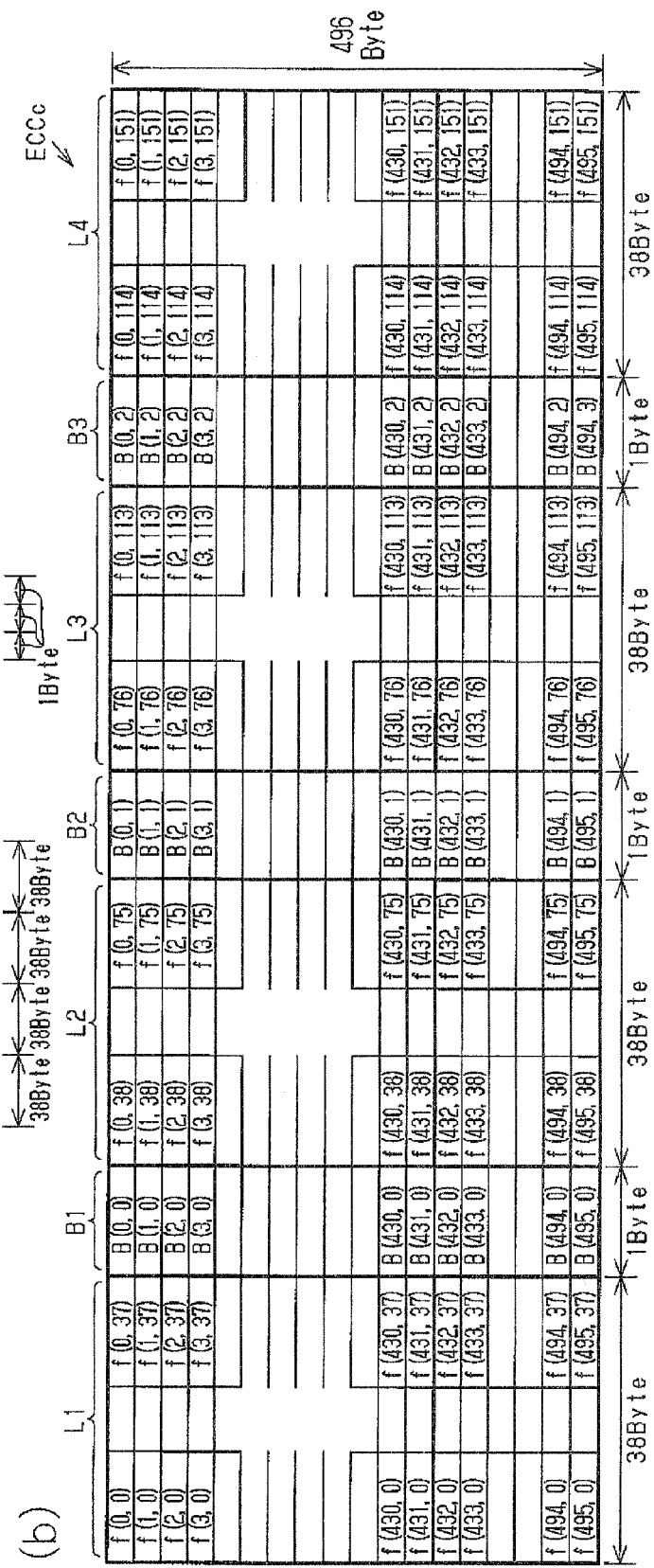

| | Data Input Order → | | | | | | |
|---|---|---|---|---|---|---|---|
| Descramble Data | dD0 | dD1 | dD2 | ... | dD2049 | dD2050 | dD2051 |
| Polynomial Expression | $X^{2051}$ | $X^{2050}$ | $X^{2049}$ | ... | $X^2$ | $X^1$ | $X^0$ |

| e (0, 0) | e (0, 1) | | | e (0, 302) | e (0, 303) | |
|---|---|---|---|---|---|---|
| e (1, 0) | e (1, 1) | | | e (1, 302) | e (1, 303) | |
| e (2, 0) | e (2, 1) | | | e (2, 302) | e (2, 303) | |
| e (3, 0) | e (3, 1) | | | e (3, 302) | e (3, 303) | |
| e (4, 0) | e (4, 1) | | | e (4, 302) | e (4, 303) | |
| e (5, 0) | e (5, 1) | | | e (5, 302) | e (5, 303) | RB1 |
| e (6, 0) | e (6, 1) | | | e (6, 302) | e (6, 303) | |
| e (7, 0) | e (7, 1) | | | e (7, 302) | e (7, 303) | |

| e (8, 0) | e (8, 1) | | | e (8, 302) | e (8, 303) | |
|---|---|---|---|---|---|---|
| e (9, 0) | e (9, 1) | | | e (9, 302) | e (9, 303) | |
| e (10, 0) | e (10, 1) | | | e (10, 302) | e (10, 303) | |
| e (11, 0) | e (11, 1) | | | e (11, 302) | e (11, 303) | |
| e (12, 0) | e (12, 1) | | | e (12, 302) | e (12, 303) | |
| e (13, 0) | e (13, 1) | | | e (13, 302) | e (13, 303) | RB2 |
| e (14, 0) | e (14, 1) | | | e (14, 302) | e (14, 303) | |
| e (15, 0) | e (15, 1) | | | e (15, 302) | e (15, 303) | |

:

| p (240, 0) | p (240, 1) | | | p (240, 302) | p (240, 303) | |
|---|---|---|---|---|---|---|
| p (241, 0) | p (241, 1) | | | p (241, 302) | p (241, 303) | |
| p (242, 0) | p (242, 1) | | | p (242, 302) | p (242, 303) | |
| p (243, 0) | p (243, 1) | | | p (243, 302) | p (243, 303) | |
| p (244, 0) | p (244, 1) | | | p (244, 302) | p (244, 303) | |
| p (245, 0) | p (245, 1) | | | p (245, 302) | p (245, 303) | RB31 |
| p (246, 0) | p (246, 1) | | | p (246, 302) | p (246, 303) | |
| p (247, 0) | p (247, 1) | | | p (247, 302) | p (247, 303) | |

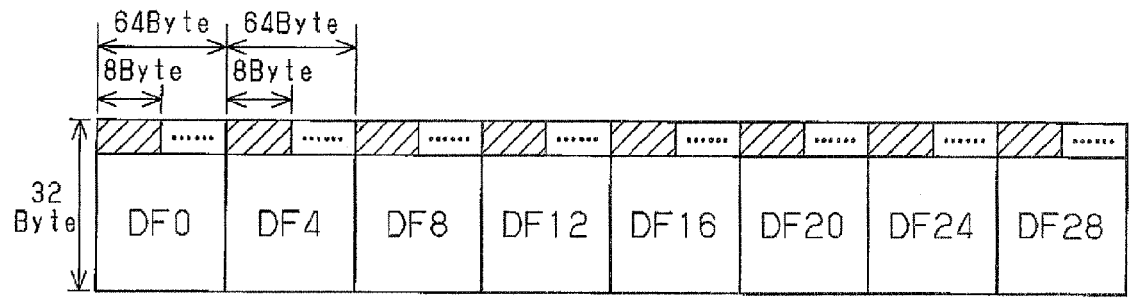

| 1st Row | | 2nd Row | |
|---|---|---|---|
| Byte Expression | Bit Expression | Byte Expression | Bit Expression |
| 2051 | 16415<br>16414<br>16413<br>16412<br>16411<br>16410<br>16409<br>16408 | 1835 | 14687<br>14686<br>14685<br>14684<br>14683<br>14682<br>14681<br>14680 |
| 2050 | 16407<br>16406<br>16405<br>16404<br>16403<br>16402<br>16401<br>16400 | 1834 | 14679<br>14678<br>14677<br>14676<br>14675<br>14674<br>14673<br>14672 |
| ⋮ | 16399<br>16398<br>⋮<br>16369<br>16368 | ⋮ | 14671<br>14670<br>⋮<br>14641<br>14640 |
| 2045 | 16367<br>16366<br>16365<br>16364<br>16363<br>16362<br>16361<br>16360 | 1829 | 14639<br>14638<br>14637<br>14636<br>14635<br>14634<br>14633<br>14632 |
| 2044 | 16359<br>16358<br>16357<br>16356<br>16355<br>16354<br>16353<br>16352 | 1828 | 14631<br>14630<br>14629<br>14628<br>14627<br>14626<br>14625<br>14624 |

(b)

| 1st Row | | 2nd Row | |
|---|---|---|---|
| Byte Expression | Bit Expression | Byte Expression | Bit Expression |
| 1943 | 15551<br>15550<br>15549<br>15548<br>15547<br>15546<br>15545<br>15544 | 1727 | 13823<br>13822<br>13821<br>13820<br>13819<br>13818<br>13817<br>13816 |
| 1942 | 15543<br>15542<br>15541<br>15540<br>15539<br>15538<br>15537<br>15536 | 1726 | 13815<br>13814<br>13813<br>13812<br>13811<br>13810<br>13809<br>13808 |
| ⋮ | 15535<br>15534<br>⋮<br>15505<br>15504 | ⋮ | 13807<br>13806<br>⋮<br>13777<br>13776 |
| 1937 | 15503<br>15502<br>15501<br>15500<br>15499<br>15498<br>15497<br>15496 | 1721 | 13775<br>13774<br>13773<br>13772<br>13771<br>13770<br>13769<br>13768 |
| 1936 | 15495<br>15494<br>15493<br>15492<br>15491<br>15490<br>15489<br>15488 | 1720 | 13767<br>13766<br>13765<br>13764<br>13763<br>13762<br>13761<br>13760 |

ERROR CORRECTION DEVICE

CROSS-REFERENCE TO RELATED APPLICATIONS

This application is based upon and claims the benefit of priority from the prior Japanese Patent Application No. 2007-198462, filed on Jul. 31, 2007, the entire contents of which are incorporated herein by reference.

BACKGROUND

1. Field

It is related to an error correction device and a descramble circuit.

2. Description of the Related Art

Storage media, such as optical discs, have memory capacities that have been increasing over recent years. Accordingly, the time taken to read data from such large-capacity storage media must be shortened. However, flaws on an optical disc generated during manufacture and smears on the surface of the optical disc may make it difficult to correctly read data at high speeds from such an optical disc. To prevent problems associated with erroneous data, the optical disc system stores Reed-Solomon error correcting codes together with data. An error correction device performs error correction based on the error correcting codes and restores the original correct data. However, the processing time required by such error correction is long. To shorten the time taken to read data, error correction must be performed at higher speeds.

New high-density optical discs developed recently feature long-duration storage of video data with high picture quality and audio data with high sound quality. One example of such high-density optical discs is a Blu-ray Disc (BD). For example, Japanese Laid-Open Patent Publication No. 2003-242720 describes a method for storing data in a high-density optical disc. An error detecting code (EDC) and an error correcting code (ECC) are appended to data stored in a BD. The EDC is used to detect an error in the data when the data is read. The ECC is used to correct the detected error.

The format of data that is stored in a BD will now be described in detail. As shown in FIG. 1, user data UD includes 32 data frames DF0 to DF31 (collectively referred to as "data frames DF"). A single data frame DF includes 2048 bytes (2 kilobytes) of user data and an EDC consisting of 4 bytes. The 4-byte EDC follows the 2048-byte user data. The EDC is calculated using the equation shown below.

$$EDC(x) = \sum_{i=31}^{0} b_i x^i = I(x) \bmod G(x) \qquad \text{Equation 1}$$

where, $$I(x) = \sum_{i=16415}^{32} b_i x^i, \ G(x) = x^{32} + x^{31} + x^4 + 1$$

The user data is scrambled by DF unit before preserved in ED. Through the scrambling process, the user data UD is converted to a scramble data frame SDF, which consists of 2052 rows of 32 columns of data elements d(u, v) as shown in FIG. 3A. The data frames DF of the scramble data frame SDF are arranged in columns. In the data elements d(u, v), u indicates the row number of each data element of the scramble data frame SDF and v indicates the column number of each data element of the scramble data frame SDF.

As known in the art, the scramble data is generated by performing an exclusive OR operation on each byte of the original data, which is a data frame that has not yet been scrambled, and the lower eight bits of a scramble value SC. The scramble value SC is generated by a scrambling-value generation circuit 100 shown in FIG. 2. As shown in FIG. 2, the generation circuit 100 uses a predetermined generation polynomial $\Phi(x)$ ($\Phi(x)=x^{16}+x^{15}+x^{13}+x^4+1$ in the example of FIG. 2). The generation circuit 100 includes a feedback shift register 101 and EOR circuits 102, 103, and 104. The feedback shift register 101 includes bits b15 to b0.

The EOR circuit 102 outputs a calculation result of the exclusive OR operation performed on the bit b15 and the bit b14 to the EOR circuit 103. The EOR circuit 103 outputs a calculation result of the exclusive OR operation performed on the calculation result output from the EOR circuit 102 and the bit b12 to the EOR circuit 104. The EOR circuit 104 outputs a calculation result of the exclusive OR operation performed on the calculation result output from the EOR circuit 103 and the bit b3 to the bit b0.

The shift register 101 reads an initial value S0 of the scramble value, and outputs the lower eight bits (bits b7 to b0) of the initial value S0 to an EOR circuit (not shown) to which the original data is provided. The EOR circuit scrambles data element D0 of each data frame, or the first byte of each data frame by performing an exclusive OR operation on the lower eight bits of the scramble value SC (initial value S0) and the data element D0. Through the scrambling process, the EOR circuit scrambles the data element D0 to generate a scramble data element sD0. The scramble data element sD0 is written using the equation shown below. In the equations used in this specification and the equations written in the drawings attached to the specification, ^ denotes an exclusive OR operation.

$$sD0=D0\text{\textasciicircum} S0 \qquad \text{Equation 2}$$

The same initial value S0 is used to scramble all data frames DF0 to DF31 of one set of user data UD.

In response to the pulses of a clock signal CLK, the shift register 101 shifts the values of the bits b14 to b0 respectively to bits b15 to b1, and reads an output of the EOR circuit 104 as the value of the bit b0. After the eighth pulse of the clock signal CLK, that is, after the bits are shifted by eight bits (one byte), the generation circuit 100 outputs the values of the bits b7 to b0 to the EOR circuit (not shown) to which the original data is provided. The scramble value SC in this state is written as $S0*\gamma^1$, where S0 is the initial value of the scramble value SC and $\gamma$ is a 1-byte shift operator that is defined by the generation polynomial $\Phi(x)$. More specifically, $S0*\gamma^1$ indicates the scramble value SC that is obtained by shifting the bits of the initial value S0 by one byte in accordance with the generation polynomial $\Phi(x)$. The data element D1 of each data frame, which is the second byte of each data frame, is scrambled by performing an exclusive OR operation on of the lower eight bits of the scramble value SC ($=S0*\gamma^1$) and the data element D1. Through the scrambling process, the data element D1 is scrambled to generate a scramble data element sD1 using the equation shown below.

$$sD1=D1\text{\textasciicircum} S0 \cdot \gamma^1 \qquad \text{Equation 3}$$

The scramble data elements sD2 to sD2051 are generated in the same manner using the equation shown below.

$$sD2=D2\text{\textasciicircum} S0 \cdot \gamma^2$$

$$sD3=D3\text{\textasciicircum} S0 \cdot \gamma^3$$

$$sD2051=D2051\text{\textasciicircum} S0 \cdot \gamma^{2051} \qquad \text{Equation 4}$$

In the equation, $S0*\gamma^3$ indicates the scramble value SC that is obtained by shifting the bits of the initial value S0 by three bytes in accordance with the generation polynomial $\Phi(x)$. In the equation, $S0*\gamma^{2051}$ indicates the scramble value SC that is obtained by shifting the bits of the initial value S0 by 2051 bytes in accordance with the generation polynomial $\Phi(x)$.

The generated scramble data elements sD0 to sD2051 of each data frame DF are arranged serially from above in the column direction. This generates the scramble data frame SDF described above.

As shown in FIGS. 3A and 3B, the scramble data frame SDF (refer to FIG. 3A) is converted to a data block DB, which consists of 216 rows of 304 columns of data elements (refer to FIG. 3B). In detail, in the scramble data frame SDF, data elements d(u, v) of each single data frame DF arranged in the column direction are stored into the data block DB in the order indicated using arrows drawn using solid lines in FIG. 3B. More specifically, the data elements d(0, 0) to d(215, 0) of the data frame DF0 are stored serially from above into the first column of the data block DB. The data elements d(216, 0) to d(431, 0) of the data frame DF0 are stored serially from above into the second column of the data block DB. The data elements d(1944, 0) to d(2051, 0) of the data frame DF0 are stored serially from above into the first to $108^{th}$ rows of the tenth column of the data block DB. Next, the data elements d(0, 1) to d(107, 1) of the data frame DF1 are stored serially from above at positions adjacent to the position of the last data element d(2051, 0) of the data frame DF0, or specifically into the $109^{th}$ to $216^{th}$ rows of the tenth column of the data frame DF0. The data elements d(108, 1) to d(323, 1) of the data frame DF1 are stored serially from above into the eleventh column of the data block DB. The data elements d(1836, 1) to d(2051, 1) of the data frame DF1 are stored serially from above into the nineteenth column of the data block DB. The data elements of the data frames DF2 to DF31 are stored into the data block DB in the same manner as the data elements of the data frames DF0 and DF1. In this manner, the data elements d(u, v) of all the data frames DF are stored into the data block DB. As a result, when the even number data frames (for example, the data frames DF0, DF2, and DF4) and the odd number data frames (for example, the data frames DF1, DF3, and DF5) are counted all together, the data block DB includes two data frames DF each of which consists of 216 rows of 19 columns of data elements d(u, v). The 216 rows of 19 columns of data elements d(u, v) of each data frame are arranged in a two-dimensional manner in the data block DB. In other words, the single data block DB includes scramble data frames SDF each of which is arranged after every two data frames DF.

As shown in FIG. 4, an ECC unit LDCp (in other words, an ECC parity) is appended to the data block DB, which consists of 216 rows of 304 columns of data elements d(u, v) as described above. The ECC parity includes 32 rows of 304 columns of parity bits p(i, j). In detail, 32-byte parity bits p(i, j) are appended to each column of the data block DB. This forms a parity-appended block PB ("long-distance code" (LDC) block), which consists of 216 rows of 304 columns of data elements e(i, j) and 32 rows of 304 columns of parity bits p(i, j). In the data elements e(i, j) and the parity bits p(i, j), i indicates the row number of each data element of the parity-appended block PB and j indicates the column number of each data element of the parity-appended block PB. The parity bit p is calculated using the equation shown below.

$$p(x) = x^8 + x^4 + x^3 + x^2 + 1 \quad \text{Equation 5}$$

$$\alpha = 00000010$$

$$g(x) = \prod_{i=0}^{31} (x - \alpha^i)$$

The ECC unit LDCp is an error correcting code that is used to correct errors occurring in data elements of the parity-appended block PB arranged in the column direction. The ECC unit LDCp is used to generate an LDC syndrome (parity calculation result), which is used to perform error correction of the parity-appended block PB in the column direction.

The parity-appended block PB, which consists of 248 rows of 304 columns of data elements, is converted to an LCD cluster LDCc, which consists of 496 (=248*2) rows of 152 (=304/2 columns of data elements (hereafter referred to as a "cluster LDCc", which is shown in FIG. 6).

In detail, through a first interleaving process, the data elements e(i, j) and the parity bits p(i, j) are first interleaved at positions f(m, n) in the block shown in FIG. 5 based on a predetermined rule. In the positions f(m, n), m indicates the row number of each data element of the cluster LDCc and n indicates the column number of each data element of the cluster LDCc.

The first interleaving process will now be described in detail with reference to FIGS. 4 and 5. In the first interleaving process, the data elements e(i, j) and the parity bits p(i, j) in the even-numbered columns, that is, the data elements e(i, j) and the parity bits p(i, j) in which j=0, 2, 4, 6, 8, . . . , 302 (even-numbered columns), are interleaved at positions f(m, n)=f(2i, j/2). Also, the data elements e(i, j) and the parity bits p(i, j) in the odd-numbered columns, that is, the data elements e(i, j) and the parity bits p(i, j) in which j=1, 3, 5, 7, 9, . . . , 303 (odd-numbered columns), are interleaved at positions f(m, n)=f(2i+1, (j−1)/2). For example, the data element e(1, 2) of an even-numbered column is arranged at the position f(2, 1) because m=2*1=2 and n=2/2=1. The data element e(1, 3) of an odd-numbered column is arranged at the position f(3, 1) because m=2*1+1=3 and n=(3−1)/2=1. The first interleaving process generates the data block shown in FIG. 5, which consists of 496 rows of 152 columns of data elements.

The data (the data elements e and the parity bits p) shown in FIG. 5, which has been subjected to the first interleaving process, is then subjected to a second interleaving process. The second interleaving process generates the cluster LDCc shown in FIG. 6.

The second interleaving process will now be described in detail. In the second interleaving process, the data elements e(i, j) and the parity bits p(i, j) arranged at the positions f(m, n) are shifted to the left within the same row by the number of bytes corresponding to a shift amount SI written using the equation shown below.

$$SI = \text{mod}(\text{div}(m,2)*3,152) \quad \text{Equation 6}$$

In this equation, mod(a, b) is a function to return the remainder resulting from division of a by b, whereas div(a, b) is a function to return an integer that is smaller by one than the quotient of the division of a by b.

Based on the shift amount SI, the data elements e(i, j) and the parity bits p(i, j) arranged at the positions f(m, n1), at which n=n1, are interleaved at the positions f(m, n2), at which n=n2=n1−SI. The direction in which the data element and the parity bit are shifted is changed cyclically. When n2 is a negative value, the column number n of the position to which the data element and the parity bit are actually shifted is set as one of serial numbers from 151 descending as the absolute value of n2 increases. More specifically, the column number n is set in a manner that n2=−1 corresponds to n=151 and n2=−2 corresponds to n=150.

For example, at the positions f at which m=2 and 3, the shift amount of each data element e is written as SI=mod(1*3, 152)=3. In this case, the data elements e are all shifted by three bytes to the left within the same row. More specifically, the data element e(1, 0) arranged at the position f(2, 0) and the data element e(1, 1) arranged at the position f(3, 0) in FIG. 5 are interleaved at the position f(2, 149) and the position f(3, 149), at which the column number n=149 corresponding to n2=0−3=−3. In the same manner, the data elements e arranged at the positions f at which m=2 and 3 are all shifted to the left by three bytes within the same row.

The parity-appended block PB is subjected to the first and second interleaving processes in this manner. This generates the cluster LDCc shown in FIG. 6.

A burst indicator subcode (BIS) cluster BISc (hereafter referred to as a "cluster BISc"), which consists of 496 rows of three columns of data elements, is then interleaved in the cluster LDCc described above as shown in FIGS. 7A and 7B. The cluster BISc includes a data block consisting of 720 bytes and a parity consisting of 768 bytes. The 720-byte data block includes address information and user control data. As shown in FIG. 7B, the cluster BISc is divided by every column (1 byte). One of the resulting divisional parts of the cluster BISc (B1 to B3 in FIG. 7A) is inserted every after 38 columns (38 bytes) of the cluster LDCc.

An ECC cluster ECCc (hereafter referred to as a "cluster ECCc", which is shown in FIG. 7B) consists of the cluster LDCc and the cluster BISc. The cluster ECCc is modulated through, for example, 17PP modulation before written to the BD. This format of data stored in the BD enables detection and correction of an error to be performed in a highly reliable manner when the data is read from the BD.

The operation of reading data stored in the BD will now be described. As shown in FIG. 8, a controller 110 inputs and outputs data to and from the BD, which serves as a storage medium. In the controller 110, a demodulation circuit 111 first reads data from the BD. The demodulation circuit 111 demodulates the read data to generate a cluster ECCs, and stores the cluster ECCs into a buffer memory 120. An LDC syndrome generation circuit 112 reads a cluster LDCc included in the cluster ECCc stored in the buffer memory 120, and changes the arrangement order of data elements of the cluster LDCc to the original order of the data elements prior to the first and second interleaving processes. More specifically, the LCD syndrome generation circuit 112 reads the cluster LDCc as the parity-appended block PB (refer to FIG. 4) before the first and second interleaving processes, while performing the first and second interleaving processes. The LDC syndrome generation circuit 112 then generates an LDC syndrome (syndrome calculation result) based on the parity-appended block PB, and provides the LDC syndrome to the error correction circuit 114.

The BIS syndrome generation circuit 113 reads the cluster BISc that is included in the cluster ECCc, which is stored in the buffer memory 120. The BIS syndrome generation circuit 113 then generates a BIS syndrome based on the cluster BISc, and provides the BIS syndrome to the error correction circuit 114. The error correction circuit 114 then corrects an error in the user data UD included in the cluster ECCs based on the LDC syndrome and the BIS syndrome.

The descramble circuit 115 reads, from the buffer memory 120, the data elements e corresponding to the user data UD of the cluster LDCc that has been subjected to the error correction, while subjecting the data elements e to the first and second interleaving processes. More specifically, the descramble circuit 115 reads, as the data block DB that has been subjected to the error correction, the data elements e that have been subjected to the error correction from the buffer memory 120 (refer to FIG. 3B). The descramble circuit 115 then descrambles the data block DE by subjecting each data frame DF of the data block DB to the descrambling process. In detail, the descramble circuit 115 generates the same scramble value SC as the scramble value SC used when the data has been scrambled. The descramble circuit 115 performs an exclusive OR operation on the lower eight bits of the scramble value SC and each byte of the data frame DF to generate descramble data elements dD0 to dD2051 using the equation shown below.

$$dD0 = sD2 \char`^ S0$$

$$dD1 = sD1 \char`^ S0 \cdot \gamma^1$$

$$dD2051 = sD2051 \char`^ S0 \cdot \gamma^{2051} \qquad \text{Equation 7}$$

An EDC checking circuit 116 transfers the descramble data block DB (including the user data UD) to an external device, such as a host computer, via an interface circuit 117. The EDC checking circuit 116 checks error detecting codes (EDC) based on the descramble data block DB. In this EDC checking, the EDC checking circuit 116 generates an EDC syndrome EDCS for every 2052-byte data frame DF. In detail, the descramble data elements dD0, dD1, dD2, . . . , dD2049, dD2050, and dD2051 are transferred from the descramble circuit 115 and input to the EDC checking circuit 116 in the stated order as shown in FIG. 9. The degree of the weighting vector that is used to weight each 2052-byte descramble data element dDU is written using the polynomial expression (input polynomial) below.

$$I(X) = X^{2051} + X^{2050} + X^{2049} + \ldots + X^2 + X^1 + X^0 \qquad \text{Equation 8}$$

The EDC calculation is the process of weighting each term of the above input polynomial using a vector β. Thus, the EDC syndrome EDCS is calculated using the equation shown below.

$$EDCS = \beta^{2051} \cdot X^{2051} \char`^ \beta^{2050} \cdot X^{2050} \char`^ \beta^{2049} \cdot X^{2049} \char`^ \ldots \char`^ \beta^2 \cdot X^2 \char`^ \beta^1 \cdot X^1 \char`^ X^0 \qquad \text{Equation 9}$$

More specifically, the EDC syndrome EDCS is generated by weighting every 1-byte data element using the first-degree vector $\beta^1$ when the 1-byte data element (for example, each of the descramble data elements dD0 and dD2050) is calculated. Thus, the degree of the vector β by which the data element is weighted is higher as the data element is input at an earlier timing. The degree of the vector β by which the data element is weighted is lower as the data element is input at a later timing. For example, the vector β corresponding to the data element dD0, which is input at the earliest timing, has the highest degree of 2051 ($\beta^{2051}$). The vector β corresponding to the data element dD2051, which is input at the latest timing, has the lowest degree of 0 ($\beta^0=1$). When the 1-byte data element $X''$ is weighted using the vector $\beta^1$, the data element $X''$ that is weighted is shifted by one byte in accordance with a predetermined generation polynomial G(x) ($G(x) = x^{32} + x^{31} + x^4 + 1$ in this example). The EDC checking circuit 116 determines that the error correction has been completed successfully when all the calculated EDC syndromes indicate zero. The EDC checking is completed based on this determination.

In recent years, host computers process data at a higher speed. Thus, storage devices are required to read and write data at a higher speed. However, the storage devices, which have a limited capacity to access buffer memory 120, does not increase data reading speed any further. More specifically, the conventional controller 110 involves accesses (1) to (5) of the buffer memory 120 described below, and therefore does not increase the access speed any further. As a result, the controller 110 fails to perform the error correction at any higher speed.

(1) The demodulation circuit 110 accesses the buffer memory 120 to store a cluster ECCc.

(2) The LDC syndrome generation circuit 112 accesses the buffer memory 120 to read a cluster LDCc.

(3) The BIS syndrome generation circuit 113 accesses the buffer memory 120 to read a cluster BISc.

(4) The error correction circuit 114 accesses the buffer memory 120 to subject the cluster LDCc to error correction.

(5) The descramble circuit 115 accesses the buffer memory 120 to read the cluster LDCc after the error correction.

Moreover, the LDC syndrome generation circuit 112 is required to perform first and second de-interleaving processes when reading the clusters LDCc from the buffer memory 120 as the parity-appended block PB. In the same manner, the descramble circuit 115 is also required to perform first and second de-interleaving processes when reading the data elements e of the cluster LDCc from the buffer memory 120 as the data block DB. When the buffer memory 120 is an external buffer memory, the buffer memory is typically formed by a synchronous dynamic random access memory (SDRAM), which is inexpensive and has a low processing speed. Thus, when the clusters LDCc are read while the arrangement order of the clusters LDCc is being changed, the parity-appended block PB (or the data block DB) is read from the buffer memory 120 as small pieces of data. In other words, the amount of data obtained per access to the buffer memory 120 is small in this case. This would lower the access efficiency of the buffer memory 120, and decrease the access bandwidth of the buffer memory 120.

FIG. 10 shows a controller 130 that decreases the required amount of access to the buffer memory 120. The controller 130 temporarily stores a single cluster ECCs in its internal memory 131. The controller 130 includes an LDC syndrome generation circuit 112 and a BIS syndrome generation circuit 113 that directly access the internal memory 131. In other words, the LDC syndrome generation circuit 112 and the BIS syndrome generation circuit 113 do not access the buffer memory 120. This structure reduces the entire required amount of access to the buffer memory 120, and enables error correction to be performed at a higher speed as compared with the structure shown in FIG. 8.

However, the structure shown in FIG. 10 has a further problem. To perform the error correction in the manner described above, an error correcting circuit 114 may need to have data in units of clusters ECCc. Thus, the internal memory 131 of the controller 130 shown in FIG. 10 may need to be formed by a large-capacity buffer memory that may store data of a single ECC cluster. This would increase the circuit scale of the controller 130.

SUMMARY

The embodiment provides a descramble circuit for generating descramble data from scramble data, the descramble circuit including an exclusive OR circuit which calculates a data element of the descramble data by applying a predetermined scramble value to a data element of the scramble data, wherein the scramble data is stored in the optical disc in data block including a plurality of data elements arranged in rows and columns and the descramble circuit reads the scramble data of the data block as a plurality of read blocks, a first shift calculator which generates a first calculated value by shifting the scramble value by one byte in accordance with a first generation polynomial, a second shift calculator which generates a second calculated value by shifting the scramble value by a number of bytes corresponding to {(total number of bytes of the data block in the column direction)+1−(total number of bytes of each read block in the column direction)} in accordance with the first generation polynomial, and a selector which provides the first exclusive OR circuit, the first shift calculator, and the second shift calculator with the first calculated value or the second calculated value as the scramble value in accordance with the data element of the scramble data that is input to the first exclusive OR circuit.

BRIEF DESCRIPTION OF THE DRAWINGS

The embodiments, together with objects and advantages thereof, may best be understood by reference to the following description of the presently preferred embodiments together with the accompanying drawings in which:

FIG. 4 is a diagram describing a parity-appended block (LDC block) including an ECC unit;

FIGS. 7A and 7B are diagrams describing an ECC cluster;

FIG. 17 is a diagram describing a read block that is read by the descramble circuit shown in FIG. 16;

FIG. 23 is a diagram describing data (input polynomial) that is input to the EDC syndrome generation circuit in FIG. 18;

FIG. 25 is a diagram describing input and output logic equations used by a 1-shift calculator included in the descramble circuit shown in FIG. 16;

FIG. 26 is a diagram describing input and output logic equations used by a 209-shift calculator included in the descramble circuit shown in FIG. 16;

FIG. 27 is a diagram describing input and output logic equations used by a 108-shift calculator included in the descramble circuit shown in FIG. 16;

FIG. 28 is a diagram describing input and output logic equations used by a 1-shift calculator included in an EDC syndrome generation circuit in FIG. 18;

FIG. 29 is a diagram describing input and output logic equations used by a 209-shift calculator included in the EDC syndrome generation circuit in FIG. 18;

FIG. 30 is a diagram describing input and output logic equations used by a 108-shift calculator included in an EDC syndrome generation circuit in FIG. 18;

FIG. 31 is a diagram describing input and output logic equations used by a −211-shift calculator included in the EDC syndrome generation circuit in FIG. 18;

FIG. 35 is a diagram describing a method for storing data into an external buffer memory in the second embodiment;

FIGS. 36A and 36B are diagrams describing data (input polynomial) that is input to the EDC syndrome generation circuit shown in FIG. 33;

FIG. 39 is a diagram describing input and output logic equations used by a $\beta^{-1}$ shift calculator included in the EDC syndrome generation circuit shown in FIG. 37;

FIG. 40 is a diagram describing input and output logic equations used by a $\beta^{-1664}$ shift calculator included in the EDC syndrome generation circuit shown in FIG. 37;

DETAILED DESCRIPTION OF THE EMBODIMENTS

Figure 1:
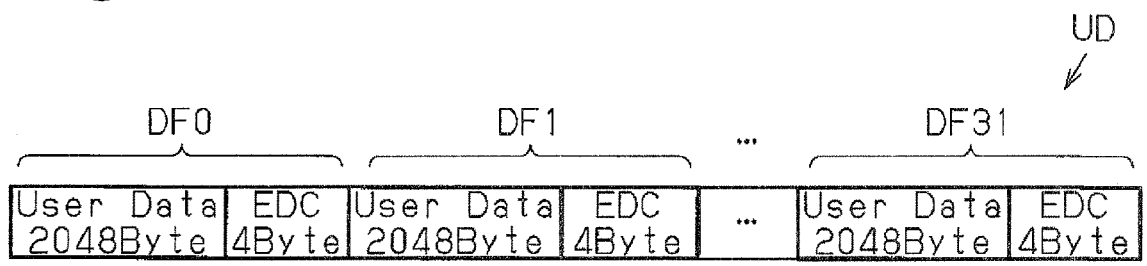
FIG. 1 is a diagram user data stored in a BD.
Figure 2:
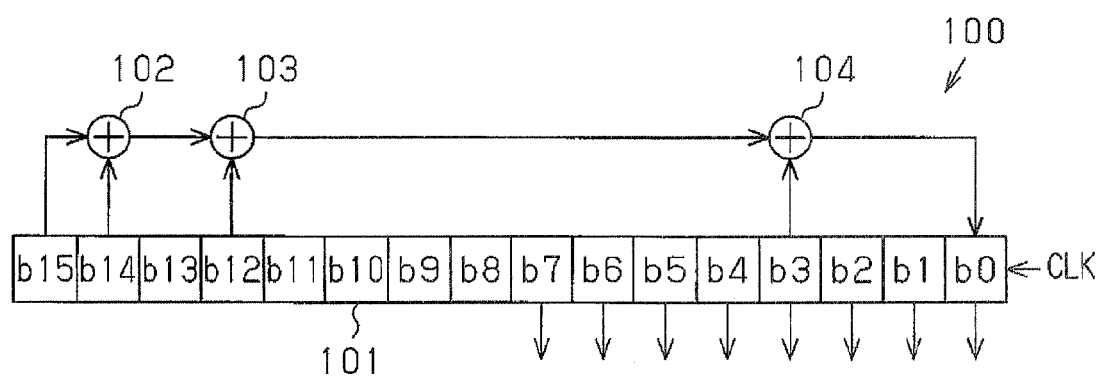
FIG. 2 is a schematic block diagram showing a conventional scrambling-value generation circuit.

In the drawings, like numerals are used for like elements throughout.

An optical disc controller 10 (error correction device) according to a first embodiment will now be described with reference to FIGS. 11 to 31.

Figure 11:
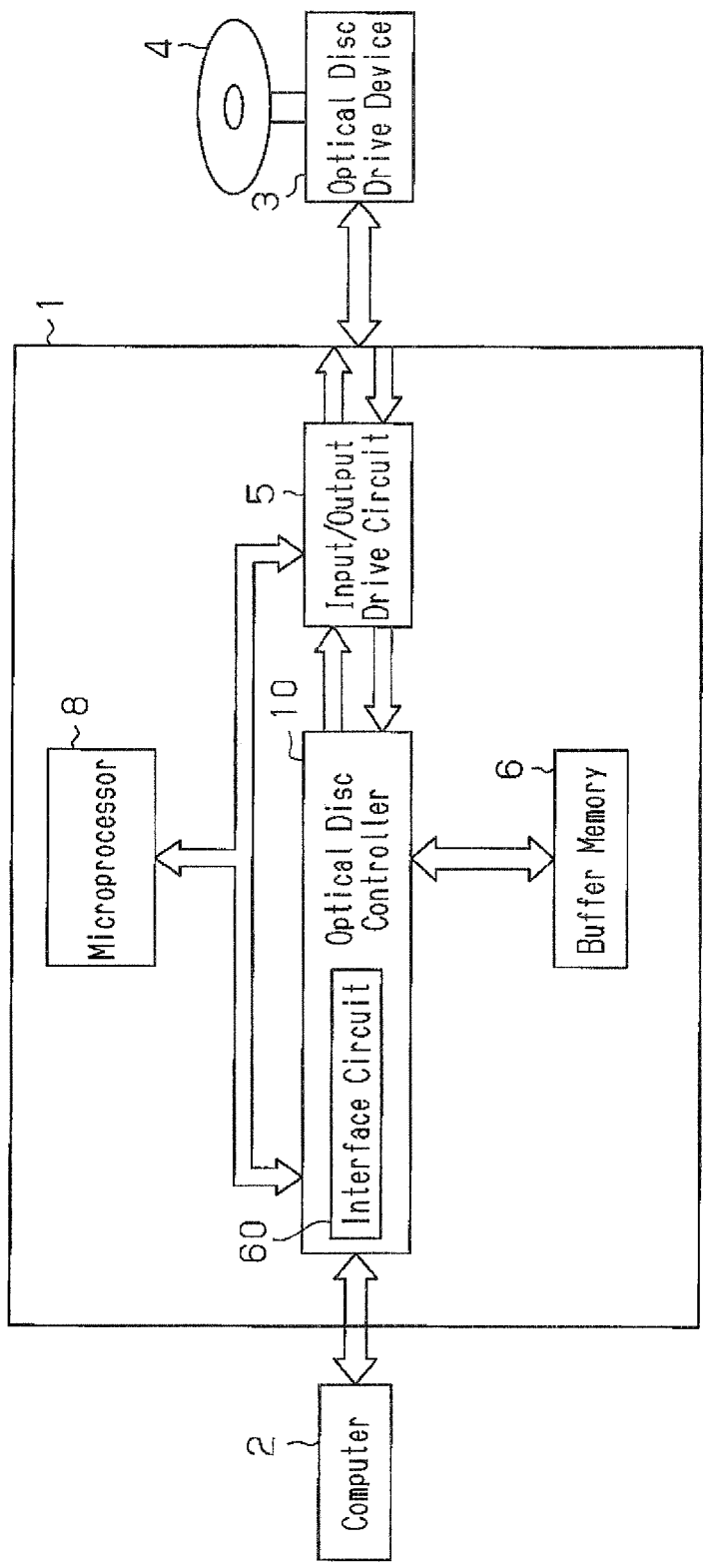
FIG. 11 is a schematic block diagram showing an optical disc control device.

As shown in FIG. 11, an optical disc control device 1, which functions as a data reading device, is coupled to a computer 2 via a predetermined interface, such as an advanced technology attachment packet interface (ATAPI). The optical disc control device 1 is also coupled to an optical disc drive device 3 via an interface.

The optical disc drive device 3 rotates a blu-ray disc (BD) 4 at a predetermined speed and reads disc data stored in the BD 4 with an optical pickup, which is not shown. The optical disc drive device 3 provides the disc data to the optical disc control device 1.

An input and output drive circuit 5 included in the optical disc control device 1 receives the disc data from the optical disc drive device 3 and provides the disc data to an optical disc controller 10 (controller), which functions as an error correction device.

The controller 10 transmits an instruction to the optical disc drive device 3 and receives status information from the drive device 3. The controller 10 further performs processing including determination of the format of data (disc data) read from an optical disc or the BD 4 and error correction of the disc data, data transfer between the optical disc drive device 3 and an external buffer memory 6, and data transfer between an interface circuit 60 and the external buffer memory 6. In detail, the controller 10 descrambles the disc data, which is provided from the input and output drive circuit 5, to generate descramble data. The controller 10 also generates syndromes including an EDC syndrome, an LDC syndrome, and a BIS syndrome. The controller 10 then stores the descramble data and the syndromes into the external buffer memory 6. The controller 10 further subjects the descramble data, which is stored in the external buffer memory 6, to error correction based on the syndromes stored in the external buffer memory 6. Based on an instruction provided from a microprocessor 8, the controller 10 then transfers user data UD, which is stored in the external buffer memory 6 after error correction, to the computer 2 via the interface circuit 60.

The internal structure of the optical disc controller 10 shown in FIG. 11 will now be described with reference to FIG. 12.

The input and output drive circuit 5 reads disc data from the BD 4 and serially provides the disc data to a demodulation circuit 11 included in the optical disc controller 10. The demodulation circuit 11 converts the disc data to digital data. The demodulation circuit 11 also generates a clock signal CLK, which is synchronous with the digital data. The demodulation circuit 11 demodulates the digital data to generate a cluster, or more specifically an ECC cluster ECCc (hereafter referred to as a "cluster ECCc", which is shown in FIG. 7B). The cluster ECCs is the demodulated data. The demodulation circuit 11 then provides the cluster ECCc to an internal memory unit 12. The clock signal CLK is provided to the internal memory unit 12 and other circuit components included in the controller 10, such as a descramble circuit 20 and an EDC syndrome generation circuit 30.

Figure 13:
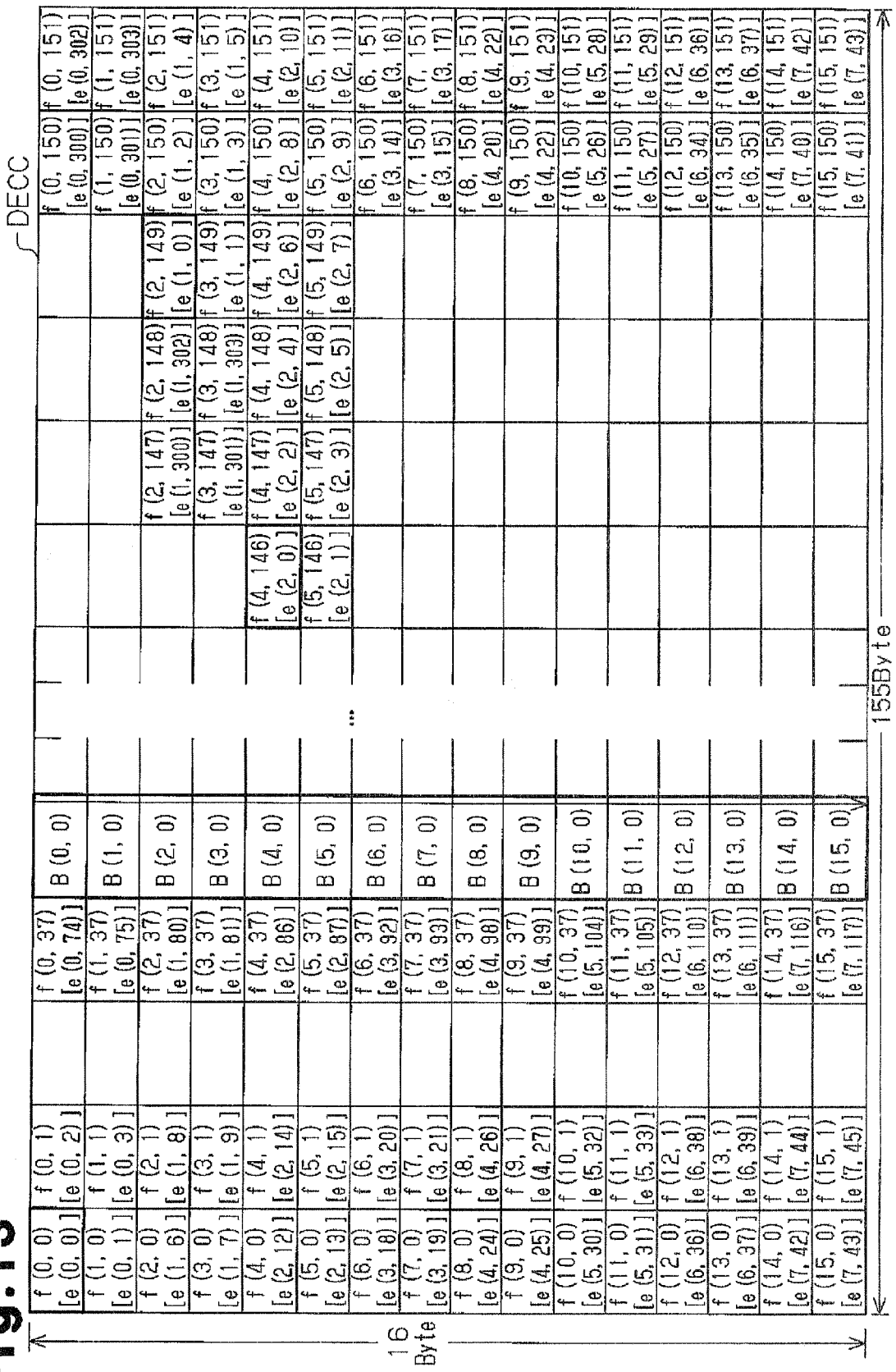
FIG. 13 is a diagram describing a divisional ECC cluster that is stored into an internal memory by a demodulation circuit shown in FIG. 12.

The internal memory unit 12, which stores clusters ECCc transferred from the demodulation circuit 11, includes two buffer memories M1 and M2. Each of the buffer memories M1 and M2 has a capacity that may store data of a predetermined number of bytes (2480 bytes in the first embodiment). In the first embodiment, the 76880-byte cluster ECCc is divided into 31 (76880/2480) pieces of data, each of which is 2480-byte data. The 2480-byte data is stored into each of the buffer memories M1 and M2. More specifically, each of the buffer memories M1 and M2 stores a divisional ECC cluster that is generated by dividing the cluster ECCc (refer to FIG. 7B) by every 16 rows. Each divisional ECC cluster consists of 16 rows of 155 columns (2480 bytes) of data elements. Each divisional ECC cluster is referred to as a "divisional cluster DECC". FIG. 13 shows the divisional cluster DECC that is transferred from the demodulation circuit 11 and stored into the internal memory unit 12 at the earliest timing of all the division clusters DECC. As shown in FIG. 13, the data elements in the first to sixteenth rows of each column of the divisional cluster DECC are transferred from the demodulation circuit 11 and stored into the internal memory unit 12.

The buffer memory M1 and the buffer memory M2 of the internal memory unit 12 are used in parallel. In detail, when one of the buffer memories M1 and M2 is used as a data storage buffer for storing data that has been transferred from the demodulation circuit 11, the other one of the buffer memories M1 and M2 is used as an access buffer that is accessed by the LDC syndrome generation circuit 13, the descramble circuit 20, and other circuits. More specifically, when the buffer memory M1 is used as the data storage buffer, the buffer memory M2 is used as the access buffer. When the buffer memory M2 is used as the data storage buffer, the buffer memory M1 is used as the access buffer.

Figures 14, 15:
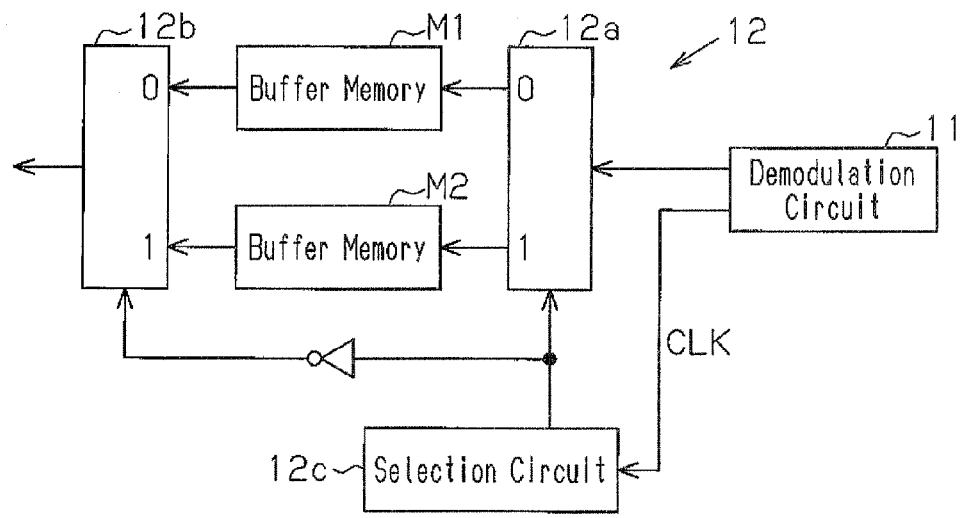
FIG. 14 is a diagram describing a read block that is read into an LDC syndrome generation circuit shown in FIG. 12.
FIG. 15 is a schematic block diagram showing an internal memory storing the divisional ECC cluster shown in FIG. 13.

FIG. 15 shows one example of the circuit structure of the internal memory unit 12. As shown in FIG. 15, a first selector 12a is provided with the data transferred from the demodulation circuit 11. The first selector 12a is also provided with a selection signal from a selection circuit 12c. The selection circuit 12c counts the pulses of a clock signal CLK, which is provided from the demodulation circuit 11, and switches the signal level of the selection signal at a predetermined timing. In the first embodiment, the selection circuit 12c switches the signal level of the selection signal every after counting clocks corresponding to 2480 bytes. The selection signal is also provided to a second selector 12b via an inverter.

The first selector 12a transmits the data transferred from the demodulation circuit 11 to the buffer memory M1 or the buffer memory M2 based on the signal level of the selection signal. The second selector 12b selectively accesses the buffer memory M1 or the buffer memory M2 based on the signal level of the selector signal that is provided to the second selector 12b via the inverter.

Figure 3:
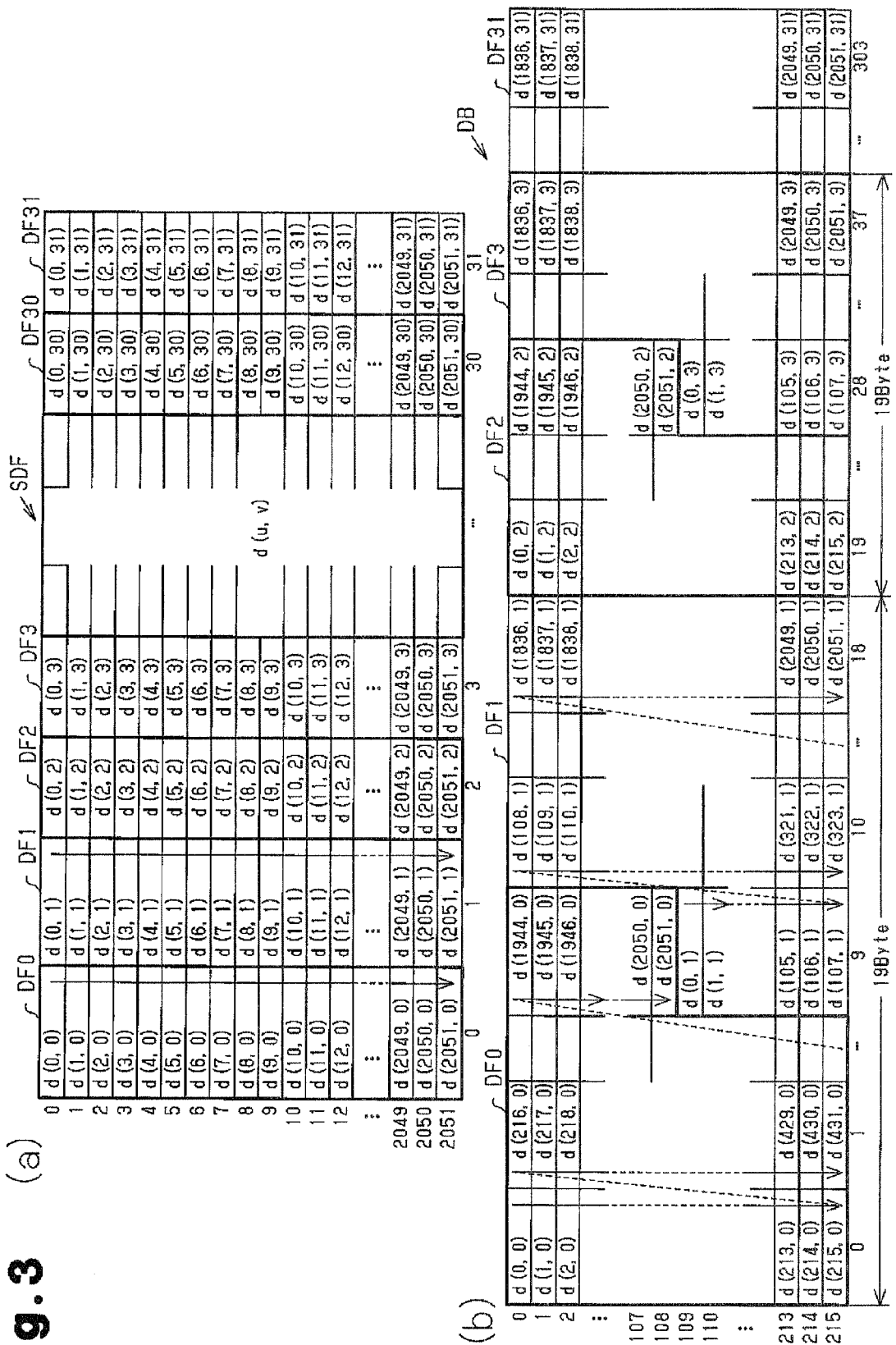
FIGS. 3A and 3B are diagrams describing data blocks of the user data shown in FIG. 1.
Figure 5:
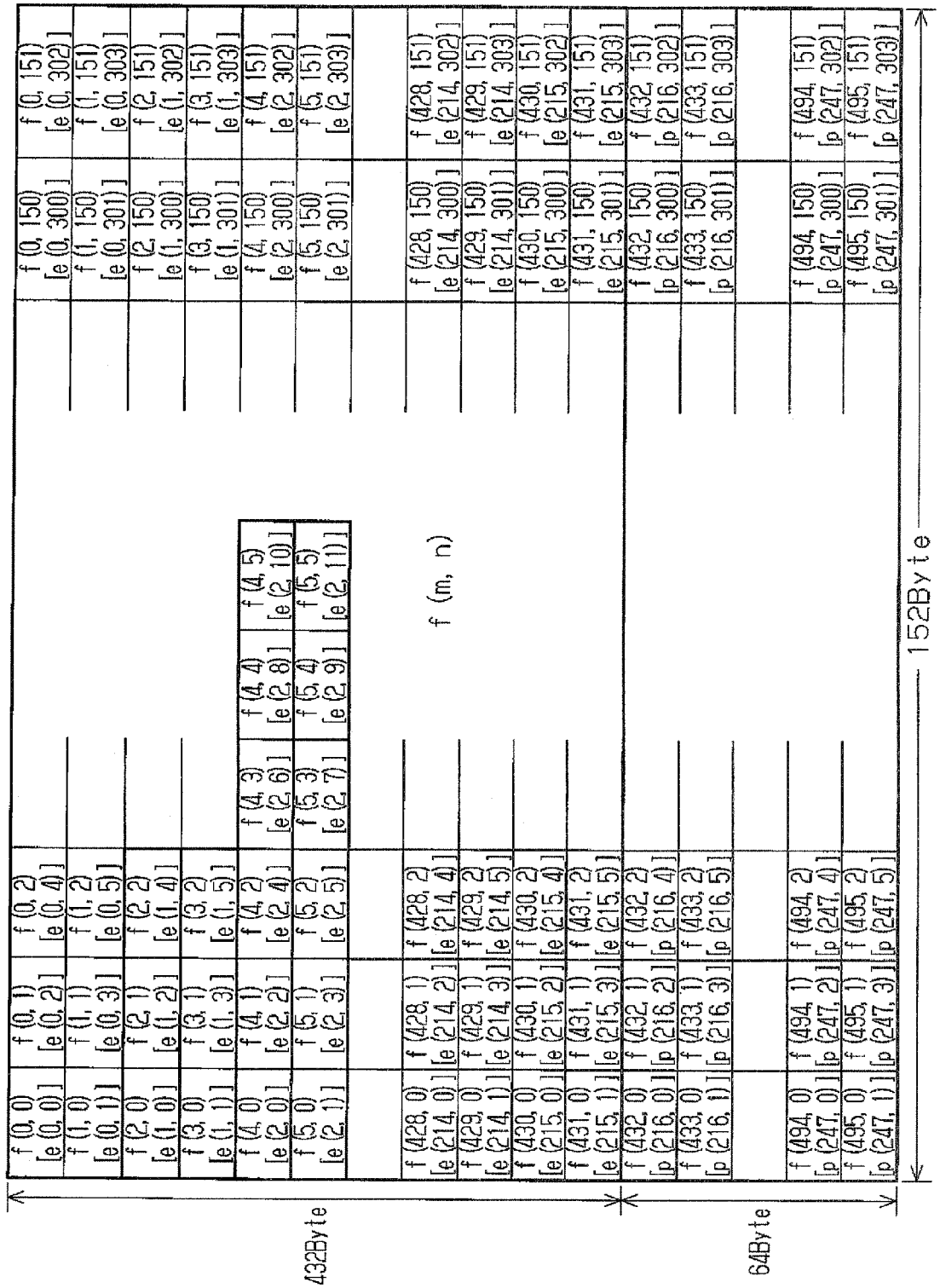
FIG. 5 is a diagram describing an LDC block that has been subjected to a first interleaving process.
Figure 6:
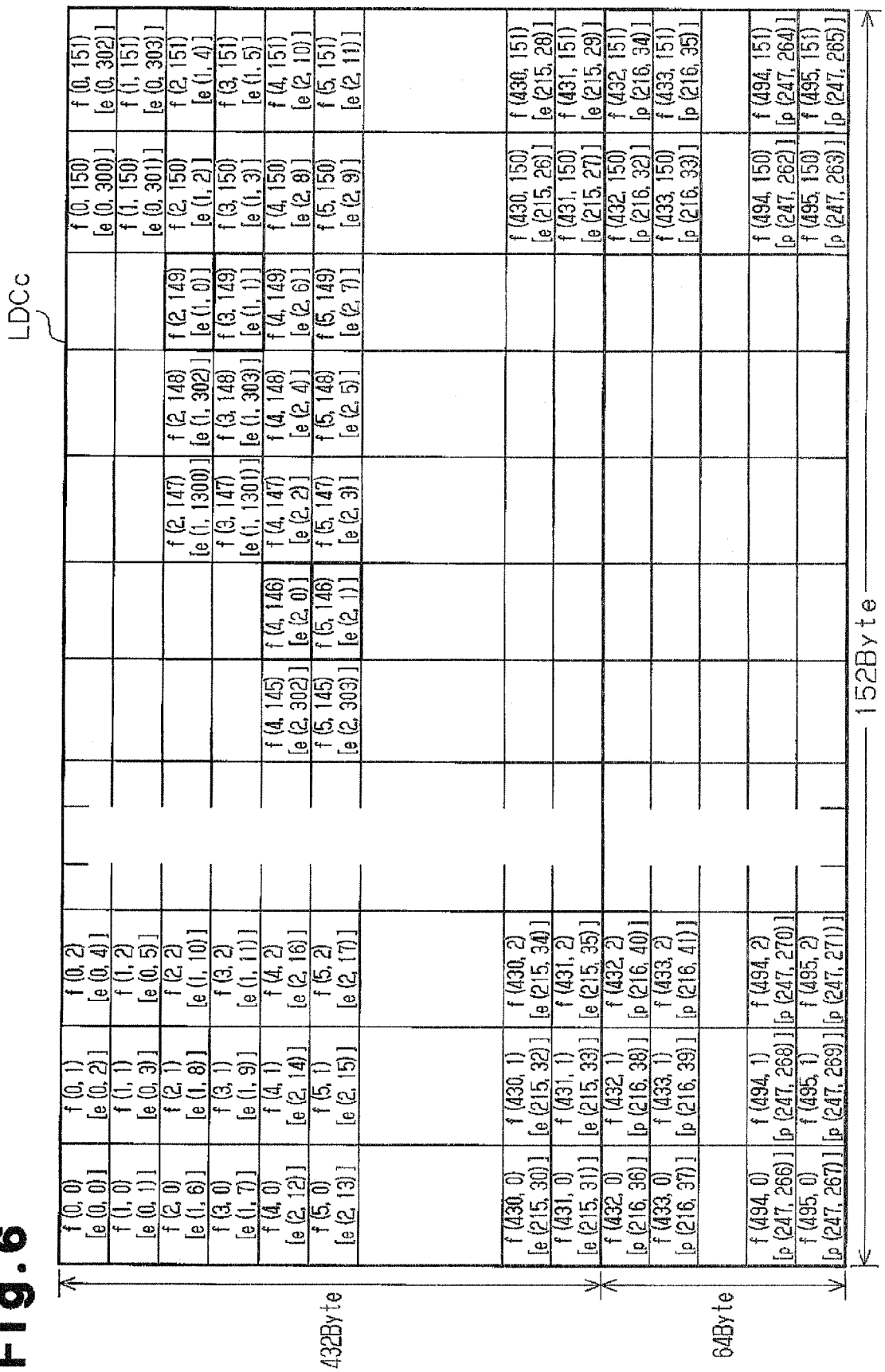
FIG. 6 is a diagram describing an LDC cluster generated from the LDC block shown in FIG. 5 through a second interleaving process.
Figure 12:
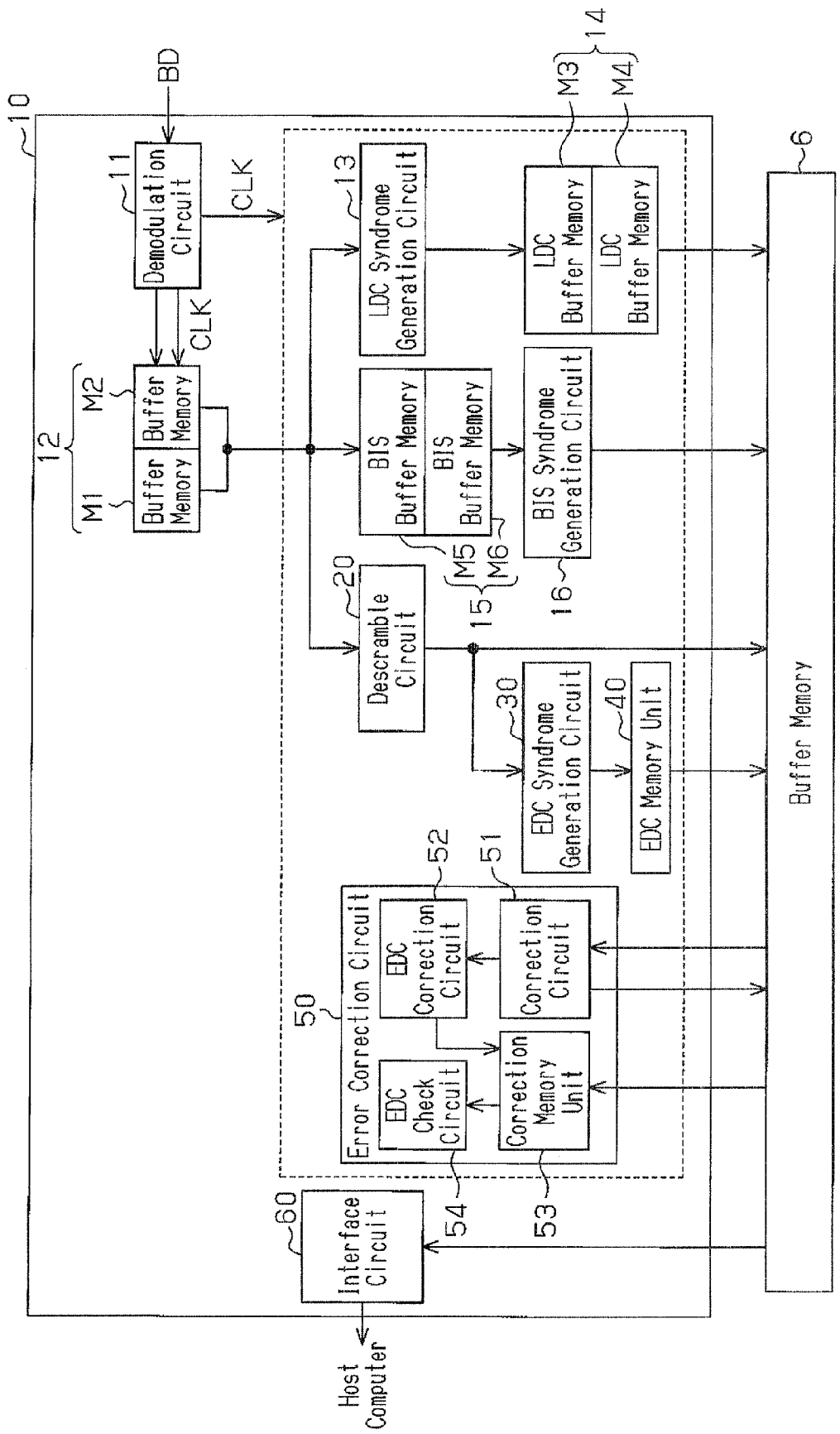
FIG. 12 is a schematic block diagram showing an optical disc controller according to a first embodiment.

The LDC syndrome generation circuit 13 shown in FIG. 12 operates as a syndrome calculation result generation circuit. The LDC syndrome generation circuit 13 reads an LDC cluster LDCc (hereafter referred to as a "cluster LDCc") included in the divisional cluster DECC from the access buffer (M1 or M2) of the internal memory unit 12 as a parity-appended block PB (refer to FIG. 4). The LDC syndrome generation unit 13 changes the arrangement order of data elements of the LDC cluster LDCc while reading the LDC cluster LDCc. As described above, the cluster LDCc (refer to FIG. 6) included in the cluster ECCc stored in the BD 4 is generated by changing the data arrangement order of the parity-appended block PB through the first and second interleaving processes. More specifically, an ECC unit LDCp (ECC parity) included in the cluster LDCc is appended to the data block DB (refer to FIG. 3B) that has not yet undergone the first and second interleaving processes. Thus, the LDC syndrome generation circuit 13 does not generate the LDC syndrome (syndrome calculation result) correctly based on the ECC unit LDCp if the data arrangement order of the cluster LDCc is unchanged from the original order.

For the reason described above, the LDC syndrome generation circuit 13 changes the data arrangement order of the cluster LDCc to the arrangement order of the parity-appended block PB through the first and second de-interleaving processes when reading the cluster LDCc included in the divisional cluster DECC from the internal memory unit 12. The order in which data elements of the data block (divisional cluster DECC in FIG. 13) are read will now be described. As one example, the data reading order of data elements of the first data block, which is the data block stored into the internal memory unit 12 at the earliest timing, will now be described.

First, the LDC syndrome generation circuit 13 reads the data element e(0, 0) at the position f(0, 0) shown in FIG. 13, reads the data element e(1, 0) at the position f(2, 149), and then reads the data element e(2, 0) at the position f(4, 146). In the same manner, the LDC syndrome generation circuit 13 then reads the data elements in the first column of the parity-appended block PB in the order of the data element e(3, 0), the data element e(4, 0), . . . , and the data element e(7, 0). Following this, the LDC syndrome generation circuit 13 reads the data elements in the first to eighth rows of the second column of the parity-appended block PB in the order of the data element e(0, 1), . . . , and the data element e(7, 1). In the same manner, the LDC syndrome generation circuit 13 serially reads the data elements e in each column of the parity-appended block PB. In this manner, the LDC syndrome generation circuit 13 reads the cluster LDCc included in each divisional cluster DECC as the divisional parity-appended block (first read block RB1) consisting of eight rows of 304 columns of data elements while subjecting the cluster LDCc to the first and second de-interleaving processes. As a result, the LDC syndrome generation circuit 13 reads the clusters LDCc included in 31 divisional clusters DECC as 31 divisional parity-appended blocks (first to thirty first read blocks RB1 to RB31) while subjecting the clusters LDCc to the first and second de-interleaving processes as shown in FIG. 14.

The LDC syndrome generation circuit 13 generates an intermediate value of the LDC syndrome of each column for every predetermined number of bytes (eight bytes in the first embodiment) of the read block RB in the column direction, and stores the intermediate value of the LDC syndrome into the LDC memory unit 14. The LDC syndrome generation circuit 13 further reads, from the LDC memory unit 14, an intermediate value of the LDC syndrome in the same column stored when reading the immediately preceding read block RB (for example, the first read block RB1 when the second read block RB2 is the present read block). The LDC syndrome generation circuit 13 then updates the intermediate value of the LDC syndrome based on the intermediate value of the read LDC syndrome and the 8-byte data of the present read block RB (for example, the second read block RB2) in the column direction, and stores the updated intermediate value into the LDC memory unit 14.

As shown in FIG. 12, the LDC memory unit 14 includes two LDC buffer memories M3 and M4. Each of the buffer memories M3 and M4 has a memory capacity that may store LDC syndromes of all columns of a single parity-appended block PB. More specifically, each of the buffer memories M3 and M4 has a memory capacity of 9728 bytes (32*304). Thus, an intermediate value of an LDC syndrome that is stored in the LDC memory unit 14 after all data elements of the single parity-appended block PB (first to thirty first read blocks RB1 to RB31) are read serves as a final LDC syndrome. The LDC memory unit 14 transfers the final LDC syndrome of each column to the external buffer memory 6. The buffer memory M3 and the buffer memory M4 of the LDC memory unit 14 are used in parallel. In detail, when one of the buffer memories M3 and M4 is used as a syndrome storage buffer for storing an intermediate value of an LDC syndrome transferred from the LDC syndrome generation circuit 13, the other one of the buffer memories M3 and M4 is used as a syndrome output memory for outputting a final LDC syndrome (an intermediate value of an LDC syndrome that is stored at the latest timing) to the external buffer memory 6.

The LDC memory unit 14 has substantially the same structure as the internal memory unit 12 (FIG. 15).

A BIS memory unit 15 is coupled to a BIS syndrome generation circuit 16. The BIS memory unit 15 serially stores BIS clusters BISc (hereafter referred to as "clusters BISc"), which are included in the divisional cluster DECC stored in the access buffer (M1 or M2) of the internal memory 12, in the column direction. For example, the BIS clusters BISc of the divisional cluster DECC shown in FIG. 13 are stored into the BIS memory unit 15 in a manner that the data elements B(0, 0) to B(15, 0) are stored into the BIS memory unit 15 in the order indicated by an arrow drawn using a solid line in FIG. 13. After storing the entire data of the clusters BISc into the BIS memory unit 15, the BIS memory unit 15 transfers the clusters BISc to the BIS syndrome generation circuit 16.

As shown in FIG. 12, the BIS memory unit 15 includes two BIS buffer memories M5 and M6. Each of the buffer memories M5 and M6 has a memory capacity that may store a single cluster BISc. More specifically, each of the buffer memories M5 and M6 has a memory capacity of 1488 bytes (496*3). The buffer memory M5 and the buffer memory M6 of the BIS memory unit 15 are used in parallel. In detail, when one of the buffer memories M5 and M6 is used as a storage buffer for storing a cluster BISc transferred from the internal memory unit 12, the other one of the buffer memories M5 and M6 is used as an output buffer for outputting a cluster BISc stored in the buffer memory to the BIS syndrome generation circuit 16. The BIS memory unit 15 has substantially the same structure as the internal memory unit 12 (FIG. 15).

The BIS syndrome generation circuit 16 reads the cluster BISc from the BIS memory unit 15, and generates a BIS syndrome based on the cluster BISc. The BIS syndrome generation circuit 16 stores the generated BIS syndrome into the external buffer memory 6.

Figure 17:
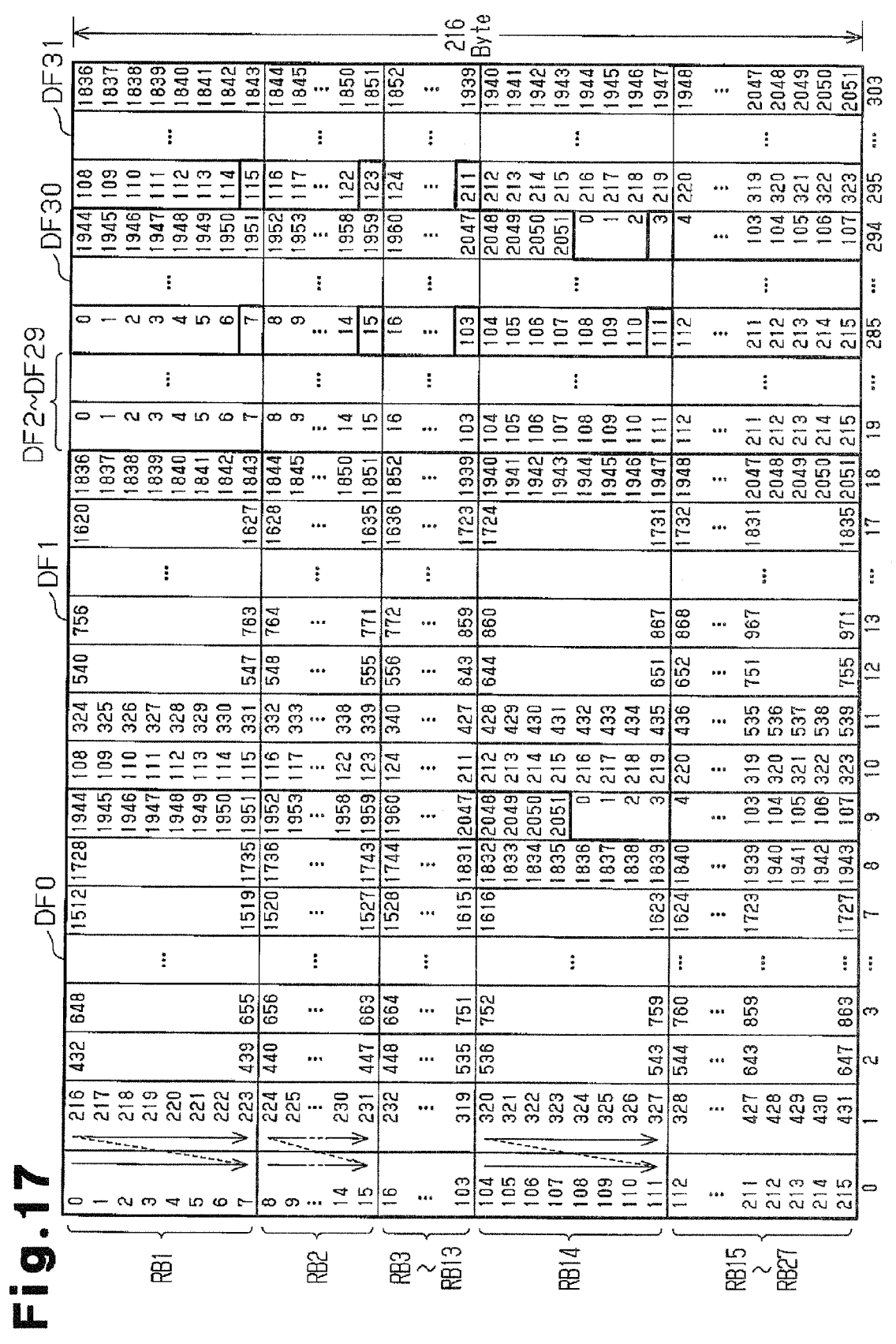

The descramble circuit 20 reads the cluster LDCc included in each divisional cluster DECC from the access buffer (M1 or M2) of the internal memory unit 12 as the read block RB in the same manner as the LDC syndrome generation circuit 13. Among the first to thirty first read blocks RB1 to RB31, the data elements of the twenty eighth to thirty first read blocks RB28 to RB31 ($217^{th}$ to $248^{th}$ rows) form the ECC unit LDCp, which has not yet been scrambled. Thus, the descramble circuit 20 reads only the first to twenty seventh read blocks RB1 to RB27 (that is, the data block DB shown in FIG. 3B) in the manner shown in FIG. 17. The descramble circuit 20 descrambles the predetermined scrambling of the read scramble data elements sDu of the read block RB to generate descramble data elements dDu. The descramble circuit 20 then transfers the descramble data elements dDu, which have been generated through the descrambling process, to the external buffer memory 6 and the EDC syndrome generation circuit 30. In FIG. 17, the order in which the scramble data elements sDu of the first to twenty seventh read blocks RB1 to RB27 are read from the descramble circuit 20 is indicated using the row number u of the scramble data frame SDF (refer to FIG. 3A). The row number u indicates the order in which the data elements d(u, v) of each data frame DF have been processed in the scrambling process. The row number u satisfies $0 \leq u \leq 2051$.

Figure 16:
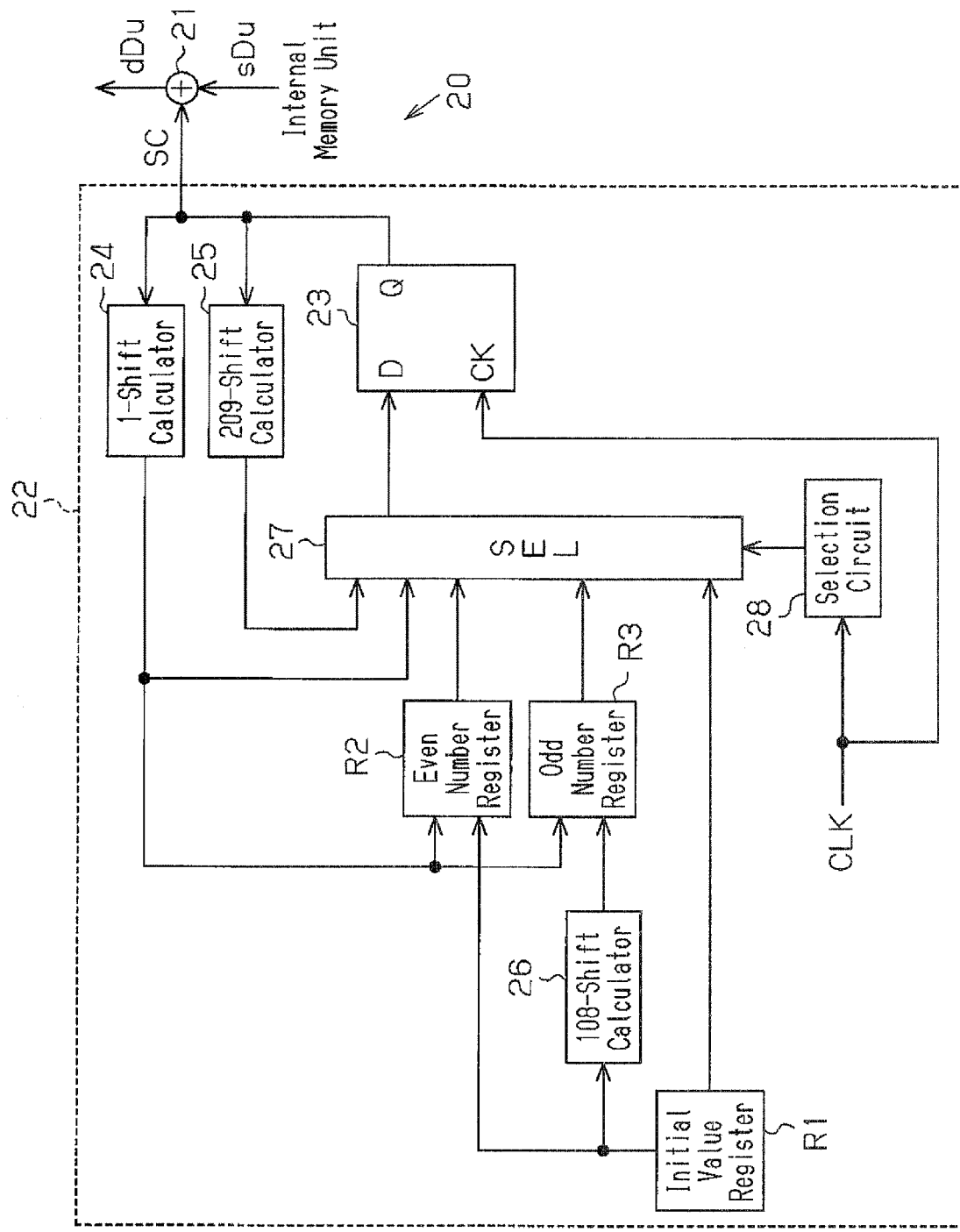
FIG. 16 is a schematic block diagram partially showing a descramble circuit according to the first embodiment.

FIG. 16 shows one example of the circuit structure of the descramble circuit 20. The scramble data element sDu read from the internal memory unit 12 is provided to an EOR circuit 21. The EOR circuit 21 is also provided with a predetermined scramble value SC, which is generated by a scrambling-value generation circuit 22. The EOR circuit 21 generates a descramble data element dDu by performing an exclusive OR operation on the scramble data element sDu and the lower eight bits of the scramble value SC, and transmits the descramble data element dDu to the external buffer memory 6 and the EDC syndrome generation circuit 30.

The descrambling process will now be described. As described above, when the initial value of the scramble value SC is the initial value S0, the descramble data element dDu is generated by descrambling the scramble data element sDu using the equation shown below.

$$dD0 = sD0 \char`\^ S0$$
$$dD1 = sD1 \char`\^ S0 \cdot \gamma^1$$
$$dD2 = sD2 \char`\^ S0 \cdot \gamma^2$$
$$\vdots$$
$$dD2050 = sD2050 \char`\^ S0 \cdot \gamma^{2050}$$
$$dD2051 = sD2051 \char`\^ S0 \cdot \gamma^{2051}$$

Equation 10

As the above equation shows, the descrambling process is performed by performing an exclusive OR operation on the same scramble value SC as used in the scrambling process and the scramble data elements sDu. The descramble data elements are generated correctly only when the descrambling process uses the exclusively OR of the scramble data elements sDu read in the same order as in the scrambling process and the scramble values SC generated in the same order as in the scrambling process. In the first embodiment, the data block DB is divided in 31 divisional parts. In this case, the data elements are read in the descrambling process in the order different from the order in which the data elements are read in the scrambling process. If the scramble value SC is generated simply by repeatedly shifting the bits by one byte, the scramble value SC fails to be appropriate to combine with the scramble data element sDu in the descrambling process. In this case, the descrambling process is not performed correctly.

Figures 25, 26:
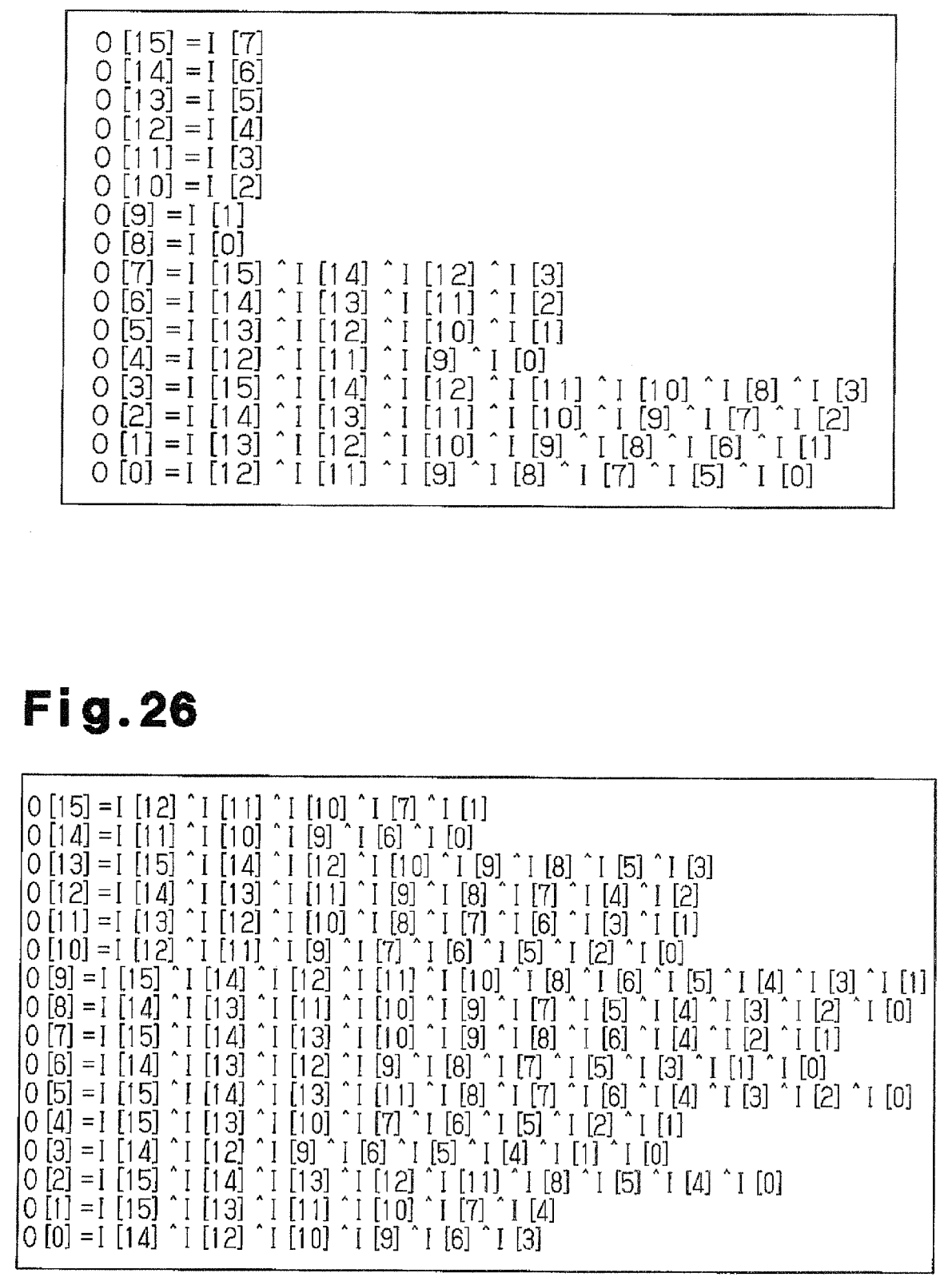

To shift a shift operand γ by a desired number of bytes in accordance with the scramble data element sDu that is provided to the EOR circuit 21, the scrambling-value generation circuit 22 includes a 1-shift calculator 24 (first shift calculator), a 209-shift calculator 25 (second shift calculator), and a 108-shift calculator 26 (third shift calculator). The 1-shift calculator 24 and the 209-shift calculator 25 are provided with a scramble value SC from a flip-flop (FF) circuit 23. When receiving the value $S0*\gamma^n$ as the scramble value SC from the FF circuit 23, the 1-shift calculator 24 generates the value $S0*\gamma^{n+1}$ as the shifted scramble value SC. In other words, the 1-shift calculator 24 generates a new scramble value SC by shifting an input scramble value by one byte using a generation polynomial (first generation polynomial) Φ(x). FIG. 25 shows a logic equation representing the value O[15:0], which is output from the 1-shift calculator 24 when the value I[15:0] is input to the 1-shift calculator 24.

When receiving the value $S0*\gamma^n$ as the scramble value SC from the FF circuit 23, the 209-shift calculator 25 generates the value $S0*\gamma^{n+209}$ as the shifted scramble value SC. In other words, the 209-shift calculator 25 generates a new scramble value SC by shifting an input scramble value by 209 bytes in accordance with the generation polynomial Φ(x). FIG. 26 shows a logic equation representing the value O[15:0], which is output from the 209-shift calculator 25 when the value I[15:0] is input to the 209-shift calculator 25.

Figure 27:
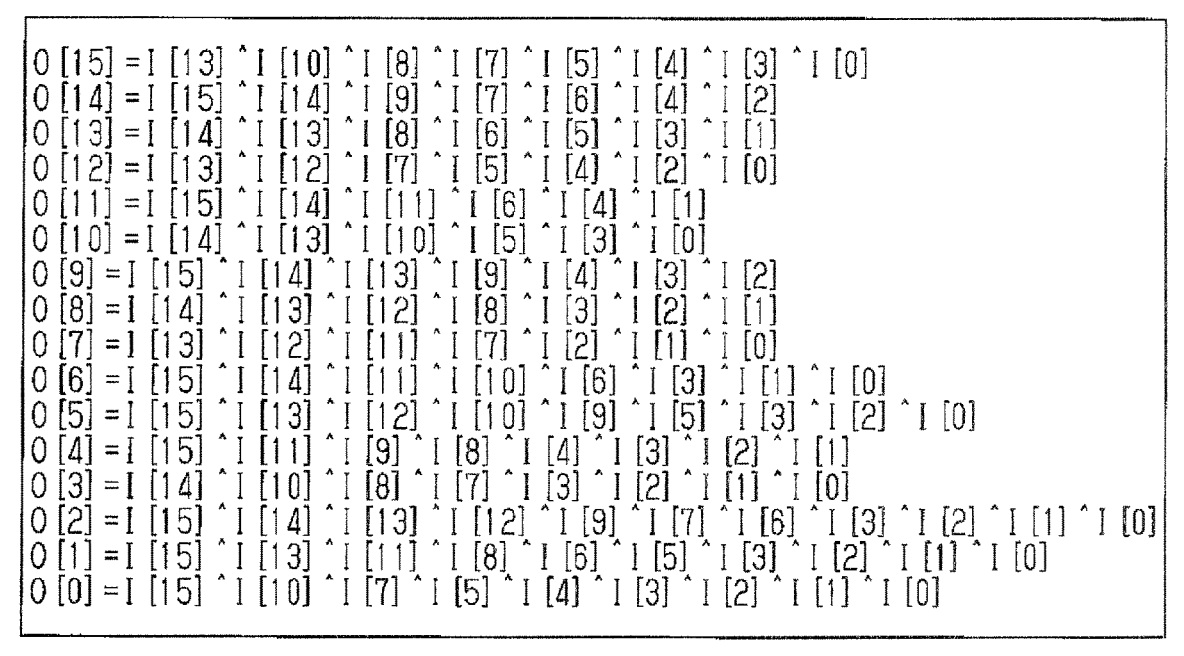

When receiving the initial value S0 of the scramble value SC from the initial value resistor R1, the 108-shift calculator 26 generates the value $S0*\gamma^{108}$ as the shifted scramble value SC. In other words, the 108-shift calculator 26 generates a new scramble value SC by shifting an input scramble value (initial value) by 108 bytes in accordance with the generation polynomial Φ(x). FIG. 27 shows a logic equation representing the value O[15:0], which is output from the 108-shift calculator 26 when the value I[15:0] is input to the 108-shift calculator 26. In FIGS. 25 to 27, the values O[7] to O[0] indicate the data with which an exclusive OR operation may actually be performed with the scramble data element sDu by the EOR circuit 21.

The selector 27 is provided with the scramble values SC from the calculators 24 and 25, the initial value register R1, the even number register R2, and the odd number register R3. At the initial setting, the even number register R2 stores the initial value S0 of the scramble value SC stored in the initial value register R1. During operation, the even number register R2 stores a calculated value (scramble value) of the 1-shift calculator 24, which is generated by shifting, by one byte, the scramble value SC used to generate the scramble data arranged in the last row of the first column of the last even number data frame (data frame DF 30) included in each read block RB. At the initial setting, the odd number register R3 stores the scramble value SC ($=S0*\gamma^{108}$) generated based on the initial value S0 by the 108-shift calculator 26. During operation, the odd number register R3 stores a calculated value (scramble value) of the 1-shift calculator 24, which is generated by shifting, by one byte, the scramble value SC used to generate the scramble data arranged in the last row of the first column of the last odd number data frame (data frame DF31) included in each read block RB.

The selector 27 is further provided with a selection signal from the selection circuit 28. Based on the selection signal, the selector 27 outputs one of the scramble values SC provided from the calculators 24 and 25 and the registers R1 to R3 to the FF circuit 23. The selection circuit 28 generates a selection signal in accordance with the number of pulses of a clock signal CLK that is provided from the demodulation circuit 11, that is, the position of the read data in the data block DB. For example, when the EOR circuit 21 is provided with the first scramble data element in the first row of the first column of each even number data frame included in the read block RB, the selection circuit 28 generates a selection signal for outputting the scramble value SC of the even number register 28 to the FF circuit 23. Further, when the EOR circuit 21 is provided with the first scramble data element in the first row of the first column of each odd number data frame included in the read block RB, the selection circuit 28 generates a selection signal for outputting the scramble value SC of the odd number register 29 to the FF circuit 23. When the EOR circuit 21 is provided with the scramble data element of the second or subsequent row included in the read block RB, the selection circuit 28 generates a selection signal for outputting the scramble value SC provided to the 1-shift calculator 24 to the FF circuit 23. When the EOR circuit 21 is provided with the scramble data element of the first row of the second or subsequent column of each data frame DF included in the read block RB, the selection circuit 28 generates a selection signal for outputting the scramble value SC provided to the 209-shift calculator 25 to the FF circuit 23.

The FF circuit 23 latches the scramble value SC, which is input from the selector 27 to a D-terminal of the FF circuit 23, based on the pulses of a clock signal CLK, which is provided to a CK terminal of the FF circuit 23. The FF circuit 23 then provides the latched scramble value SC from its Q-terminal to the EOR circuit 21 and the calculators 24 and 25.

As shown in FIG. 12, the EDC syndrome generation circuit 30 generates an EDC syndrome by performing EDC calculation based on the descramble data element dDu, which is provided from the descramble circuit 20 as byte data. In detail, the EDC syndrome generation circuit 30 generates an EDC syndrome corresponding to the descramble data element dDu for every data frame DF included in the read block RB, and stores the EDC syndromes into the EDC memory unit 40.

Figure 18:
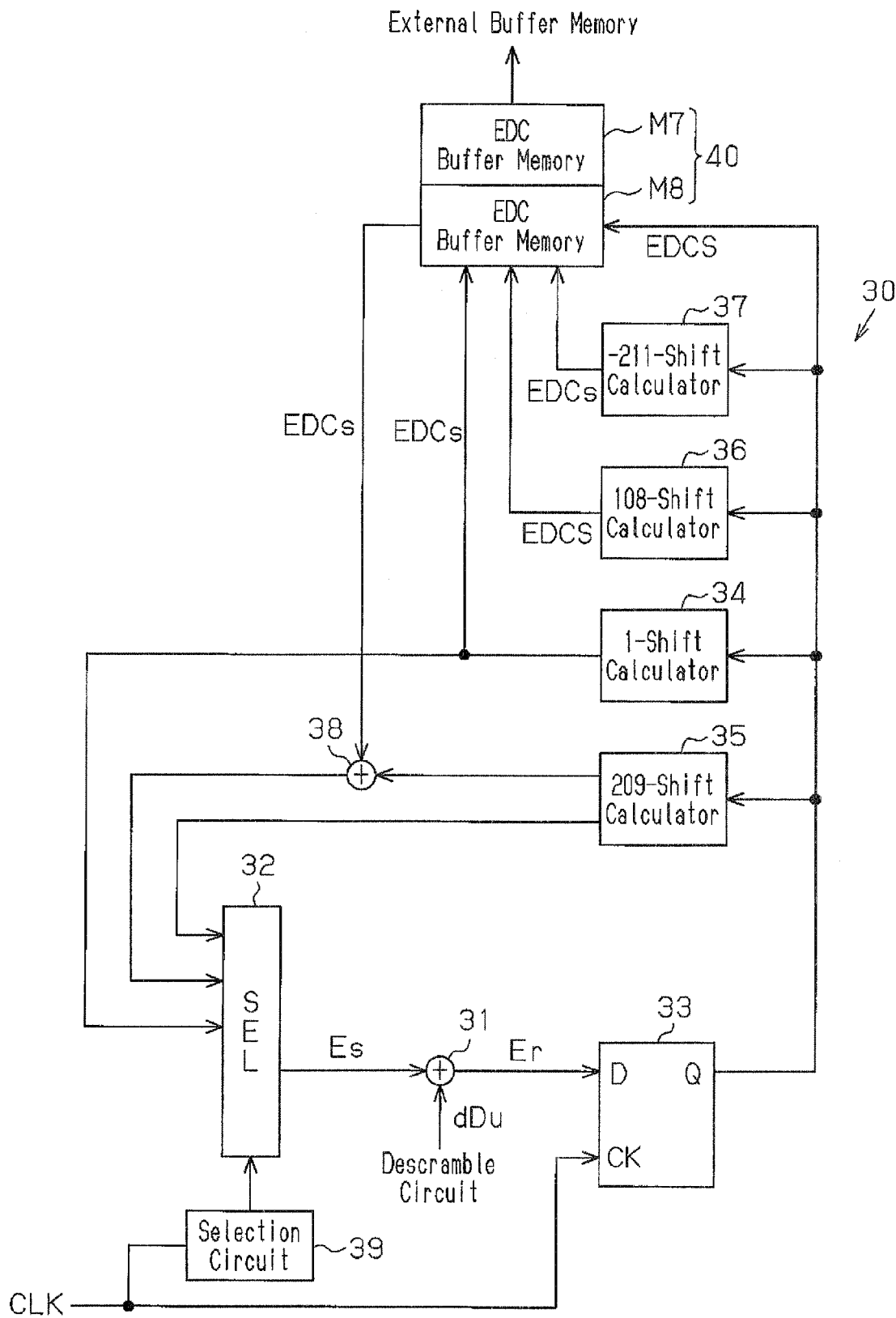
FIG. 18 is a schematic block diagram showing an EDC syndrome generation circuit according to the first embodiment.

FIG. 18 shows one example of the circuit structure of the EDC syndrome generation circuit 30. As shown in FIG. 18, the descramble data element dDu transferred from the descramble circuit 20 is provided to the EOR circuit 31. The EOR circuit 31 is further provided with a shift calculated value Es from the selector 32. The EOR circuit 31 performs an exclusive OR operation on the descramble data element dDu and the lower eight bits of the shift calculated value Es to generate an EDC calculate value Er(c). The EOR circuit 31 then provides the EDC calculated value Er(c) to the FF circuit 33. In the EDC calculated value Er(c), "r" indicates the number given to the read block RB. The number r satisfies $1 \leq r \leq 27$. In the EDC calculated value Er(c), "c" indicates the number of pulses of the clock signal CLK in each data frame DF.

The EDC calculation will now be described. As described above, the EDC syndrome EDCS is generated using the equation shown below when the descramble data elements are input in the order of the data elements dD0, dD1, . . . , dD2050, and dD2051, that is, in the same order as the arrangement order of the data elements during the process of appending the EDC (EDC appending process).

$$EDCS = \beta^{2051} \cdot X^{2051} \beta^{2050} \cdot X^{2050} \beta^{2049} \cdot X^{2049} \ldots \beta^2 \cdot X^2 \beta^1 \cdot X^1 X^0 \qquad \text{Equation 11}$$

As the above equation shows, an EDC syndrome EDCS is generated each time when 1-byte data is calculated. The EDC syndrome EDCS is generated by weighting the 1-byte data using the first-degree vector $\beta^1$. Thus, the data element that is input earlier is weighted using the vector β with a higher degree, and the data element that is input later is weighted using the vector β with a lower degree. For example, the data element (byte data) $X^{2051}$ that is input at the earliest timing of all the data elements included in each data frame DF is weighted 2051 times using the first-degree vector $\beta^1$. However, in the first embodiment, the descramble data elements are provided from the descramble circuit 20 to the EDC syndrome generation circuit 30 in the order of the data elements dD0, dD1, . . . , dD7, dD216, dD217, . . . as shown in FIG. 17. The descramble data elements are provided in the order different from the order in which the data elements are processed in the EDC appending process. As a result, the EDC syndrome generation circuit 30 fails to perform the weighting process correctly, and fails to generate an EDC syndrome in a successful manner.

To weight each data element using the vector $\beta^n$ with a desired degree n in accordance with the byte data in the first embodiment, the EDC syndrome generation circuit 30 includes a 1-shift calculator 34, a 209-shift calculator 35, a 108-shift calculator 36, and a −211-shift calculator 37 as shown in FIG. 18. Each of the calculators 34 to 37 is provided with an EDC calculated value Er(c) from the FF circuit 33. More specifically, the FF circuit 33 latches the EDC calculated value Er(c) input to its D-terminal based on a clock signal CLK, which is input to its CK terminal. The FF circuit 33 then provides the latched EDC calculated value Er(c) from its Q terminal to the calculators 34 to 37 and the EDC memory unit 40.

Figure 28:
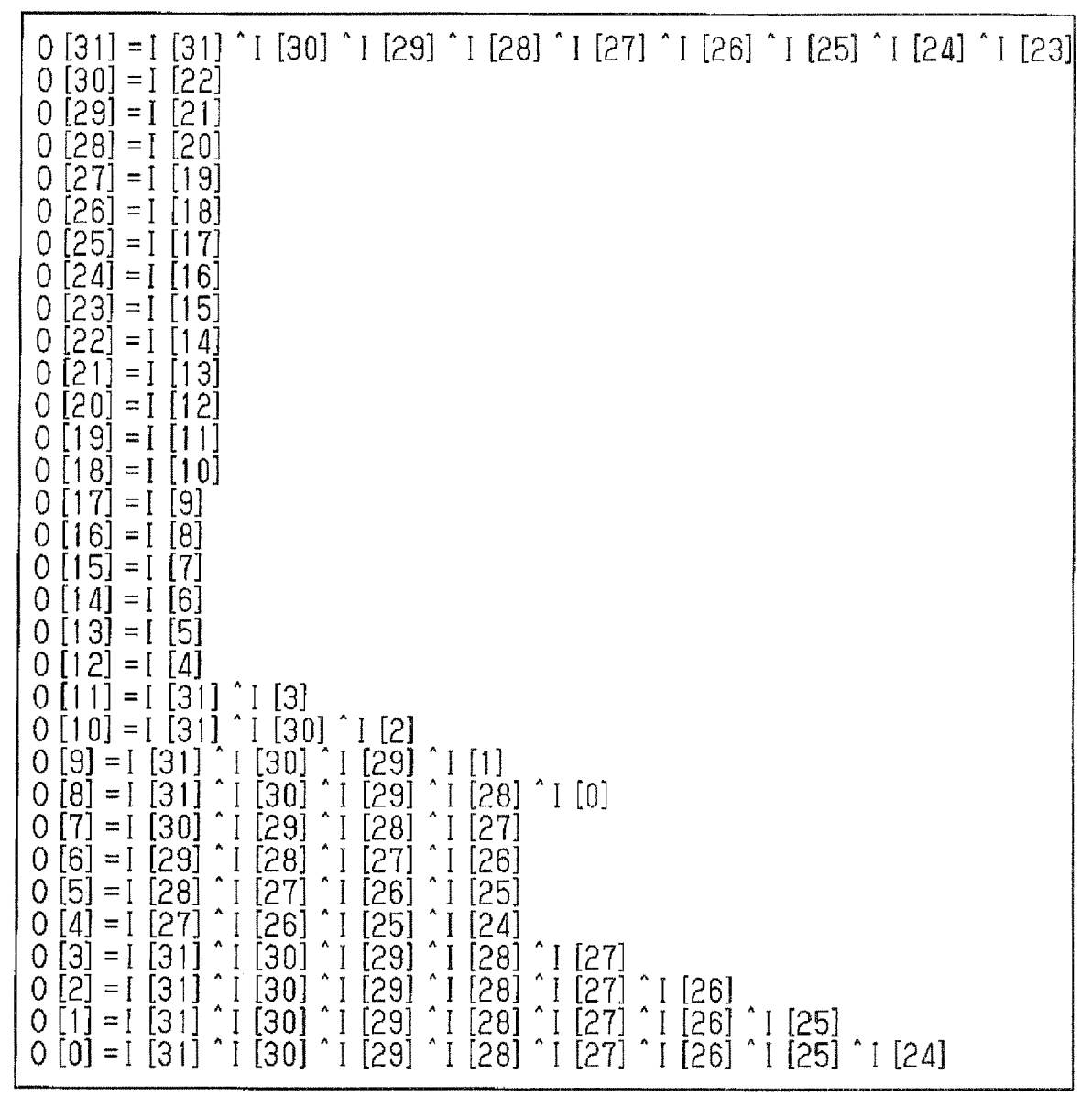

When receiving the EDC calculated value Er(c) provided from the FF circuit 33, the 1-shift calculator 34 generates the value Er(c)*$\beta^1$ as the shift calculated value. More specifically, the 1-shift calculator 34 shifts the bit values (or in other words changes the weighting) of the input calculated value Er(c) by one byte in accordance with a generation polynomial (second generation polynomial) G(x). This generates the shift calculated value Es (weighted value). FIG. 28 shows a logic equation representing the value O[31:0], which is output from the 1-shift calculator 34 when the value I[31:0] is input to the 1-shift calculator 34.

Figure 29:
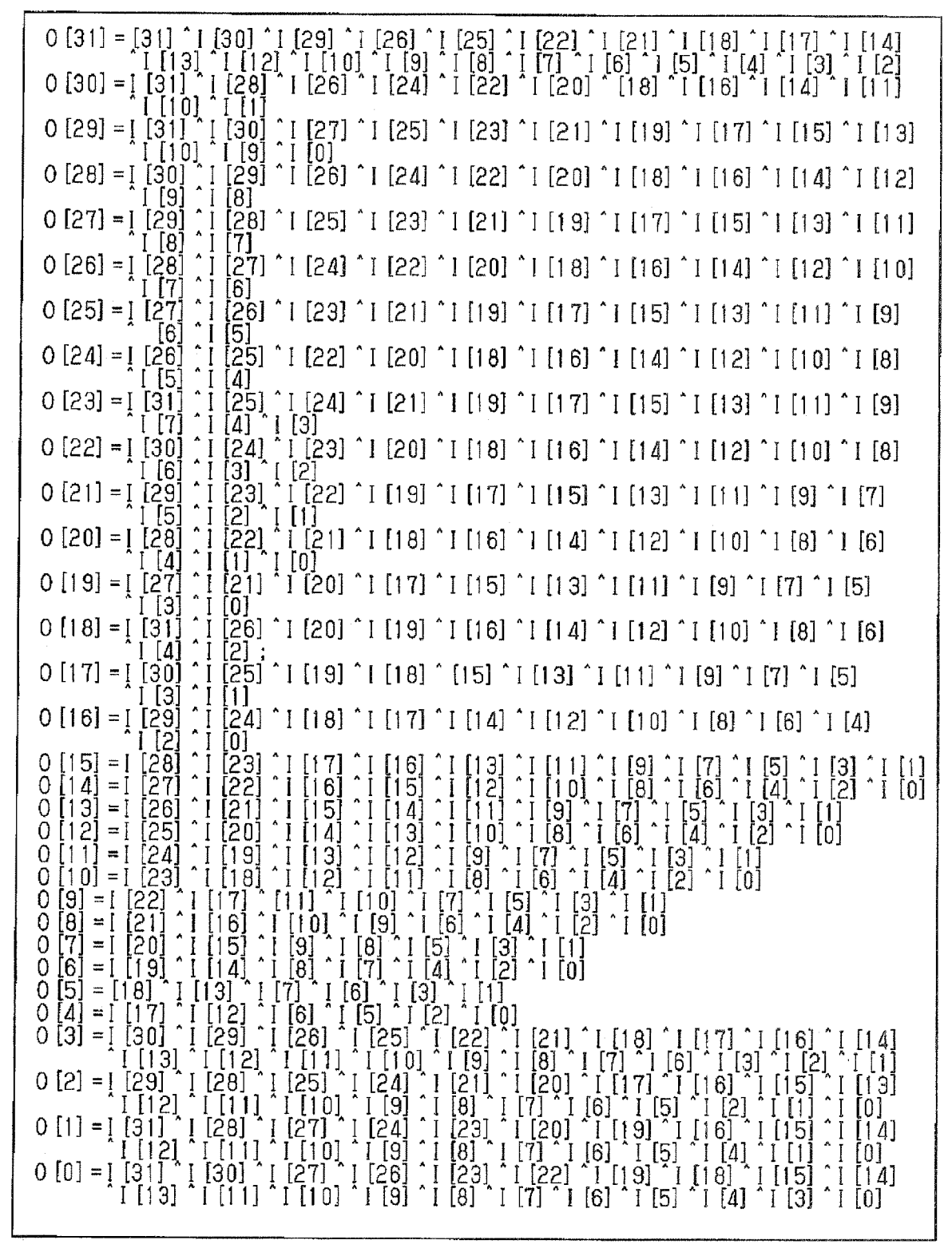

When receiving the EDC calculated value Er(c) from the FF circuit 33, the 209-shift calculator 35 generates the value Er(c)*$\beta^{209}$ as the shift calculated value. More specifically, the 209-shift calculator 35 shifts the bit values of the input EDC calculated value Er(c) by 209 bytes in accordance with the generation polynomial G(x). This generates the shift calculated value Es (weighted value). FIG. 29 shows a logic equation representing the value O[31:0], which is output from the 209-shift calculator 35 when the value I[31:0] is input to the 209-shift calculator 35.

Figure 30:
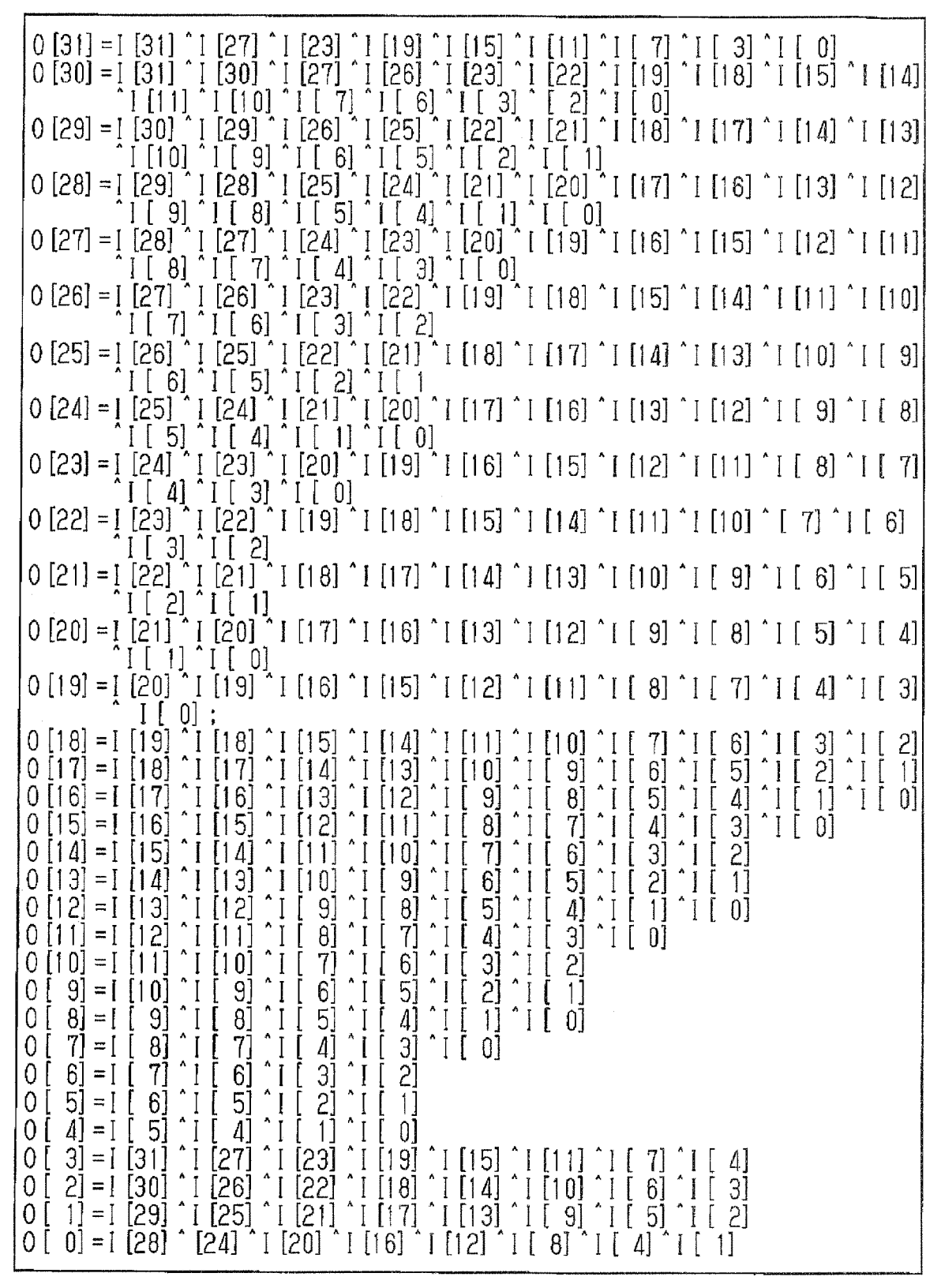

When receiving the EDC calculated value Er(c) from the FF circuit 33, the 108-shift calculator 36 generates the value Er(c)*$\beta^{108}$ as the EDC syndrome EDCS. More specifically, the 108-shift calculator 36 shifts the bit values of the input EDC calculated value Er(c) by 108 bytes in accordance with the generation polynomial G(x). This generates the EDC syndrome EDCS (weighted value). FIG. 30 shows a logic equation representing the value O[31:0], which is output from the 108-shift calculator 36 when the value I[31:0] is input to the 108-shift calculator 36.

Figure 31:
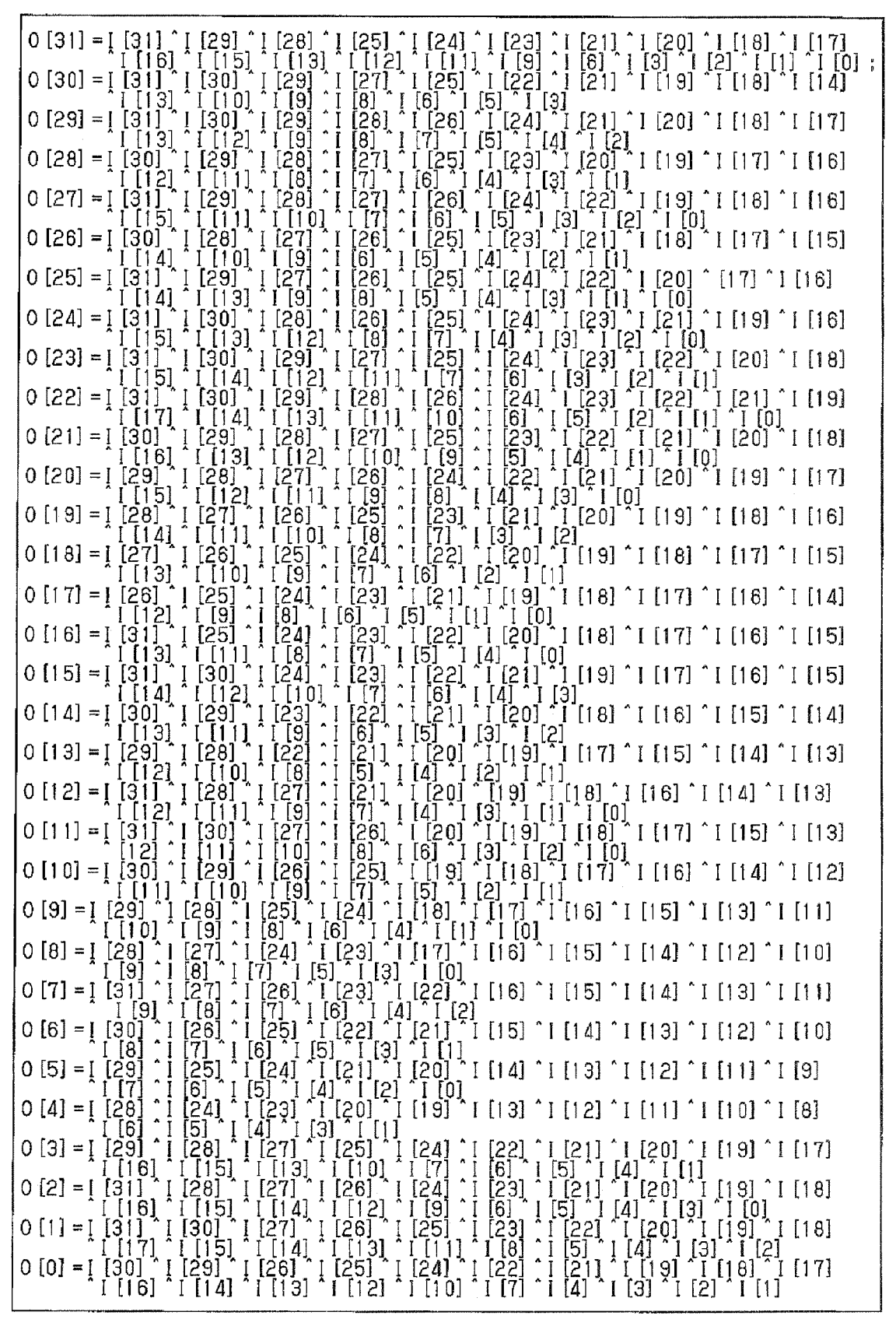

When receiving the EDC calculated value Er(c) from the FF circuit 33, the −211-shift calculator 37 generates the value Er(c)*$\beta^{-211}$ as the intermediate value EDCs of the EDC syndrome. More specifically, the −211-shift calculator 37 inversely shifts the bit values of the input EDC calculated value Er(c) by 211 bytes in accordance with the generation polynomial G(x). This generates the intermediate value EDCs (weighted value). FIG. 31 shows a logic equation representing the value O[31:0], which is output from the −211-shift calculator 37 when the value I[31:0] is input to the −211-shift calculator 37.

The EDC memory unit 40 is provided with the EDC calculated value Er(c) of the byte data of the last row of the last column of each data frame in each read block RB. The EDC calculated value Er(c), which serves as the intermediate value EDCs, is provided from the 1-shift calculator 34 to the EDC memory unit 40. The EDC memory unit 40 is also provided, from the −211-shift calculator 37, with the EDC calculated value Er(c) of the last byte data of each even number data frame included in the fourteenth read block RB. The EDC memory unit 40 stores the EDC calculated value Er(c) as the intermediate value EDCc. The EDC memory unit 40 is also provided, from the 108-shift calculator 36, with the EDC calculated value Er(c) of the byte data of the last row of the last column of each even number data frame included in the twenty seventh read block RB. The EDC memory unit 40 stores the EDC calculated value Er(c) as the EDC syndrome EDCS. The EDC memory unit 40 is further provided, from the FF circuit 33, with the EDC calculated value Er(c) of the byte data of the last row of the last column of each odd number data frame included in the twenty seventh read block RB. The EDC memory unit 40 stores the EDC calculated value Er(c) as the EDC syndrome EDCS.

As shown in FIG. 12, the EDC memory unit 40 includes two EDC buffer memories M7 and M8. Each of the buffer memories M7 and M8 has a memory capacity that may store the EDC syndromes of all the data frames DF0 to DF31. More specifically, each of the EDC buffer memories M7 and M8 has a memory capacity of 128 bytes (4*32). The EDC memory unit 40 provides the intermediate value EDCs, which is stored into the EDC memory unit 40 via the 1-shift calculator 34 and the −211-shift calculator 37, to the EOR circuit 38. Also, the EDC memory unit 40 outputs the EDC syndrome EDCS, which is stored into the EDC memory unit 40 via the FF circuit 33 and the 108-shift calculator 36, to the external buffer memory 6. The buffer memory M7 and the buffer memory M8 of the EDC memory unit 40 are used in parallel. When one of the buffer memories M7 and M8 is used as a syndrome storage buffer for storing the intermediate values EDCs of the EDC syndromes, the other one of the buffer memories M7 and M8 is used as a syndrome output buffer for outputting the final EDC syndrome EDCS to the external buffer memory 6. The EDC memory unit 40 has substantially the same structure as the internal memory unit 12 (FIG. 15).

The EOR circuit 38 performs an exclusive OR operation on the shift calculated value Es (Er(c)*$\beta^{209}$) provided from the 209-shift calculator 35 and the intermediate value EDCs provided from the EDC memory unit 40. The EOR circuit 38 then provides the calculation result to the selector 32 as the shift calculated value Es.

Based on a selection signal provided from the selection circuit 39, the selector 32 outputs one of the shift calculated values Es provided from the calculator 34, the calculator 35, and the EOR circuit 38 to the EOR circuit 31. The selector 32 also stops outputting the shift calculated value Es based on a selection signal provided from the selection circuit 39.

The selection circuit 39 generates a selection signal in accordance with the number of pulses of a clock signal CLK, that is, the position of the read data (byte data) in the data block DB. The selection circuit 39 provides the selection signal to the selector 32. For example, when the EOR circuit 31 is provided with the byte data of the second or subsequent row of the read block RB, the selection circuit 39 generates a selection signal for outputting the shift calculated value Es provided from the 1-shift calculator 34 to the EOR circuit 31. When the EOR circuit 31 is provided with the byte data of the first row of each column of each data frame DF included in the read block RB excluding the first column and the last column, the selection circuit 39 generates a selection signal for outputting the shift calculated value Es provided from the 209-shift calculator 35 to the EOR circuit 31. When the EOR circuit 31 is provided with the byte data of the first row of the last column of each data frame DF included in the read block RB, the selection circuit 39 generates a selection signal for outputting the shift calculated value Es provided from the EOR circuit 38 to the EOR circuit 31. When the EOR circuit 38 is provided with the first byte data of the first row of the first column of each data frame included in the read block RB, the selection circuit 39 generates a selection signal for stopping the output of the shift calculated value Es from the selector 32.

As shown in FIG. 12, the correction circuit 51 included in the error correction circuit 50 reads an LDC syndrome and a BIS syndrome from the external buffer memory 6. Based on the LDC syndrome and the BIS syndrome, the correction circuit 51 subjects the data frame DF, which has been subjected to the descrambling process and stored in the external buffer memory 6, to error correction. The correction circuit 51 then provides the error position and the error value, which are calculated through the error correction, to the EDC correction circuit 52.

Based on the error position and the error value calculated by the correction circuit 51, the EDC correction circuit 52 corrects the EDC syndrome that has been transferred from the external buffer memory 6 and stored into the correction memory unit 53. The EDC checking circuit 54 reads the corrected EDC syndrome stored in the correction memory unit 53, and subjects the corrected EDC syndrome to EDC checking. The EDC checking circuit 116 included in the conventional controllers 110 and 130 shown in FIGS. 8 and 10 performs the EDC checking while transferring the corrected data to the host computer. In this case, the conventional controllers 110 and 130 may transfer the data to the host computer although the error correction of the data is completed unsuccessfully. To overcome this problem, the controller 10 of the first embodiment performs the EDC checking immediately after the error correction is completed. This prevents the data from being transferred to the computer 2 when the error correction of the data is completed unsuccessfully.

The interface circuit 60 reads the data that has been subjected to the error correction and stored into the external buffer memory 6 based on an instruction provided from the microprocessor 8, and provides the read data to the computer 2.

Figure 19:
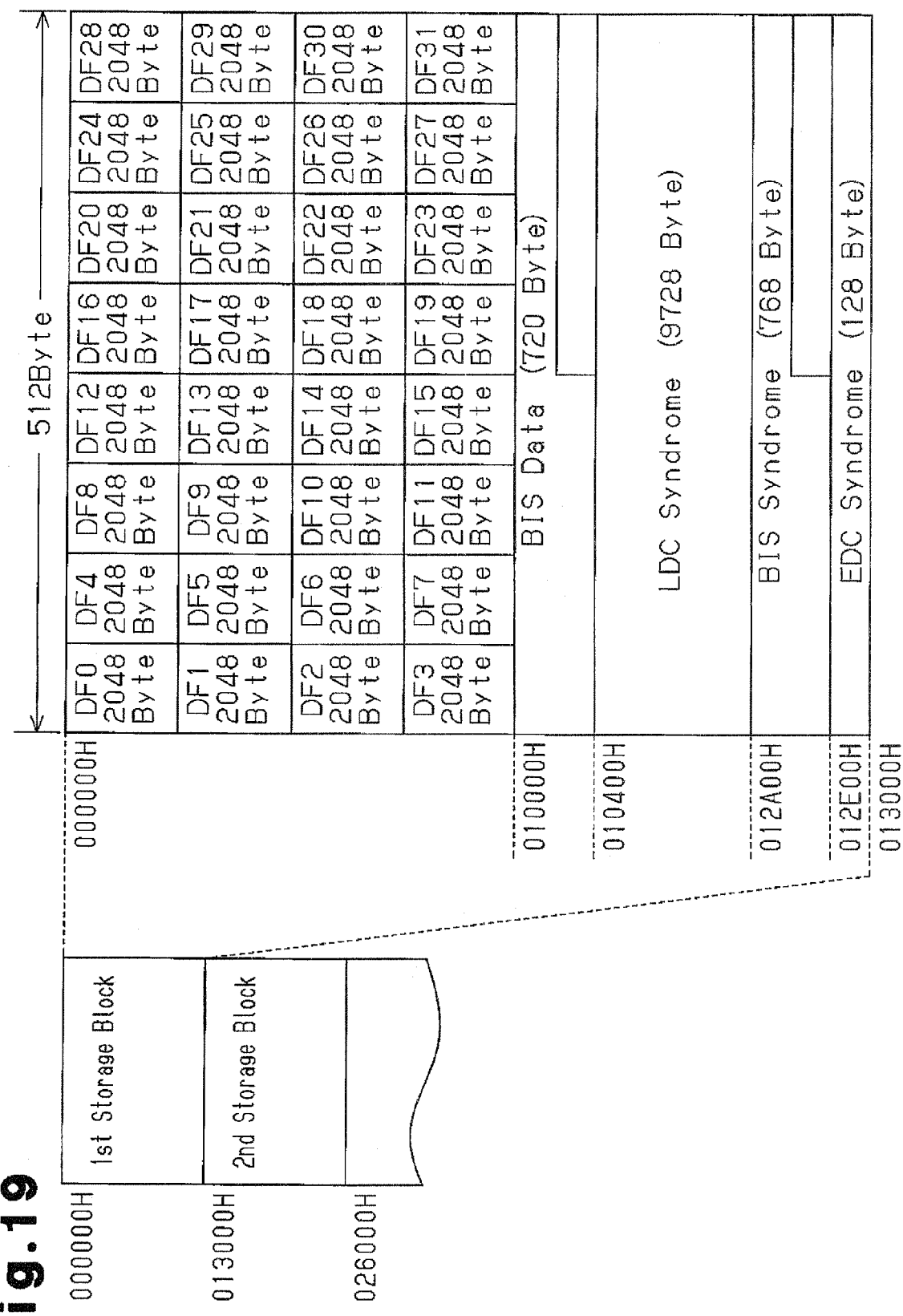
FIG. 19 is a diagram describing an external buffer memory shown in FIG. 12.

As shown in FIG. 19, the external buffer memory 6 includes a plurality of storage blocks (only a first storage block and a second storage block are shown in FIG. 19). Each storage block consists of 13000H bytes. The first storage block stores the user data UD (65536 bytes) of all the data frames DF0 to DF31 at its addresses 000000H to 00FFFFH, and stores the BIS data (720 bytes) at its addresses 010000H to 0103FFH. The first storage block further stores the LDC syndromes (9728 bytes) at its addresses 010400H to 0129FFH, stores the BIS syndromes (768 bytes) at its addresses 012A00H to 012DFFH, and stores the EDC syndromes (128 bytes) at its addresses 012E00H to 12FFFH. As a result, the first storage block stores a single cluster ECCs. Each of the other storage blocks also stores a single cluster ECCc. As known in the art, "H" denotes a hexadecimal number.

The operation of the optical disc controller 10 with the above-described structure will now be described.

The demodulation circuit 11 reads disc data from the BD 4 and demodulates the disc data, and stores the demodulated data (cluster ECCc) into one of the buffer memories M1 and M2 that is selected as the data storage buffer. The single buffer memory stores a divisional cluster DECC, which is 2480-byte data. The divisional cluster DECC is one of 31 divisional clusters DECC into which the cluster ECCc is divided.

The LDC syndrome generation circuit 13 reads the cluster LDCc included in the divisional cluster DECC from the access buffer (M1 or M2) of the internal memory unit 12 as the first read block RB1 (2432 bytes=8 rows*304 columns), while changing the arrangement order of the data elements. Also, the LDC syndrome generation circuit 13 generates an LDC syndrome for each column of the read block RB1. The LDC syndrome generation circuit 13 stores the LDC syndrome into the LDC memory unit 14 as an intermediate value of the LDC syndrome.

In the same manner, the LDC syndrome generation circuit 13 serially reads the second to thirty first read blocks RB2 to RB31. When reading the read blocks, the LDC syndrome generation circuit 13 reads an intermediate value of an LDC syndrome of the same column of the immediately preceding read block RB. The LDC syndrome generation circuit 13 then generates an LDC syndrome based on the read intermediate value and the corresponding column data of the present read block RB, and stores the generated LDC syndrome into the LDC memory unit 14 as the intermediate value of the new LDC syndrome.

When reading all data of the single parity-appended block PB (first to thirty first blocks RB1 to RB31), the LDC memory unit 14 switches the buffer memory M3 and the buffer memory M4 between the syndrome storage buffer and the syndrome output buffer. The output buffer of the LDC memory unit 14 that has been switched from the storage buffer then stores the final LDC syndrome of each column of the single parity-appended block PB. The output buffer of the LDC memory unit 14 then provides the final LDC syndrome of each column to the external buffer memory 6.

The cluster BISc included in the divisional cluster DECC is then transferred from the access buffer (M1 or M2) of the internal memory unit 12 to the data storage buffer (M5 or M6) of the BIS memory unit 15. When all data of the single cluster BISc is completely stored into the BIS memory unit 15, the buffer memories M5 and M6 are switched between the data storage buffer and the data output buffer. The BIS syndrome generation circuit 16 then reads the cluster BISc from the output buffer (M5 or M6), which has been switched from the storage buffer of the BIS memory unit 15. The BIS syndrome generation circuit 16 then generates a BIS syndrome based on the read cluster BISc, and stores the BIS syndrome into the external buffer memory 6.

The descramble circuit 20 reads the scramble data elements sDu from the access buffer (M1 or M2) of the internal memory unit 12 as the first to twenty seventh read blocks RB1 to RB27, while the LDC syndrome generation circuit 13 is reading the data from the LDC syndrome generation circuit 13.

The descrambling process performed by the descramble circuit 20 will now be described with reference to FIG. 17 and FIGS. 20 to 22.

Figure 20:
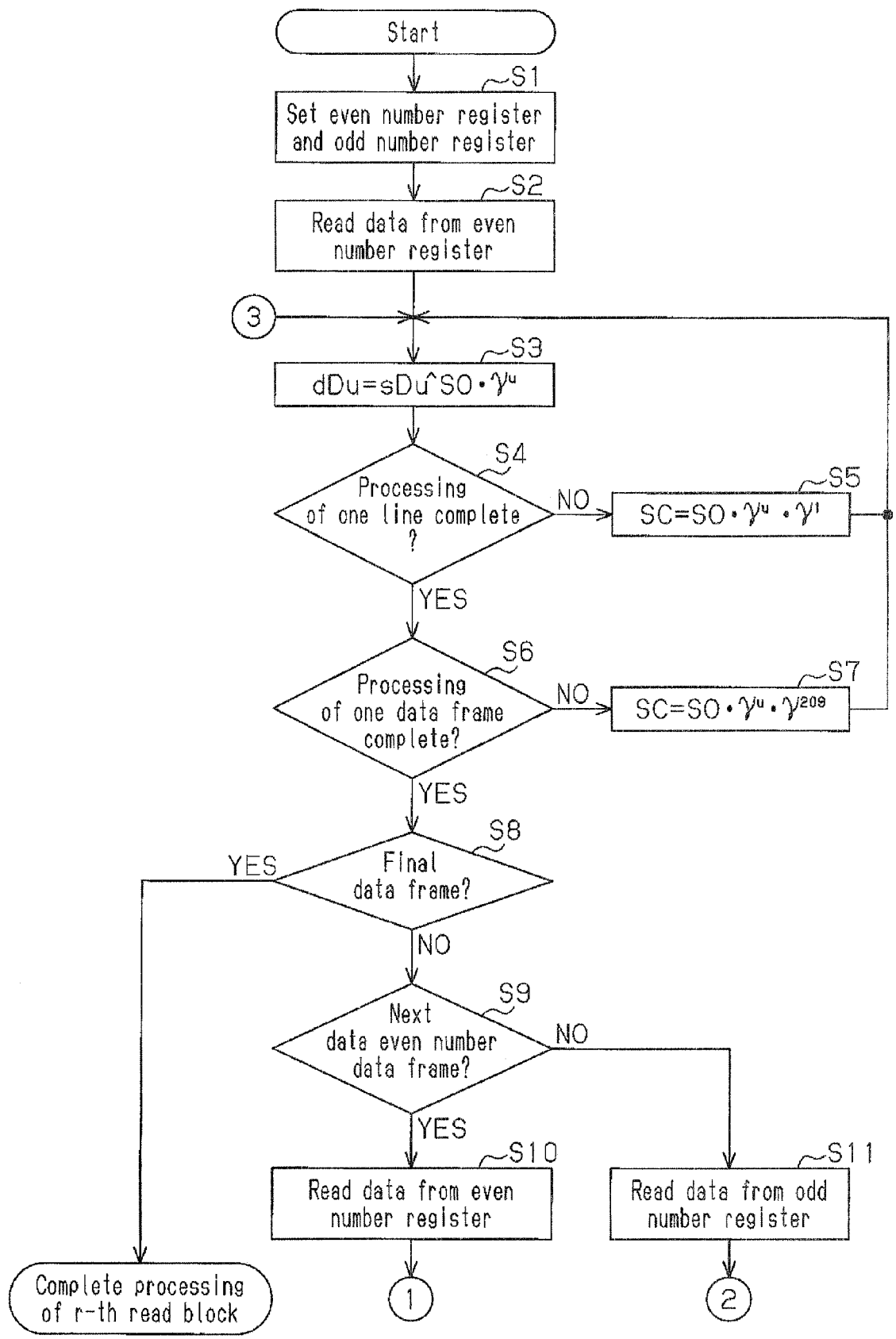
FIG. 20 is a flowchart illustrating a descrambling process.

In step S1 shown in FIG. 20, the initial value S0 of the scramble value SC is stored into the even number register R2, and the value $S0*\gamma^{108}$ is stored into the odd number register R3 as the scramble value SC. The initial value S0 is not stored into the odd number register R3 but the value $S0*\gamma^{108}$ is stored into the odd number register R3 for the reason described below. As shown in FIG. 17, the scramble data element sDu of the odd number data frame DF (for example, the data frame DF1) in the first read block RB1 read at the earliest timing is given the row number u of 108. Thus, the value $S0*\gamma^{108}$ is stored at the earliest timing. The scramble data element sD108 is scrambled at the timing later than the first data element sD0 of each data frame in the scrambling process by the time corresponding to 108 bytes. Thus, the scramble value $S0*\gamma^{108}$, which is obtained by shifting the initial value S0 by 108 bytes, is stored into the odd number register R3. The initial value S0 is set in advance in accordance with a physical sector number of the cluster ECCc in the disc data.

The descramble circuit 20 then reads the scramble data element sD0 of the data frame DF0 (even number data frame) included in the first read block RB1, and provides the scramble data element sD0 to the EOR circuit 21 (step S2). The selection circuit 28 provides the selector 27 with a selection signal for outputting the scramble value SC of the even number register R2 to the EOR circuit 21. Thus, the EOR circuit 21 is provided with the initial value S0 as the scramble value SC. The EOR circuit 21 generates the descramble data element dD0 by performing an exclusive OR operation on the scramble data element sD0 and the lower eight bits of the initial value S0, and provides the descramble data element dD0 to the external buffer memory 6 and the EDC syndrome generation circuit 30 (step S3). The scramble value SC, which is provided to the EOR circuit 21, is also provided to the 1-shift calculator 24 and the 209-shift calculator 25. Hereafter, the lower eight bits of the scramble value SC that have undergone the exclusive OR operation with the scramble data element by the EOR circuit 21 are simply referred to as the "scramble value SC". In other words, the EOR circuit 21 performs an exclusive OR operation on the scramble data element sDu and the lower eight bits of the scramble value SC.

In step S4, the selection circuit 28 determines whether all the data elements in one column of the read block RB have been subjected to the descrambling process based on the number of pulses of the clock signal CLK. When all the data elements in one column have not yet undergone the descrambling process (NO in step S4), the processing proceeds to step S5. When the scramble data element read by the descrambling circuit 20 in step S3 is the scramble data element sDu, the scramble data element that is read next is set as the data element sDu+1 (that is, the scramble data element in the next row). In step S5, the scramble data elements included in the read block RB are serially read in the column direction. The scramble data elements are read in the same order as the order in which these data elements are processed in the scrambling process.

When the data element in the second or subsequent row included in the read block is provided to the EOR circuit 21, the selection circuit 28 provides the selector 27 with a selection signal for outputting the scramble value SC of the 1-shift calculator 24 to the EOR circuit 21 in step S5. As a result, the EOR circuit 21 is provided with the scramble value $S0 * \gamma^u * \gamma^1$, which is obtained by shifting the scramble value used to generate the read scramble data element sDu immediately preceding the present scramble data element by one byte in accordance with the generation polynomial $\Phi(x)$. The EOR circuit 21 then performs an exclusive OR operation on the scramble data element sD1 that is read subsequently by the descramble circuit 20 and the scramble value $SC(S0 * \gamma^1)$ of the 1-shift calculator 24 to generate the descramble data element dD1 (step S3). Thereafter, the processing in steps S3 to S5 is repeated until all the data elements in the column are subjected to the descrambling process. In the first embodiment, the descramble circuit 20 reads the scramble data elements in the order of the data elements sD2, sD3, sD4, sD5, sD6, and sD7 (refer to arrows drawn using solid lines in FIG. 17). In this case, the descramble data elements dD2 to dD7 are generated using the equation shown below.

$dD2 = sD2 \char`\^ S0 \cdot \gamma^2$ $dD3 = sD3 \char`\^ S0 \cdot \gamma^3$ $dD4 = sD4 \char`\^ S0 \cdot \gamma^4$ $dD5 = sD5 \char`\^ S0 \cdot \gamma^5$ $dD6 = sD6 \char`\^ S0 \cdot \gamma^6$ $dD7 = sD7 \char`\^ S0 \cdot \gamma^7$   Equation 12

When the descramble data element dD7 is generated, the selection circuit 28 determines that all the data elements in the column have been subjected to the descrambling process in step S4. The selection circuit 28 then determines whether all the data elements included in the single data frame have been subjected to the descrambling process (step S6). When all the data elements included in the single data frame have not yet undergone the descrambling process (NO in step S6), the processing proceeds to step S7. The scramble data element read by the descramble circuit 20 in step S3 is assumed to be the scramble data element sDu. In this case, the scramble data element to be read next is set as the data element sDu+209. In step S7, the scramble data element in the first column of the next column of the same data frame included in the read block RB is then read in step S7. More specifically, the data elements are read in the descrambling process in the order different from the order in which the data elements are processed in the scrambling process. The data element D2 in the first row of the next column that is read in step S7 is processed at the timing delayed by the time corresponding to 209 bytes, which is calculated as (the number of rows of the data block DB+1)−(the number of rows of the single read block RB)=209, with respect to the timing at which the read data element D1 immediately preceding the data element D2. Thus, the 209-shift calculator 25 shifts the scramble value used for the data element D1 by 209 bytes in accordance with the generation polynomial $\Phi(x)$. This changes the order of the scramble values SC in a manner to coincide with the processing order used in the scrambling process. As a result, the descrambling process is performed correctly.

Accordingly, when the data element of the first row of the second or subsequent column of the data frame is provided to the EOR circuit 21, that is, in step S7, the selection circuit 28 provides a selection signal for outputting the scramble value SC of the 209-shift calculator 25 to the EOR circuit 21. As a result, the EOR circuit 21 is provided with the scramble value $S0 * \gamma^7 * \gamma^{209}$, which is obtained by shifting the scramble value $S0 * \gamma^7$ used to process the immediately preceding scramble data element sD7 by 209 bytes in accordance with the generation polynomial $\Phi(x)$. Subsequently, the EOR circuit 21 performs an exclusive OR operation on the scramble data element sD216 that is read next by the descramble circuit 20 and the scramble value $SC(S0 * \gamma^{216})$ of the 209-shift calculator 25 to generate the descramble data element dD216 (step S3).

In the same manner as the processing performed for the first column of the data frame DF0 described above, the processing in steps S3 to S5 is repeated. The descramble circuit 20 reads the scramble data elements in the order of the scramble data elements sD217, sD218, sD219, sD220, sD221, sD222, and sD223. The descramble data elements dD217 and dD223 are generated using the equation shown below.

$dD217 = sD217 \char`\^ S0 \cdot \gamma^{217}$ $dD218 = sD218 \char`\^ S0 \cdot \gamma^{218}$ $dD219 = sD219 \char`\^ S0 \cdot \gamma^{219}$ $dD220 = sD220 \char`\^ S0 \cdot \gamma^{220}$ $dD221 = sD221 \char`\^ S0 \cdot \gamma^{221}$ $dD222 = sD222 \char`\^ S0 \cdot \gamma^{222}$ $dD223 = sD223 \char`\^ S0 \cdot \gamma^{223}$   Equation 13

Thereafter, the processing in steps S3 to S7 is repeated to subject the data frame DF0 (scrambled data elements) included in the first read block RB1 to the descrambling process. When the descramble data element dD1951 (that is, the value $sD1951 \char`\^ S0 * \gamma^{1951}$) is generated from the scramble data element sD1951, which is the data element in the last row of the last column of the data frame DF0 included in the first read block RB1, the selection circuit 28 determines that all the data elements included in the single data frame have been subjected to the descrambling process (YES in step S7).

The selection circuit 28 then determines whether the data frame DF that has been subjected to the descrambling process is the last data frame. More specifically, the selection circuit 28 determines whether the data frame DF is the data frame DF31 (step S8). When the data frame DF is not the data frame DF31 (NO in step S8), the selection circuit 28 determines whether the data frame DF that is read next is an even number data frame (step S9). When the next data frame DF is an even number data frame (YES in step S9), the processing proceeds to step S10. When the next data frame DF is an odd number data frame (NO in step S9), the processing proceeds to step S11. In this example, the next data frame is the data frame DF1 (odd number data frame). Thus, the processing proceeds to step S11.

In step S11, the first data element in the first row of the first column of the odd number data frame is read first. The selection circuit 28 generates a selection signal for outputting the scramble value SC ($S0*\gamma^{108}$ in this example) to the EOR circuit 21.

Figure 21:
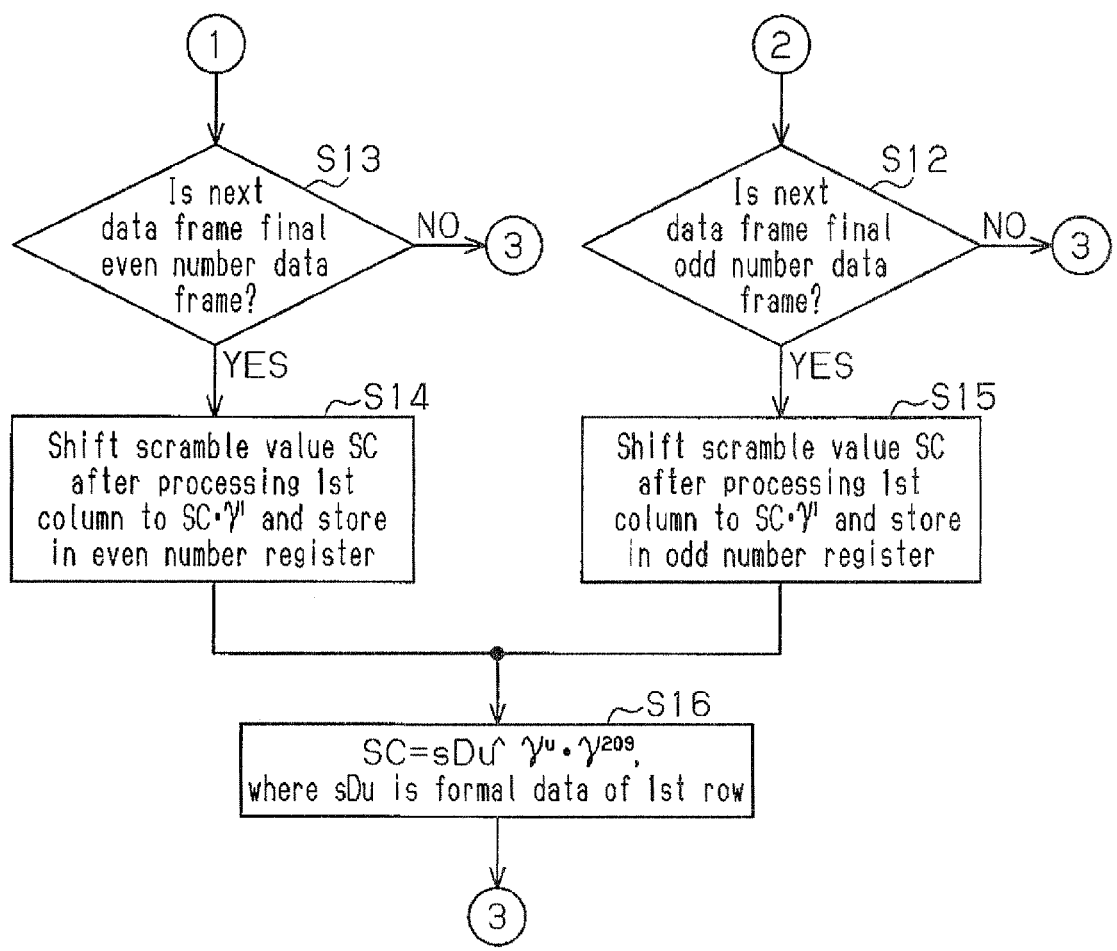
FIG. 21 is a flowchart illustrating the descrambling process.

In step S12 shown in FIG. 21, the selection circuit 28 determines whether the next data frame DF is the last odd number data frame. More specifically, the selection circuit 28 determines whether the next data frame DF is the data frame DF31. When the next data frame DF is not the last odd number data frame DF31 (NO in step S12), the processing proceeds to step S3. In step S3, the selection signal generated in step S11 is provided to the selector 27. As a result, the EOR circuit 21 is provided with the scramble value $S0*\gamma^{108}$ stored in the odd number register R3. The EOR circuit 21 is also provided with the scramble data element sD108 of the first row of the first column of the data frame DF1 included in the first read block RB1. The EOR circuit 21 performs an exclusive OR operation on the scramble data element sD108 of the data frame DF1 and the scramble value $S0*\gamma^{108}$ to generate the descramble data element dD108 (that is, $sD108\char`\^S0*\gamma^{108}$).

When the data of the second or subsequent row of each column of the read block RB (for example, the scramble data element sD109) is provided to the EOR circuit 21, the scramble value SC that is generated by shifting the previously used scramble value by one byte is used in the same manner as for the data frame DF0. When the data of the first row of the second or subsequent column of each data frame (for example, the scramble data element sD324) is provided to the EOR circuit 21, the scramble value that is obtained by shifting the previously used scramble value SC by 209 bytes is used. Thereafter, the processing in steps S3 to S7 shown in FIG. 20 is repeated. When the descramble data element dD1843 (that is, $sD1843\char`\^S0*\gamma^{1843}$) is generated from the last scramble data element sD1843 (refer to FIG. 17) of the odd number data frame DF1 included in the first read block RB1, the selection circuit 28 moves the processing from step S6 to step S9 after performing the processing in step S8. In this example, the next data frame is the data frame DF2 (even number data frame) (YES in step S9). Thus, the processing proceeds to step S10.

In step S10, the first data of the first row of the first column of the even number data frame included in the read block RB is read first. Thus, the selection circuit 28 generates a selection signal for outputting the scramble value SC (S0 in this example) of the even number register R2. In step S13 in FIG. 21, the selection circuit 28 determines whether the next data frame is the last even number data frame, that is, the data frame DF30. When the next data frame is not the last even number data frame (NO in step S13), the processing returns to step S3. Thereafter, the data elements of the data frames DF2 to DF29 are subjected to the descrambling process in the same manner as the data elements of the data frames DF0 and DF1. The scramble values SC used to process the even number data frames (data frames DF0, DF2, . . . , DF30) are in the same order within the same read block RB. The scramble values SC used to process the odd number data frames (data frames DF1, DF3, . . . , DF31) are also in the same order within the same read block RB.

When the descrambling process of the last even number data frame DF30 is started (YES in step S13), the processing proceeds to step S14. In step S14, the processing in steps S3 to S5 is repeated. When all the data elements in the first column of the data frame DF30 have been subjected to the descrambling process, the value calculated by the 1-shift calculator 24 based on the scramble value SC used to process the last data element sD7 of the first column is stored into the even number register R2. Thus, the scramble value $S0*\gamma^7*\gamma^1$ (that is, $S0*\gamma^8$), which is used to process the first read block RB1, is then stored into the even number register R2. Also, the scramble value $S0*\gamma^{16}$, which is used to process the second read block RB2, is stored into the even number register R2. After the processing in step S14, the selection circuit 28 generates a selection signal for outputting the scramble value SC ($S0*\gamma^{216}$ in this example) of the 209-shift calculator 25 (step S16). Thereafter, the processing returns to step S3. The data elements of the second or subsequent column of the data frame DF31 are then subjected to the descrambling process in the same manner as the data elements of the second or subsequent column of the data frame DF0.

When the descrambling process of the last odd number data frame DF31 is started (YES in step S12), the processing returns to step S15. In step S15, the processing in steps S3 to S5 is repeated. When all the data elements of the first column of the data frame DF31 have been subjected to the descrambling process, the value calculated by the 1-shift calculator 24 based on the scramble value SC used to process the last data element dD115 of the first column is stored into the odd number register R3. Thus, the scramble value $S0*\gamma^{115}*\gamma^1$ (that is, $S0*\gamma^{116}$), which is used to process the first read block RB1, is then stored into the odd number register R3. The scramble value $S0*\gamma^{124}$), which is used to process the second read block RB2, is stored into the odd number register R3. The data elements of the second or subsequent column of the data frame DF31 are then subjected to the descrambling process in the same manner as the data elements of the data frame DF1. When the descramble data element dD1843 (=$sD1843\char`\^S0*\gamma^{1843}$) is generated from the scramble data element sD1843 of the last row of the last column of the data frame DF31 (YES in step S8), the descrambling process of the first read block RB1 (the r-th read block) is completed.

When the descrambling process of the first read block RB1 is completed, the descrambling process of the second read block RB2, or the processing in step S2 and subsequent steps shown in FIG. 20, is started. More specifically, when the first data element of the first row of the first column of each even number data frame included in the read block RB2 is provided to the EOR circuit 21, the selection circuit 28 provides the selector 27 with a selection signal for outputting the scramble value SC ($S0*\gamma^8$ in this example) of the even number register R2 to the selector 27. As a result, the EOR circuit 21 is provided with the scramble value $S0*\gamma^8$, which is obtained by shifting, by one byte, the scramble value used to process the data element sD7 of the last row of the first column of the last even number data frame DF30 included in the immediately preceding first read block RB1 in accordance with the generation polynomial $\Phi(x)$. In step S3, the EOR circuit 21 performs an exclusive OR operation on the scramble value $S0*\gamma^8$ of the even number register R2 and the first data element sD8 of the first row of the first column of the data frame DF0 included in the second read block RB2 to generate the descramble data element dD8 (that is, $sD8\char`\^S0*\gamma^8$). When the present data frame is an odd number data frame included in the second read block RB2, the odd number register R3 stores the scramble value $S0*\gamma^{116}$, which is used to process the first data element sD116 of the first row of the first column of the odd number data frame. Thus, the first data element sD116 is also descrambled correctly.

In the same manner as described above, the data elements of the second to thirteenth read blocks RB2 to RB13 are subsequently subjected to the descrambling process in accordance with the flowchart shown in FIGS. 20 and 21.

The descrambling process of the fourteenth read block RB14 will now be described focusing only on the data frames DF0 and DF1 shown in FIG. 17 as one example. In the first to thirteenth read blocks RB1 to RB13, the first to tenth columns form the data frame DF0, and the eleventh to nineteenth columns form the data frame DF1. In the fifteenth to twenty seventh read blocks RB15 to RB27, the first to ninth columns form the data frame DF0, and the tenth to nineteenth columns form the data frame DF0. However, in the fourteenth read block RB14, the tenth column is the last column of the data frame DF0 (even number data frame) as well as the first column of the data frame DF1 (odd number data frame). Also, the fifth row of the tenth column of the data frame DF1 includes the first data element sD0 in the scrambling process. When the last odd number data frame included in the thirteenth read block RB13 is descrambled, the odd number register R3 stores the scramble value $S0*\gamma^{212}$. Thus, when the first data element sD0 of the data frame DF1 included in the fourteenth read block RB14 is provided to the EOR circuit 21, the scramble value $S0*\gamma^{212}$ stored in the odd number register R3 is provided to the EOR circuit 21 in accordance with the flowchart shown in FIGS. 20 and 21. As a result, the descrambling process fails to be performed correctly.

Figure 22:
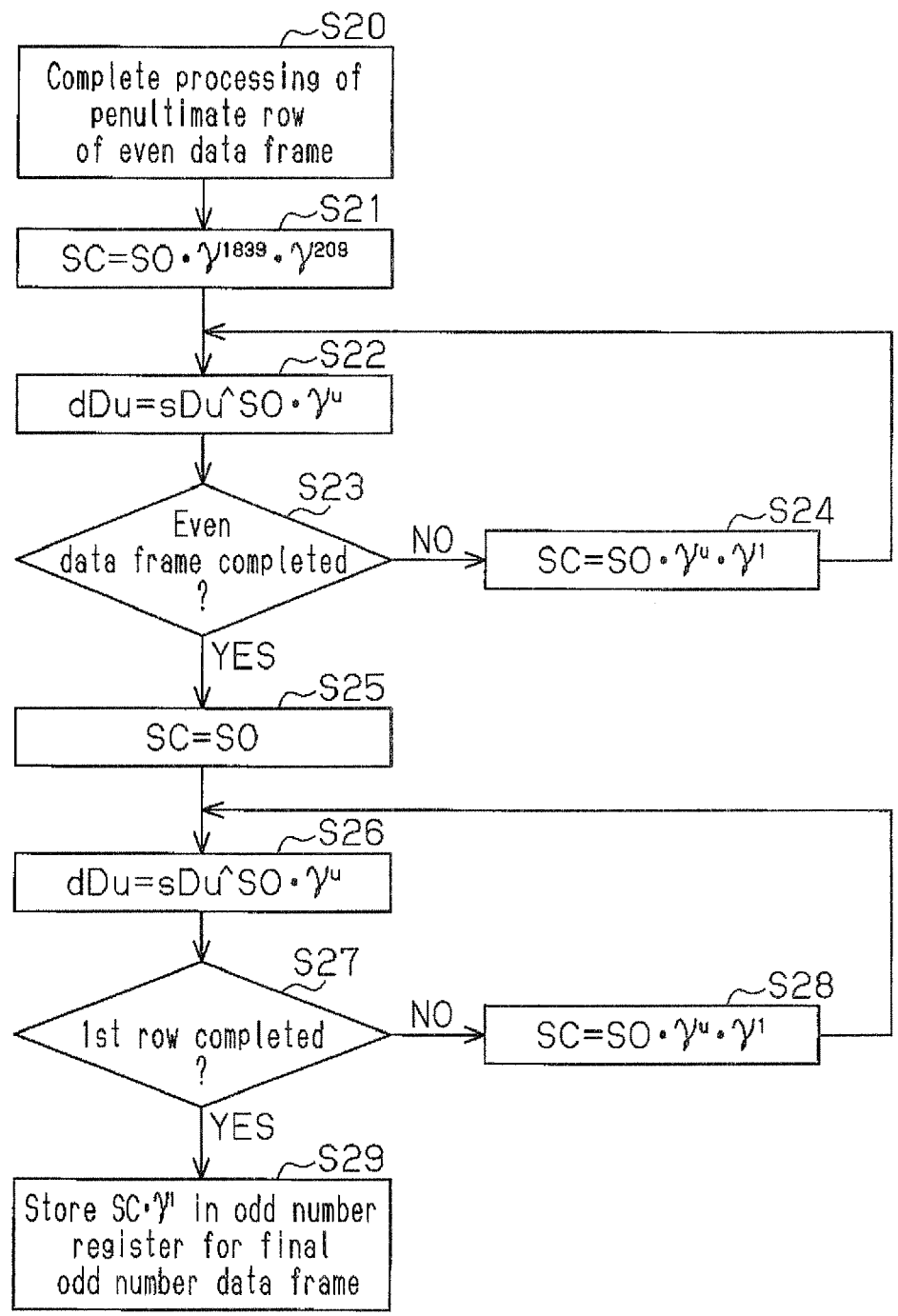
FIG. 22 is a flowchart illustrating the descrambling process.

To avoid such a failure, the descrambling process of the last column of each even number data frame and the first column of each odd number data frame included in the fourteenth read block RB14 is performed in accordance with a flowchart shown in FIG. 22.

In step S20 shown in FIG. 22, the descramble data element dD1839 (that is, sD1839^$S0*\gamma^{1839}$) is generated from the last data element sD1839 arranged in the column (ninth column) immediately preceding the last column of an even number data frame (for example, the data frame DF0) included in the fourteenth read block RB14. The processing then proceeds to step S21. In step S21, the selection circuit 28 provides the selector 27 with a selection signal for outputting the scramble value $S0*\gamma^{1839}*\gamma^{209}$ (that is, $S0*\gamma^{2048}$) to the FF circuit 23.

The EOR circuit 21 then performs an exclusive OR operation on the scramble data that is read next by the descramble circuit 20 (the scramble data element sD2048 in this example) and the scramble value SC (here, $S0*\gamma^{2048}$) of the 209-shift calculator 25 to generate the descramble data element dD2048 (step S22).

In step S23, the selection circuit 28 determines whether all the data elements of the last column of the even number data frame DF0 included in the fourteenth read block RB14 have been subjected to the descrambling process. When all the data elements of the even number data frame DF0 have not yet undergone the descrambling process (NO in step S23), the processing proceeds to step S24. Thereafter, the processing in steps S22 to S24 is repeated in the same manner as the processing in steps S3 to S5 shown in FIG. 20 until all the data elements of the even number data frame DF0 are subjected to the descrambling process. When the descramble data of the last data element sD2051 of the even number data frame DF0 is generated using the equation shown below (YES in step S23), the processing proceeds to step S25.

$$dD2051 = sD2051\char`\^S0 \cdot \gamma^{2053} \qquad \text{Equation 14}$$

In step S25, the selection circuit 28 provides the selector 27 with a selection signal for outputting the scramble value SC of the initial register R1, that is, the initial value S0, to the EOR circuit 21. The EOR circuit 21 then performs an exclusive OR operation on the first scramble data element sD0 of the odd number data frame (the data frame DF1 in this example) included in the fourteenth read block RB14 and the initial value S0 of the initial value register R1 to generate the descramble data element dD0 (that is, SD0^S0) (step S26).

In step S27, the selection circuit 28 determines whether all the data elements of the first column of the odd number data frame DF1 included in the fourteenth read block RB14 have been subjected to the descrambling process. When all the data elements have not yet undergone the descrambling process (NO in step S27), the processing proceeds to step S28. Thereafter, the processing in steps S26 to S28 is repeated in the same manner as the processing in steps S3 to S5 shown in FIG. 20 until all the data elements of the first column of the odd number data frame DF1 are subjected to the descrambling process. The descrambling process of the second or subsequent column of the odd number data frame DF1 is performed by repeating the processing in steps S3 to S7 shown in FIG. 20.

When the descramble data element dD4 of the scramble data element sD4 of the last row of the first column of the odd number data frame DF1 is generated (YES in step S27), the processing returns to step S29. In step S29, when the present odd number data frame DF is the last odd number data frame (data frame DF31), the value calculated by the 1-shift calculator 24 based on the scramble value SC used to generate the scramble data element sD4 is stored into the odd number register R3. More specifically, the scramble value $S0*\gamma^{4}*\gamma^{1}$ (that is, $S0*\gamma^{5}$) is stored into the odd number register R3 in the descrambling process of the last odd number data frame DF31 included in the fourteenth read block RB14.

The descrambling process of the fifteenth to twenty seventh read blocks RB15 to RB27 is performed in accordance with the flowchart shown in FIGS. 20 and 21. Through the descrambling process of the first to twenty seventh read blocks RB1 to RB27 performed in accordance with the flowchart shown in FIGS. 20 to 22, the descramble data element dDu is generated using the equation shown below.

$$
\begin{aligned}
dD0 &= sD0\char`\^S0 \\
dD1 &= sD1\char`\^S0 \cdot \gamma^{1} \\
dD2 &= sD2\char`\^S0 \cdot \gamma^{2} \\
&\vdots \\
dD2049 &= sD2049\char`\^S0 \cdot \gamma^{2049} \\
dD2050 &= sD2050\char`\^S0 \cdot \gamma^{2050} \\
dD2051 &= sD2051\char`\^S0 \cdot \gamma^{2051}
\end{aligned}
\qquad \text{Equation 15}
$$

Figure 23:
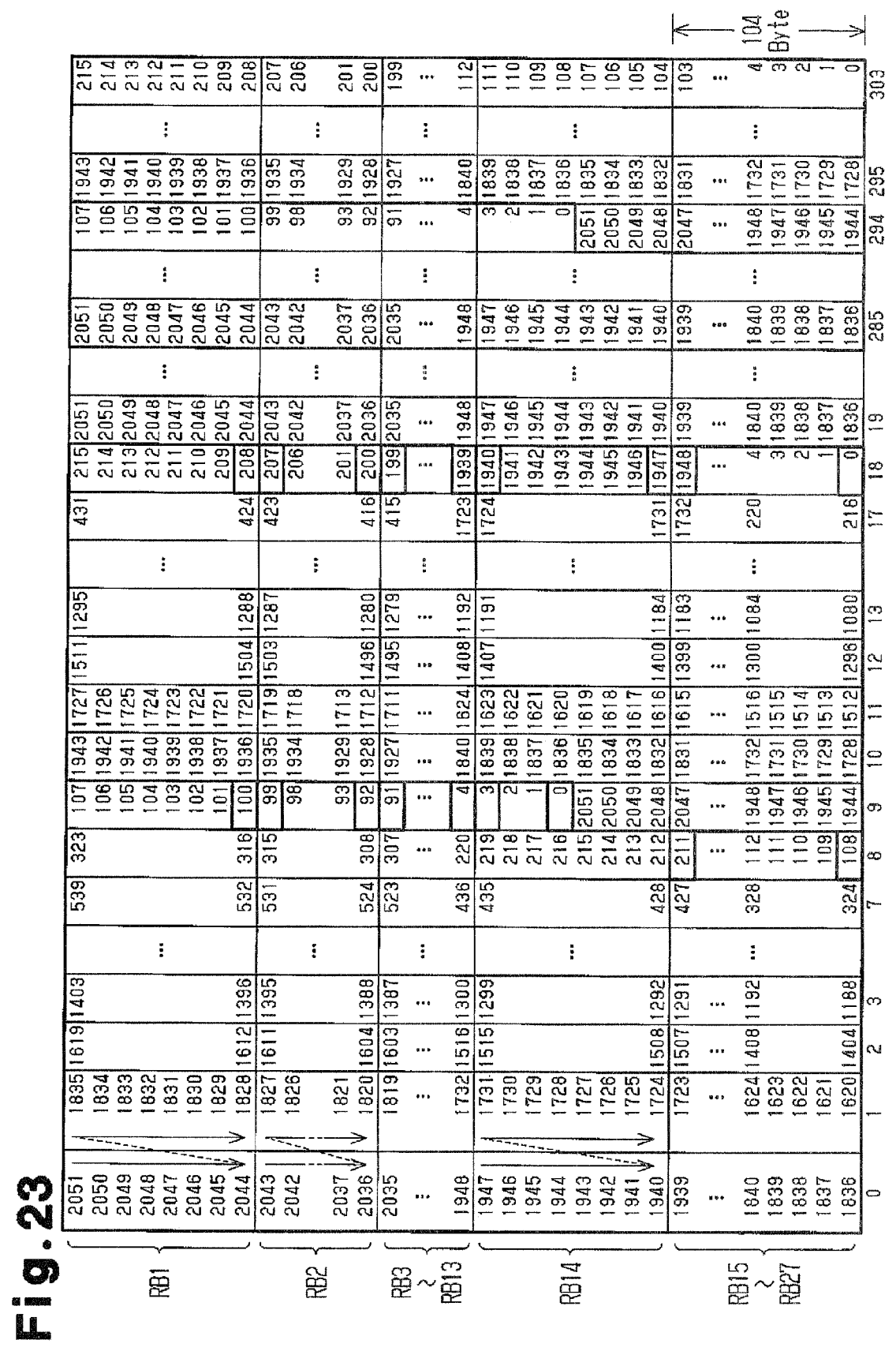

A method for generating an EDC syndrome with the EDC syndrome generation circuit 30 will now be described with reference to FIGS. 23 and 24. The descramble data elements dDu are input to the EDC syndrome generation circuit 30 by the descramble circuit 20 in the order in which the data elements are descrambled. In other words, the descramble data elements dDu of each of the read blocks RB1 to RB27 are provided to the EDC syndrome generation circuit 30. More specifically, the data elements of an even number data frame included in the first read block RB1 are input to the EDC syndrome generation circuit 30 in the order of the data elements dD0, dD1, . . . , dD7, dD216, dD217, . . . , dD223, dD432, . . . and dD1951. The byte data elements (descramble data elements) of an odd number data frame included in the first read block RB1 are input to the EDC syndrome generation circuit 30 in the order of the data elements dD108, dD109, . . . , dD115, dD324, dD325, . . . , dD331, dD540, . . . , and dD1843. FIG. 23 shows the byte data elements input to the EDC syndrome generation circuit 30, which are expressed using the degree n. The degree n is used to express the byte data elements in the polynomial $X^n$. Each byte data element is hereafter expressed using the polynomial $X^n$. The same calculation method is used for each even number data frame within the same read block RB. The calculation method for an even number data frame will be described focusing on the data frame DF0 as one example. Also, the same calculation method is used for each odd number data frame within the same read block RB. The calculation method for an odd number data frame will be described focusing only on the data frame DF1 as one example.

Figure 24:
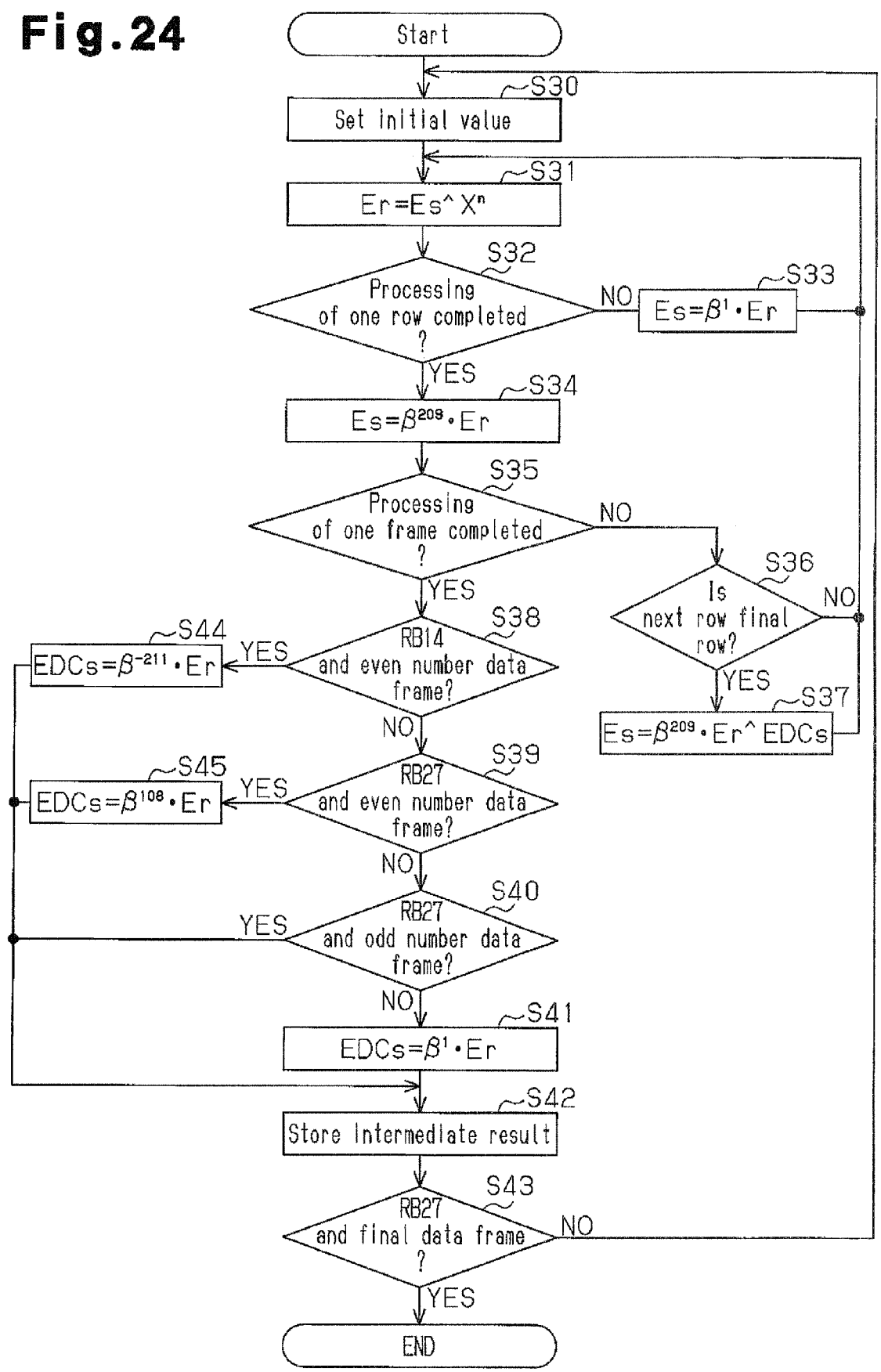
FIG. 24 is a flowchart illustrating an EDC calculation process according to the first embodiment.

At the initial setting in step S30 shown in FIG. 24, the selection circuit 39 provides the selector 32 with a selection signal for stopping the output of a shift calculated value Es from the selector 32. In step S31, the byte data element $X^n$ ($x^{2051}$ in this example) is provided from the descramble circuit 20 to the EOR circuit 31. The shift calculated value Es is not provided from the selector 32 to the EOR circuit 31. Thus, the EOR circuit 31 provides the byte data element $X^{2051}$ to the calculators 34 to 37 via the FF circuit 33 as the EDC calculated value E1(1).

In step S32, the selection circuit 39 determines whether the data elements in one column of the read block RB (for example, $X^{2051}$ to $X^{2044}$) have been subjected to the EDC calculation process based on the number of pulses of the clock signal CLK. When the data elements in one column of the read block RB have not yet undergone the EDC calculation process (NO in step S32), the processing proceeds to step S33. When the byte data element that is input to the EOR circuit 31 in step S31 is the data element $X^n$, the byte data element that is input to the EOR circuit 31 next is set as the data element $X^{n-1}$. In step S33, the byte data elements of the read block RB are input serially into the EOR circuit 31 in the column direction of the read block RB. The order in which the data elements are input coincides with the order in which the data elements are processed in the EDC appending process.

When the byte data element of the second or subsequent row of each column included in the read block RB is input to the EOR circuit 31, the selection circuit 39 provides the selector 32 with a selection signal for outputting the scramble value SC of the 1-shift calculator 24 to the EOR circuit 31 in step S33. As a result, the EOR circuit 31 is provided with the shift calculated value $\beta^1 *E1(1)$, which is obtained by weighting, using the first-degree vector $\beta^1$, the EDC calculated value E1(1) calculated when the byte data element $X^{2051}$ immediately preceding the present data element is input. The EOR circuit 31 performs an exclusive OR operation on the byte data element $X^{2050}$, which is input next, and the lower eight bits of the shift calculated value $\beta^1 *E1(1)$ of the 1-shift calculator 34 to calculate the new EDC calculated value E1(2). The lower eight bits of the shift calculated value Es with which the byte data element has undergone the exclusive OR operation are hereafter simply referred to as the "shift calculated value Es". In other words, the EOR circuit 31 performs an exclusive OR operation on the byte data element $X^n$ and the lower eight bits of the shift calculated value Es.

Thereafter, the processing in steps S31 to S33 is repeated until all the data elements in the column are subjected to the EDC calculation process. In the first embodiment, the byte data elements are input to the EOR circuit 31 in the order of the data elements $X^{2049}$, $X^{2048}$, . . . , $X^{2045}$, and $X^{2044}$. The EDC calculated values Er(c) are calculated in the order defined using the equation shown below.

$$E1(1) = X^{2051}$$  Equation 16

$$E1(2) = \beta^1 \cdot X^{2051 \wedge} X^{2050}$$

$$E1(3) = \beta^1 \cdot (\beta^1 \cdot X^{2051 \wedge} X^{2050})^{\wedge} X^{2049}$$
$$= \beta^2 \cdot X^{2051 \wedge} \beta^1 \cdot X^{2050 \wedge} X^{2049}$$
$$\vdots$$

$$E1(8) = \beta^7 \cdot X^{2051 \wedge} \beta^6 \cdot X^{2050 \wedge} \beta^5 \cdot X^{2049 \wedge} \beta^4 \cdot$$
$$X^{2048 \wedge} \beta^3 \cdot X^{2047 \wedge} \beta^2 \cdot X^{2046 \wedge} \beta^1 \cdot X^{2045 \wedge} X^{2044}$$

When the byte data element $X^{2044}$ of the last row of the first column of the data frame DF0 has been subjected to the EDC calculation process (YES in step S32), the processing proceeds to step S34. The selection circuit 39 then generates a selection signal for outputting the shift calculated value Es (that is, $\beta^{209} *E1(8)$) of the 209-shift calculator 35 to the EOR circuit 31 (step S34). In step S35, the selection circuit 39 determines whether all the data elements of the single data frame DF included in the first read block RB1 have been subjected to the EDC calculation process. When all the data elements of the single data frame DF have not yet undergone the EDC calculation process (NO in step S35), the processing proceeds to step S36.

Subsequently, the selection circuit 39 determines whether the next column is the last column of the data frame (for example, the next column is the tenth column of the data frame DF0 included in the first read block RB1). When the next column is not the last column (NO in step S36), the processing returns to step S31. Subsequently, the EOR circuit 31 performs an exclusive OR operation on the byte data element $X^{1835}$, which is input next, and the shift calculated value Es (that is, $\beta^{209} *E1(8)$) of the 209-shift calculator 35, and calculates the EDC calculated value E1(9) using the equation shown below.

$$E1(9) = \beta^{209} \cdot E1(8)^{\wedge} X^{1835}$$  Equation 17

$$= \beta^{216} \cdot X^{2051 \wedge} \beta^{215} \cdot X^{2050 \wedge} \beta^{214} \cdot X^{2049 \wedge} \beta^{213} \cdot$$
$$X^{2048 \wedge} \beta^{212} \cdot X^{2047 \wedge} \beta^{211} \cdot X^{2046 \wedge} \beta^{210} \cdot$$
$$X^{2045 \wedge} \beta^{209} \cdot X^{2044 \wedge} X^{1835}$$

In this manner, when the byte data element $X^n$ of the first row of each column of each data frame DF excluding the first column and the last column is input, the EDC calculated value Er(c) that is calculated when the immediately preceding byte data element $X^{+209}$ is input is weighted using the 209-degree vector $\beta^{209}$ by the 209-shift calculator 35. The EDC calculated value Er(c) is weighted using the 209-degree vector $\beta^{209}$ for the reason described below. For example, in the EDC appending process, the data element $X^{1835}$ of the first row of the second column of the data frame DF0 included in the first read block RB1 is processed at the timing delayed by the time corresponding to 209 bytes, which is calculated as (the total number of bytes of the data block DB in the column direction+1)−(the total number of bytes of the single read block RB in the column direction)=209, with respect to the timing at which the data element $X^{2044}$ of the last row of the first column is processed. Thus, when the EDC calculation process is performed using the same data processing order as the order used in the EDC appending process, the byte data elements $X^{2051}$ to $X^{2044}$ are weighted 209 times using the first-degree vector $\beta^1$ before the byte data element $X^{1835}$ is input. In the descrambling process of the first embodiment, the EDC calculated value Er(c), which is calculated when the data element of the last row of the immediately preceding column, is weighted using the vector $\beta$ corresponding to 209 bytes (vector $\beta^{209}$).

Thereafter, the processing in steps S31 to S36 is repeated in the same manner. Subsequently, when the last byte data element $X^{316}$ (corresponding to the seventy second clock) of the ninth column of the data frame DF0 included in the first read block RB1 has been subjected to the EDC calculation process, the next column (tenth column) is the last column (YES in step S36). In step S37, the selection circuit 39 provides the selector 32 with a selection signal for outputting the shift calculated value Es (that is, $\beta^{209}*Er(c)\char`^EDCs$) of the EOR circuit 38 to the EOR circuit 31. In this case, the intermediate value EDCs of the EDC syndrome that is provided from the EDC memory unit 40 to the EOR circuit 38 is 0. Thus, the shift calculated value Es output from the EOR circuit 38 is the value $\beta^{209}*E1(72)$. The EOR circuit 31 performs an exclusive OR operation on the byte data element $X^{107}$, which is input next, and the shift calculated value $\beta^{209}*E1(72)$, which is from the EOR circuit 38, to calculate the EDC calculated value E1(73) using the equation shown below.

$$E1(73) = \beta^{1944} \cdot X^{2051} \char`^ \beta^{1943} \cdot X^{2050} \char`^ \beta^{1942} \cdot \quad \text{Equation 18}$$
$$X^{2049} \char`^ \beta^{1941} \cdot X^{2048} \char`^ \beta^{1940} \cdot X^{2047} \char`^ \beta^{1939} \cdot X^{2046} \char`^ \beta^{1938} \cdot$$
$$X^{2045} \char`^ \beta^{1937} \cdot X^{2044} \char`^ \beta^{1728} \cdot X^{1835} \char`^ \beta^{1727} \cdot$$
$$X^{1834} \char`^ \beta^{1726} \cdot X^{1833} \char`^ \beta^{1725} \cdot X^{1832} \char`^ \beta^{1724} \cdot$$
$$X^{1831} \char`^ \beta^{1723} \cdot X^{1830} \char`^ \beta^{1722} \cdot X^{1829} \char`^ \beta^{1721} \cdot X^{1828}$$
$$\vdots$$
$$\char`^ \beta^{216} \cdot X^{323} \char`^ \beta^{215} \cdot X^{322} \char`^ \beta^{214} \cdot X^{321} \char`^ \beta^{213} \cdot X^{320} \char`^ \beta^{212} \cdot$$
$$X^{319} \char`^ \beta^{211} \cdot X^{318} \char`^ \beta^{210} \cdot X^{317} \char`^ \beta^{209} \cdot X^{316} \char`^ X^{107}$$

The processing in steps S31 to S33 is repeated. When the EDC calculated value E1(80) is calculated for the byte data element $X^{100}$ (eightieth clock) of the last row of the last column of the data frame DF0 included in the first read block RB1 (YES in step S35), the processing proceeds to step S38. The equation shown below indicates the EDC calculated value E1(80).

$$E1(80) = \beta^{1951} \cdot X^{2051} \char`^ \beta^{1950} \cdot X^{2050} \char`^ \beta^{1949} \cdot X^{2049} \char`^ \beta^{1948} \cdot \quad \text{Equation 19}$$
$$X^{2048} \char`^ \beta^{1947} \cdot X^{2047} \char`^ \beta^{1946} \cdot X^{2046} \char`^ \beta^{1945} \cdot X^{2045} \char`^ \beta^{1944} \cdot$$
$$X^{2044} \char`^ \beta^{1735} \cdot X^{1835} \char`^ \beta^{1734} \cdot X^{1834} \char`^ \beta^{1733} \cdot X^{1833} \char`^ \beta^{1732} \cdot$$
$$X^{1832} \char`^ \beta^{1731} \cdot X^{1831} \char`^ \beta^{1730} \cdot X^{1830} \char`^ \beta^{1729} \cdot X^{1829} \char`^ \beta^{1728} \cdot X^{1828}$$
$$\vdots$$
$$\char`^ \beta^7 \cdot X^{107} \char`^ \beta^6 \cdot X^{106} \char`^ \beta^5 \cdot X^{105} \char`^ \beta^4 \cdot X^{104} \char`^ \beta^3 \cdot X^{103} \char`^ \beta^2 \cdot$$
$$X^{102} \char`^ \beta^1 \cdot X^{101} \char`^ X^{100}$$

In step S38, the selection circuit 39 determines whether the present data frame is an even number data frame included in the fourteenth read block RB14. In step S39, the selection circuit 39 determines whether the present data frame is an even number data frame included in the twenty seventh read block RB27. In step S40, the selection circuit 39 determines whether the present data frame is an odd number data frame included in the twenty seventh read block RB27. In this example, the present data frame DF is the data frame DF0 (even number data frame) included in the first read block RB1 (No in all steps S38 to S40). Thus, the processing proceeds to step S41. In step S41, the EDC calculated value Er(c) (E1(80) in this example) calculated in step S34 is weighed using the vector $\beta^1$ by the 1-shift calculator 34 to calculate the intermediate value EDCc (that is, $\beta1*E1(80)$) of the EDC syndrome. The calculated intermediate value EDCs is then stored into the EDC memory unit 40 as an intermediate result of the EDC syndrome of the data frame DF0 (step S42).

In step S43, the selection circuit 39 determines whether the data frame DF that is presently being subjected to the EDC calculation process is the last data frame DF31 included in the last read block RB27. In this example, the present data frame DF is the data frame DF0 included in the first read block RB1. Thus, the processing proceeds to step S30. In step S30, the next data frame DF1 is subjected to the EDC calculation process.

The data frame DF1, which is an odd number data frame, is subjected to the EDC calculation process basically in the same manner as the data frame DF0 (even number data frame) described above. More specifically, the byte data element $X^{1943}$, which is input at the earliest timing into the data frame DF1, is used as the EDC calculated value E1(1) corresponding to the first clock. When the byte data element $X^n$ of the second or subsequent row of each column of the data frame DF1 is subsequently input to the EOR circuit 31, the EOR circuit 31 is provided with the shift calculated value Es that is obtained by weighting, using the first-degree vector $\beta^1$, the EDC calculated value Er(c) calculated when the immediately preceding byte data element $X^{n+1}$ is input. When the byte data element $X^n$ of the first row of each column of the data frame DF1 excluding the first column and the last column is input to the EOR circuit 31, the EOR circuit 31 is provided with the shift calculated value Es that is obtained by weighting, using the 209-degree vector $\beta^{209}$, the EDC calculated value Er(c) that is calculated when the immediately preceding byte data element $X^{n+209}$ is input. Through the EDC calculation process, the EDC calculated values Er(c) are calculated serially using the equation shown below.

$$E1(1) = X^{1943} \quad \text{Equation 20}$$
$$E1(2) = \beta^1 \cdot X^{1943} \char`^ X^{1942}$$
$$\vdots$$
$$E1(8) = \beta^7 \cdot X^{1943} \char`^ \beta^6 \cdot X^{1942} \char`^ \beta^5 \cdot X^{1941} \char`^$$
$$\beta^4 \cdot X^{1940} \char`^ \beta^3 \cdot X^{1939} \char`^ \beta^2 \cdot X^{1938} \char`^ \beta^1 \cdot X^{1937} \char`^ X^{1936}$$
$$E1(9) = \beta^{209} \cdot (\beta^7 \cdot X^{1943} \char`^ \beta^6 \cdot X^{1942} \char`^ \beta^5 \cdot X^{1941} \char`^ \beta^4 \cdot X^{1940} \char`^ \beta^3 \cdot$$
$$X^{1939} \char`^ \beta^2 \cdot X^{1938} \char`^ \beta^1 \cdot X^{1937} \char`^ X^{1936})\char`^ X^{1727}$$
$$= \beta^{216} \cdot X^{1943} \char`^ \beta^{215} \cdot X^{1942} \char`^ \beta^{214} \cdot X^{1941} \char`^ \beta^{213} \cdot$$
$$X^{1940} \char`^ \beta^{212} \cdot X^{1939} \char`^ \beta^{211} \cdot X^{1938} \char`^ \beta^{210} \cdot X^{1937} \char`^ \beta^{209} \cdot$$
$$X^{1936} \char`^ X^{1727}$$
$$\vdots$$

-continued $$E1(72) = \beta^{1735} \cdot X^{1943} \wedge \beta^{1734} \cdot X^{1942} \wedge \beta^{1733} \cdot X^{1941} \wedge \beta^{1732} \cdot X^{1940} \wedge$$
$$\beta^{1731} \cdot X^{1939} \wedge \beta^{1730} \cdot X^{1938} \wedge \beta^{1729} \cdot X^{1937} \wedge \beta^{1728} \cdot X^{1936} \wedge$$
$$\beta^{1519} \cdot X^{1727} \wedge \beta^{1518} \cdot X^{1726} \wedge \beta^{1517} \cdot X^{1725} \wedge \beta^{1516} \cdot X^{1724} \wedge$$
$$\beta^{1515} \cdot X^{1723} \wedge \beta^{1514} \cdot X^{1722} \wedge \beta^{1513} \cdot X^{1721} \wedge \beta^{1512} \cdot X^{1720}$$
$$\vdots$$
$$\wedge \beta^7 \cdot X^{215} \wedge \beta^6 \cdot X^{214} \wedge \beta^5 \cdot X^{213} \wedge$$
$$\beta^4 \cdot X^{212} \wedge \beta^3 \cdot X^{211} \wedge \beta^2 \cdot X^{210} \wedge \beta^1 \cdot X^{209} \wedge X^{208}$$

In this manner, the EDC calculated value E1(72) is calculated based on the byte data element $X^{208}$ (seventy second clock) of the last row of the last column of the data frame DF1 included in the first read block RB1. Subsequently, the EDC calculated value E1(72) is weighted using the vector $\beta^1$ by the 1-shift calculator 34 to calculate the intermediate value EDCs (that is, $\beta^1*E1(72)$) (step S41). The intermediate value $\beta^1*E1(72)$ is then stored into the EDC memory unit 40 as the intermediate value of the EDC syndrome of the data frame DF1 (step S42).

Thereafter, the processing in steps S30 to S43 is repeated in the same manner. The data frames DF2 to DF31 included in the first read block RB1 are subjected to the EDC calculation process.

The EDC calculation process of the data frame DF0 included in the second read block RB2 will now be described. At the timings corresponding to the first to seventy second clocks, the processing in steps S30 to S36 is repeated. Through the EDC calculation process, the EDC calculated values E2(1) to E2(72) are calculated using the equation shown below.

$$E2(1) = X^{2043} \quad \text{Equation 21}$$
$$E2(2) = \beta^1 \cdot X^{2043} \wedge X^{2042}$$
$$\vdots$$
$$E2(72) = \beta^{1735} \cdot X^{2043} \wedge \beta^{1734} \cdot X^{2042} \wedge$$
$$\beta^{1733} \cdot X^{2041} \wedge \beta^{1732} \cdot X^{2040} \wedge \beta^{1731} \cdot$$
$$X^{2039} \wedge \beta^{1730} \cdot X^{2038} \wedge \beta^{1729} \cdot X^{2037} \wedge \beta^{1728} \cdot X^{2036} \wedge$$
$$\beta^{1519} \cdot X^{1827} \wedge \beta^{1518} \cdot X^{1826} \wedge \beta^{1517} \cdot$$
$$X^{1825} \wedge \beta^{1516} \cdot X^{1824} \wedge \beta^{1515} \cdot X^{1823} \wedge \beta^{1514} \cdot X^{1822} \wedge \beta^{1513} \cdot$$
$$X^{1821} \wedge \beta^{1512} \cdot X^{1820}$$
$$\vdots$$
$$\wedge \beta^7 \cdot X^{315} \wedge \beta^6 \cdot X^{314} \wedge \beta^5 \cdot X^{313} \wedge \beta^4 \cdot X^{312} \wedge \beta^3 \cdot X^{311} \wedge \beta^2 \cdot$$
$$X^{310} \wedge \beta^1 \cdot X^{309} \wedge X^{308}$$

When the last byte data element $X^{308}$ of the column immediately preceding the last column (tenth column) or specifically the last byte data element $X^{308}$ of the ninth column has been subjected to the EDC calculation process, the selection circuit 39 provides the selector 32 with a selection signal for outputting the shift calculated value Es (that is, $\beta^{209}*E2(72)$ ˆEDCs) provided from the EOR circuit 38 to the EOR circuit 31 in step S37. The intermediate value EDCs that is provided from the EDC memory unit 40 to the EOR circuit 38 is the value $\beta^1*E1(80)$ stored into the EDC memory unit 40 in the immediately preceding EDC calculation process of the same data frame DF0 included in the first read block RB1. Thus, the EDC calculated value E2(73) of the data frame DF0 included in the second read block RB2, which corresponds to the seventy third clock, is calculated using the equation shown below.

$$E2(73) = \beta^{209} \cdot E2(72)\wedge \beta^1 \cdot E1(80)\wedge X^{99} \quad \text{Equation 22}$$
$$= \beta^{1944} \cdot X^{2043} \wedge \beta^{1943} \cdot X^{2042} \wedge \beta^{1942} \cdot$$
$$X^{2041} \wedge \beta^{1941} \cdot X^{2040} \wedge \beta^{1940} \cdot X^{2039} \wedge \beta^{1939} \cdot$$
$$X^{2038} \wedge \beta^{1938} \cdot X^{2037} \wedge \beta^{1937} \cdot X^{2036} \wedge \beta^{1728} \cdot$$
$$X^{1827} \wedge \beta^{1727} \cdot X^{1826} \wedge \beta^{1726} \cdot X^{1825} \wedge \beta^{1725} \cdot$$
$$X^{1824} \wedge \beta^{1724} \cdot X^{1823} \wedge \beta^{1723} \cdot X^{1822} \wedge \beta^{1722} \cdot$$
$$X^{1821} \wedge \beta^{1721} \cdot X^{1820}$$
$$\vdots$$
$$\wedge \beta^{216} \cdot X^{315} \wedge \beta^{215} \cdot X^{314} \wedge \beta^{214} \cdot X^{313} \wedge \beta^{213} \cdot$$
$$X^{312} \wedge \beta^{212} \cdot X^{311} \wedge \beta^{211} \cdot X^{310} \wedge \beta^{210} \cdot$$
$$X^{309} \wedge \beta^{209} \cdot X^{308} \wedge X^{99} \wedge \beta^1 \cdot E1(80)$$

Thereafter, the processing in steps S31 to S33 is repeated. When the EDC calculated value E2(80) is calculated for the byte data element $X^{92}$ (corresponding to the eightieth clock) of the last row of the last column of the data frame DF0 included in the second read block RB2, the processing proceeds to step S41. The equation shown below indicates the EDC calculated value E2(80).

$$E2(80) = \beta^{1951} \cdot X^{2043} \wedge \beta^{1950} \cdot X^{2042} \wedge \beta^{1949} \cdot X^{2041} \wedge \beta^{1948} \cdot \quad \text{Equation 23}$$
$$X^{2040} \wedge \beta^{1947} \cdot X^{2039} \wedge \beta^{1946} \cdot X^{2038} \wedge \beta^{1945} \cdot X^{2037} \wedge \beta^{1944} \cdot$$
$$X^{2036} \wedge \beta^{1735} \cdot X^{1827} \wedge \beta^{1734} \cdot X^{1826} \wedge \beta^{1733} \cdot X^{1825} \wedge \beta^{1732} \cdot$$
$$X^{1824} \wedge \beta^{1731} \cdot X^{1823} \wedge \beta^{1730} \cdot X^{1822} \wedge \beta^{1729} \cdot X^{1821} \wedge \beta^{1728} \cdot X^{1820}$$
$$\vdots$$
$$\wedge \beta^7 \cdot X^{99} \wedge \beta^6 \cdot X^{98} \wedge \beta^5 \cdot X^{97} \wedge \beta^4 \cdot X^{96} \wedge \beta^3 \cdot X^{95} \wedge \beta^2 \cdot$$
$$X^{94} \wedge \beta^1 \cdot X^{93} \wedge \beta^0 \cdot X^{92} \wedge \beta^8 \cdot E1(80)$$

In step S41, the intermediate value EDCs (that is, $\beta^1*E2(80)$) is calculated by weighting the EDC calculated value E2(80) using the vector $\beta^1$ by the 1-shift calculator 34. The intermediate value $\beta^1*E2(80)$ is then stored into the EDC memory unit 40 as the new intermediate result of the data frame DF0 (step S42).

Thereafter, the processing in steps S30 to S43 is repeated in the same manner. The data frames DF0 to DF31 included in the second to thirteenth read blocks RB2 to RB13 are subjected to the EDC calculation process.

The EDC calculated value E14(76) of the byte data element $X^0$ (byte data element that is input at the seventy sixth clock) with the lowest degree of the input polynomial in an even number data frame included in the fourteenth read block RB14 is calculated using the equation shown below (YES in step S38). The processing then proceeds to step S44.

$$E14(76) = \beta^{1947} \cdot X^{1947} \wedge \beta^{1946} \cdot X^{1946} \wedge \beta^{1945} \cdot X^{1945} \wedge \beta^{1944} \cdot \quad \text{Equation 24}$$
$$X^{1944} \wedge \beta^{1943} \cdot X^{1943} \wedge \beta^{1942} \cdot X^{1942} \wedge \beta^{1941} \cdot X^{1941} \wedge \beta^{1940} \cdot$$
$$X^{1940} \wedge \beta^{1731} \cdot X^{1731} \wedge \beta^{1730} \cdot X^{1730} \wedge \beta^{1729} \cdot X^{1729} \wedge \beta^{1728} \cdot$$
$$X^{1728} \wedge \beta^{1727} \cdot X^{1727} \wedge \beta^{1726} \cdot X^{1726} \wedge \beta^{1725} \cdot X^{1725} \wedge \beta^{1724} \cdot X^{1724}$$
$$\vdots$$

-continued
$$\wedge \beta^{219} \cdot X^{219 \wedge} \beta^{218} \cdot X^{218 \wedge} \beta^{217} \cdot X^{217 \wedge} \beta^{216} \cdot X^{216 \wedge} \beta^{215} \cdot$$
$$X^{215 \wedge} \beta^{214} \cdot X^{214 \wedge} \beta^{213} \cdot X^{213 \wedge} \beta^{212} \cdot X^{212 \wedge} \beta^{3} \cdot X^{3 \wedge} \beta^{2} \cdot$$
$$X^{2 \wedge} \beta^{1} \cdot X^{1 \wedge} X^{0 \wedge} \beta^{4} \cdot E13(80) \quad\quad\quad\quad\quad\quad\quad$$

The byte data element $X^0$ with the lowest degree of the input polynomial in the even number data frame DF0 is the data element that is input at the latest timing of all the data elements of the data frame DF0 when the data elements are subjected to the EDC calculation process in the same data processing order as the order used in the EDC appending process.

In step S44, the EDC calculated value E14(76) is weighted using the vector β (vector $\beta^{-211}$) corresponding to −211 bytes by the −211-shift calculator 37 to calculate the intermediate value EDCs (that is, $\beta^{-211}$*E14(76)) of the EDC syndrome (first correction calculation). The intermediate value $\beta^{-211}$*E14(76) is then stored into the EDC memory unit 40 as the new intermediate result of the new data frame DF0 (step S42).

Thereafter, the processing in steps S30 to S44 is repeated in the same manner. The data frames DF0 to DF31 included in the fourteenth to twenty sixth read blocks RB14 to RB26 are subjected to the EDC calculation process.

The EDC calculated value E27(72) of the byte data element $X^{108}$ (corresponding to the seventy second clock) of the last row of the last column of an even number data frame (for example, the data frame DF0) included in the twenty seventh read block RB27 is calculated using the equation shown below (YES in step S39). The processing then proceeds to step S45.

$$E27(72) = \beta^{1735} \cdot X^{1843 \wedge} \beta^{1734} \cdot X^{1842 \wedge} \beta^{1733} \cdot X^{1841 \wedge} \beta^{1732} \cdot \quad \text{Equation 25}$$
$$X^{1840 \wedge} \beta^{1731} \cdot X^{1839 \wedge} \beta^{1730} \cdot X^{1838 \wedge} \beta^{1729} \cdot X^{1837 \wedge} \beta^{1728} \cdot$$
$$X^{1836 \wedge} \beta^{1519} \cdot X^{1627 \wedge} \beta^{1518} \cdot X^{1626 \wedge} \beta^{1517} \cdot X^{1625 \wedge} \beta^{1516} \cdot$$
$$X^{1624 \wedge} \beta^{1515} \cdot X^{1623 \wedge} \beta^{1514} \cdot X^{1622 \wedge} \beta^{1513} \cdot X^{1621 \wedge} \beta^{1512} \cdot X^{1620}$$
$$\vdots$$
$$\wedge \beta^{223} \cdot X^{331 \wedge} \beta^{222} \cdot X^{330 \wedge} \beta^{221} \cdot X^{329 \wedge} \beta^{220} \cdot X^{328 \wedge} \beta^{219} \cdot$$
$$X^{327 \wedge} \beta^{218} \cdot X^{326 \wedge} \beta^{217} \cdot X^{325 \wedge} \beta^{216} \cdot X^{324 \wedge} \beta^{7} \cdot$$
$$X^{115 \wedge} \beta^{6} \cdot X^{114 \wedge} \beta^{5} \cdot X^{113 \wedge} \beta^{4} \cdot X^{112 \wedge} \beta^{3} \cdot X^{111 \wedge} \beta^{2} \cdot$$
$$X^{110 \wedge} \beta^{1} \cdot X^{109 \wedge} X^{108 \wedge} \beta^{8} \cdot E26(72)$$

In step S45, the EDC calculated value S27(72) is weighted using the vector $\beta^1$ (vector $\beta^{108}$) corresponding to 108 bytes by the 108-shift calculator 36. As a result, the final EDC syndrome EDCS (that is, $\beta^{108}$*E27(72)) of the data frame DF0 is calculated using the equation shown below (second correction calculation).

$$EDCS = \beta^{108} \times E27(72) \quad\quad \text{Equation 26}$$
$$= \beta^{2051} \cdot X^{2051 \wedge} \beta^{2050} \cdot X^{2050 \wedge} \beta^{2049} \cdot$$
$$X^{2049 \wedge} \beta^{2048} \cdot X^{2048 \wedge} \beta^{2047} \cdot X^{2047 \wedge} \beta^{2046} \cdot$$
$$X^{2046 \wedge} \beta^{2045} \cdot X^{2045 \wedge} \beta^{2044} \cdot X^{2044 \wedge} \beta^{2043} \cdot$$
$$X^{2043 \wedge} \beta^{2042} \cdot X^{2042 \wedge} \beta^{2041} \cdot X^{2041 \wedge} \beta^{2040} \cdot$$

-continued
$$X^{2040 \wedge} \beta^{2039} \cdot X^{2939 \wedge} \beta^{2038} \cdot X^{2038 \wedge} \beta^{2037} \cdot$$
$$X^{2037 \wedge} \beta^{2036} \cdot X^{2036}$$
$$\vdots$$
$$\wedge \beta^{11} \cdot X^{11 \wedge} \beta^{10} \cdot X^{10 \wedge} \beta^{9} \cdot X^{9 \wedge} \beta^{8} \cdot X^{8 \wedge} \beta^{7} \cdot$$
$$X^{7 \wedge} \beta^{6} \cdot X^{6 \wedge} \beta^{5} \cdot X^{5 \wedge} \beta^{4} \cdot X^{4 \wedge} \beta^{3} \cdot X^{3 \wedge} \beta^{2} \cdot$$
$$X^{2 \wedge} \beta^{1} \cdot X^{1 \wedge} X^{0}$$

The EDC syndrome $\beta^{108}$*E27(72) is then stored into the EDC memory unit 40 (step S42).

The first correction calculation (step S44) and the second correction calculation (step S45) will now be described. The second correction calculation will be described first.

In the first embodiment, the byte data element that is input at the latest timing of all the data elements of the even number data frame included in the twenty seventh read block RB27 is the byte data element $X^{108}$. The byte data element $X^{108}$ is input earlier by the time corresponding to 108 bytes than the byte data element $X^0$ (last byte data element), which is input at the latest timing in the EDC calculation process performed using the same data processing order as the order used in the EDC appending process. In other words, the byte data element $X^{108}$ is weighted 108 times using the first-degree vector $\beta^1$ before the last byte data element $X^0$ is input when the EDC calculation is performed using the same data processing order as the order used in the EDC appending process. However, the byte data element $X^{108}$ is input at the latest timing of all the data elements of an even number data frame in the first embodiment. Thus, the EDC calculated value E27(72), which is calculated when the byte data element $X^{108}$ is input, is not weighted using the vector $\beta^1$, which is used to weight the byte data element $X^{108}$. In the first embodiment, the EDC calculated value E26(72), which is calculated when the data element $X^{108}$ of the last row of the last column of each even number data frame included in the twenty seventh read block RB27 is weighted using the 108-byte vector β (vector $\beta^{108}$).

The first correction calculation will now be described. In the first embodiment, the EDC calculated value E14(76), which is calculated when the last byte data element $X^0$ of the even number data frame included in the fourteenth read block RB14 is input, is calculated using the equation shown below.

$$E14(76) = \beta^{2051} \cdot X^{2051 \wedge} \beta^{2050} \cdot X^{2050 \wedge} \beta^{2049} \cdot X^{2049 \wedge} \beta^{2048} \cdot \quad \text{Equation 27}$$
$$X^{2048 \wedge} \beta^{2047} \cdot X^{2047 \wedge} \beta^{2046} \cdot X^{2046 \wedge} \beta^{2045} \cdot X^{2045 \wedge} \beta^{2044} \cdot$$
$$X^{2044 \wedge} \beta^{2043} \cdot X^{2043 \wedge} \beta^{2042} \cdot X^{2042 \wedge} \beta^{2041} \cdot$$
$$X^{2041 \wedge} \beta^{2040} \cdot X^{2040 \wedge} \beta^{2039} \cdot X^{2039 \wedge} \beta^{2038} \cdot X^{2038 \wedge} \beta^{2037} \cdot$$
$$X^{2037 \wedge} \beta^{2036} \cdot X^{2036}$$
$$\vdots$$
$$\wedge \beta^{1947} \cdot X^{1947 \wedge} \beta^{1946} \cdot X^{1946 \wedge} \beta^{1945} \cdot X^{1945 \wedge} \beta^{1944} \cdot$$
$$X^{1944 \wedge} \beta^{1943} \cdot X^{1943 \wedge} \beta^{1942} \cdot X^{1942 \wedge} \beta^{1941} \cdot X^{1941 \wedge} \beta^{1940} \cdot$$
$$X^{1940 \wedge} \beta^{1835} \cdot X^{1835 \wedge} \beta^{1834} \cdot X^{1834 \wedge} \beta^{1833} \cdot$$
$$X^{1833 \wedge} \beta^{1832} \cdot X^{1832 \wedge} \beta^{1831} \cdot X^{1831 \wedge} \beta^{1830} \cdot X^{1830 \wedge} \beta^{1829} \cdot$$
$$X^{1829 \wedge} \beta^{1828} \cdot X^{1828}$$
$$\vdots$$
$$\wedge \beta^{11} \cdot X^{11 \wedge} \beta^{10} \cdot X^{10 \wedge} \beta^{9} \cdot X^{9 \wedge} \beta^{8} \cdot X^{8 \wedge} \beta^{7} \cdot$$
$$X^{7 \wedge} \beta^{6} \cdot X^{6 \wedge} \beta^{5} \cdot X^{5 \wedge} \beta^{4} \cdot X^{4 \wedge} \beta^{3} \cdot X^{3 \wedge} \beta^{2} \cdot X^{2 \wedge} \beta^{1} \cdot X^{1 \wedge} X^{0}$$

As the above equation shows, the byte data element that is input before the EDC calculated value E14(76) is calculated is weighted using the vector β with a predetermined degree. For example, the byte data element $X^{2051}$ that is input at the earliest timing of all the data elements of an even number data frame is weighted using the 2051-degree vector $β^{2051}$. However, in the first embodiment, the EDC calculated value E14 (76) is weighted 103 times using the first-degree vector $β^1$ in the EDC calculation process of the fifteenth to twenty seventh read blocks RB15 to RB27, which follow the fourteenth read block RB14. More specifically, the EDC calculated value E14(76) is weighted using the vector $β^1$ the number of times calculated as (the total number of bytes of the remaining read blocks RB in the column direction−1). Further, the EDC calculated value E14(76) is weighted using the 108-degree vector $β^{108}$ through the second correction calculation described above. As a result, when the fifteenth to twenty seventh read blocks RB15 to RB27 have been subjected to the EDC calculation and the second correction calculation, the byte data element that is input before the EDC calculated value E14(76) is calculated is weighted using the vector $β^1$ 211 times more than when the EDC calculation is performed using the same processing order as the order used in the EDC appending process. Thus, in the first embodiment, the EDC calculated value E14(76), which is calculated when the last data element $X^0$ (last descramble data element) of each even number data frame included in the fourteenth read block RB14 is input, is weighted using the vector β corresponding to −211 bytes (vector $β^{-211}$).

The EDC syndrome of an odd number data frame is generated in the same manner as in the EDC calculation process of the data frame DF1 included in the first read block RB1 described above using the equation (1), without requiring any special correction calculations (first and second correction calculations) performed in steps S44 and S45. Thus, when the present data frame is the data frame DF1 (odd number data frame), the EDC calculated value E27(80) of the byte data element $X^0$ of the last row of the last column of the twenty seventh read block RB27 is calculated (YES in step S40). The EDC calculated value E27(80) is then directly stored into the EDC memory unit 40 as the EDC syndrome (step S42).

Thereafter, the processing in steps S30 to S45 is repeated in the same manner. As a result, the final EDC syndrome EDCS of each of the data frames DF0 to DF31 is generated. The EDC syndrome EDCS is then stored into the EDC memory unit 40. When the last EDC syndrome EDCS of each of all the data frames DF0 to DF31 is stored into the syndrome storage buffer (M7 or M8) of the EDC memory unit 40, the buffer memory M7 and the buffer memory M8 are switched between the syndrome storage buffer and the syndrome output buffer. The EDC syndromes EDCS of all the data frames DF0 to DF31 is then stored into the output buffer memory that has been switched from the storage buffer. The EDC syndromes EDCS of all the data frames DF0 to DF31 stored in the output buffer memory of the EDC memory unit 40 are transferred to the external buffer memory 6.

When the descramble data elements, the LDC syndromes, the BIS syndromes, and the EDC syndromes of the single parity-appended block PB are stored into the external buffer memory 6, the error correction circuit 50 reads the LDC syndromes and the BIS syndromes from the external buffer memory 6. The correction circuit 51 included in the error correction circuit 50 calculates an error position polynomial and an error value polynomial using a euclidian algorithm based on the read LDC syndromes and the read BIS syndromes. Subsequently, the correction circuit 51 calculates the error position and the error value based on the error position polynomial and the error value polynomial. The error correction circuit 51 then subjects the data frame DF that has been subjected to the descrambling process and stored into the external buffer memory 6 to error correction. The error correction circuit 51 also outputs the calculated error position and error value to the EDC correction circuit 52.

The EDC correction circuit 52 then corrects the EDC syndrome that has been transferred from the external buffer memory 6 to the correction memory unit 53 based on the error position and the error value provided from the correction circuit 51. The EDC checking circuit 54 then reads the corrected EDC syndrome from the correction memory unit 53, and checks whether the error correction has been completed normally. When the EDC checking circuit 54 determines that the error correction has been completed successfully, the controller 10 outputs the corrected data stored in the external buffer memory 6 to the computer 2 via the interface circuit 60 in accordance with an instruction provided from the microprocessor 8.

The error correction device of the first embodiment has the advantages described below.

(1) The LDC syndrome generation circuit 13, the BIS syndrome generation circuit 16, and the descramble circuit 20 access the internal memory unit 12 to generate an LDC syndrome, a BIS syndrome, and a descramble data element dDu and store the LDC syndrome, the BIS syndrome, and the descramble data element dDu into the external buffer memory 6. This structure reduces the amount of access to the external buffer memory 6 as compared with the controller 110 shown in FIG. 8.

Figure 8:
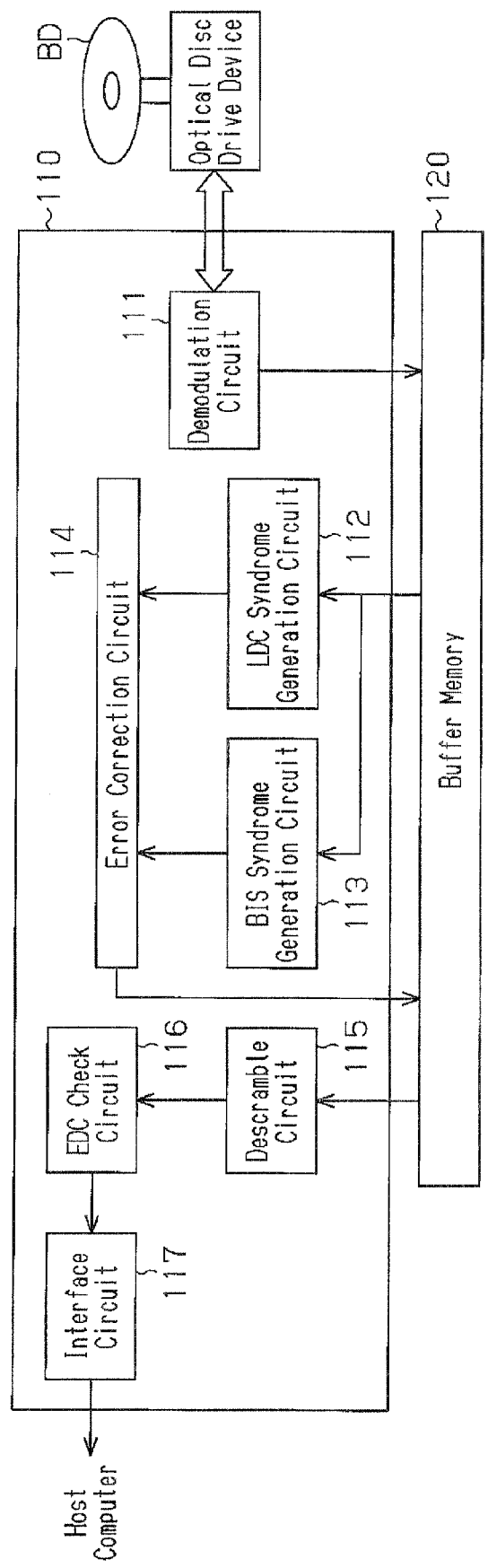
FIG. 8 is a schematic block diagram showing a conventional optical disc controller.
Figures 9, 10:
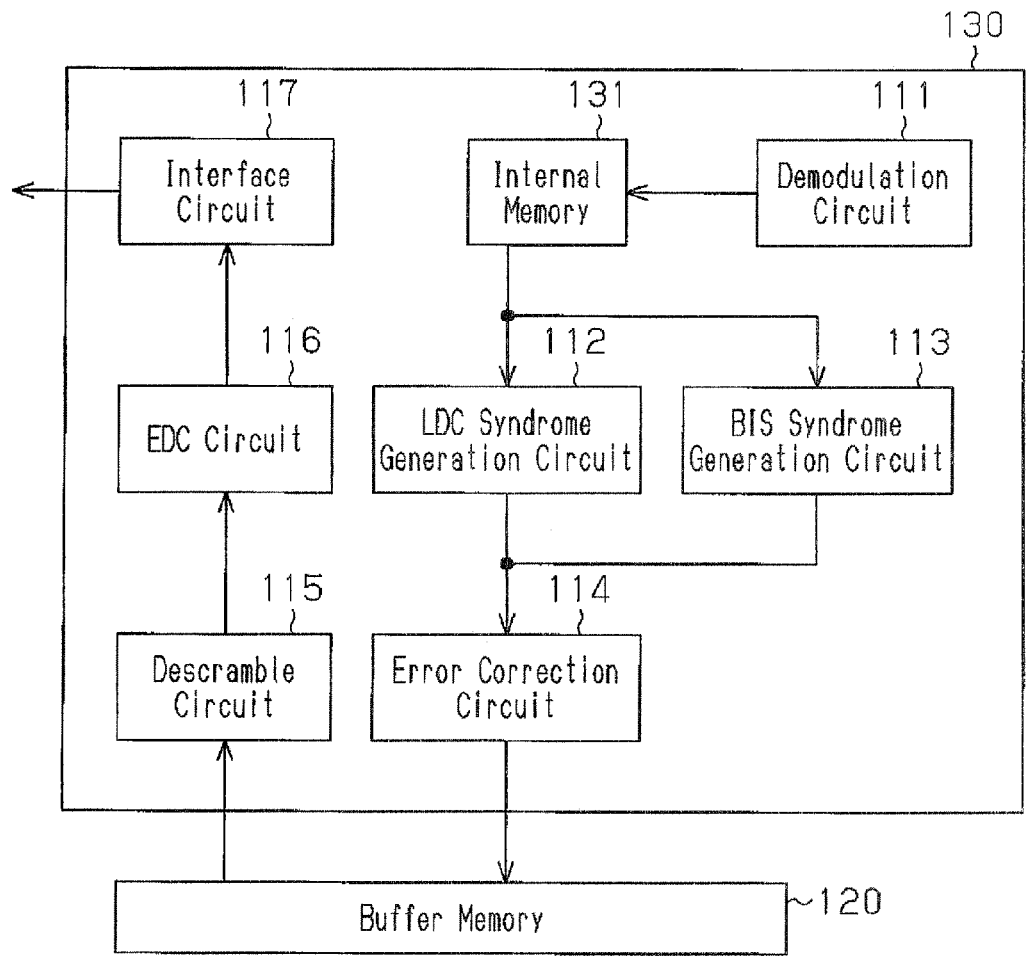
FIG. 9 is a diagram describing a conventional descrambling process.
FIG. 10 is a schematic block diagram showing another conventional optical disc controller.

The controller 110 in FIG. 8 involves accesses (a) to (e) below to the buffer memory 120. (a) The demodulation circuit 111 accesses the buffer memory 120 to store a cluster ECCc. (b) The LDC syndrome generation circuit 112 accesses the buffer memory 120 to read a cluster LDCc. (c) The BIS syndrome generation circuit 113 accesses the buffer memory 120 to read a cluster BISc. (d) The error correction circuit accesses the buffer memory 120 to subject the cluster LDCs to error correction. (e) The descramble circuit 115 accesses the buffer memory 120 to read the cluster LDCc after the error correction. These accesses to the buffer memory 120 correspond to the data amount of substantially three clusters ECCc (each having 76880 bytes) (219299 bytes in total).

The controller 10 of the first embodiment involves seven accesses to the external buffer memory 6, that is, (A) storing a descramble data element dDu (65536 bytes), (B) storing an LDC syndrome (9728 bytes), (C) storing a BIS syndrome (1488 bytes), (D) storing an EDC syndrome (128 bytes), (E) reading the LDC syndrome, (F) reading the BIS syndrome, and (G) reading the descramble data after error correction. Although the controller 10 of the first embodiment involves more different accesses, the data amount required per access is small. These accesses to the external buffer memory 6 correspond to the data amount of substantially two clusters ECCc (152272 bytes in total), which is far smaller than the amount data of the accesses required by the conventional controller 110. The smaller data amount of required accesses reduces the bandwidth use of the external buffer memory 6. This enables the controller 10 to increase the data transfer speed. Even when the external buffer memory 6 is formed using an inexpensive large-capacity low-speed memory, the controller 10 enables the data transfer to be performed at a desired speed.

Further, the LDC syndrome generation circuit 13 and the descramble circuit 20 may access the internal memory (internal memory unit 12) at a high speed. Thus, even when an LDC cluster is read while being subjected to the first and second de-interleaving processes, the data is read efficiently at a high speed from the internal memory unit 12. This shortens the time required by the error correction as compared with the controller 110.

(2) The internal memory unit 12 stores a plurality of divisional clusters DECC, into which a single cluster ECCc is divided. Also, to correctly descramble data of each data block DB of the divisional cluster DECC, the descramble circuit 20 includes the 1-shift calculator 24 and the 209-shift calculator 25. This structure enables the buffer memories M1 and M2 of the internal memory unit 12 to have a memory capacity that may store a single divisional cluster DECC (2480 bytes). This may eliminate the need to use an internal large-capacity (76880 bytes) memory, which is required in the controller 130 shown in FIG. 10. This structure prevents the circuit scale from being increased by an increased memory capacity of the internal memory unit.

The LDC syndrome generation circuit 13 generates an LDC syndrome and the BIS syndrome generation circuit 16 generates a BIS syndrome while the descrambling process is being performed by the descramble circuit 20. This shortens the time required by the error correction. This structure reduces the amount of access to the external buffer memory 6 while preventing the circuit scale from increasing.

(3) To correctly subject the input data of each divisional ECC cluster DECC to the EDC calculation process (or to weight the input data), the EDC syndrome generation circuit 30 includes the 1-shift calculator 34, the 209-shift calculator 35, the 108-shift calculator 36, and the EOR circuit 38. This structure enables the EDC syndrome generation circuit 30 to generate an EDC syndrome EDCS based on a descramble data element dDu, which is input directly from the descramble circuit 20. As a result, the EDC syndrome generation circuit 30 generates an EDC syndrome in parallel with when the LDC syndrome generation circuit 13 generates an LDC syndrome and the BIS syndrome generation circuit 16 generates a BIS syndrome. This shortens the time required by the error correction.

(4) The descramble circuit 20 includes the even number register R2 for storing the scramble value SC of the first scramble data element of the first row of the first column of each even number data frame included in the read block. The descramble circuit 20 also includes the odd number register R3 for storing the scramble value SC of the first scramble data element of the first row of the first column of each odd number data frame included in the read block. This may eliminate the need to calculate and store, in advance, scramble values of the first scramble data elements of each even number data frame and each odd number data frame included in the read block.

(5) The descramble circuit 20 includes the 108-shift calculator 26. The scramble value $S0*\gamma^{108}$ of the first scramble data element of the first row of the first column of each odd number data frame included in the first read block RB1 is generated simply by inputting the initial value S0 into the 108-shift calculator 26.

(6) The controller 10 includes the EDC memory unit 40 for storing the intermediate value EDCs of the EDC syndrome of each data frame, which is generated by the EDC syndrome generation circuit 30. The EDC syndrome generation circuit 30 generates an EDC syndrome of each data frame using the EDC memory unit 40. This structure may eliminate the need for a plurality of syndrome generation circuits to generate an EDC syndrome of each data frame, and prevents the circuit scale from increasing. Further, each buffer memory of the EDC memory unit 40 has a memory capacity that may store an EDC syndrome (128 bytes) of each data frame, which is smaller than the capacity of the conventional internal memory (76880 bytes). This structure prevents the circuit scale from increasing.

(7) The controller 10 includes the LDC memory unit 14 for storing an intermediate value of the LDC syndrome of each column, which is generated by the LDC syndrome generation circuit 13. The LDC syndrome generation circuit 13 generates an LDC syndrome of each column using the LDC memory unit 14. This structure may eliminate the need for a plurality of LDC syndrome generation circuits to generate an LDC syndrome of each column, and prevents the circuit scale from increasing. Further, each buffer memory of the LDC memory unit 14 has a memory capacity that may store an LDC syndrome (9728 bytes) of each column, which is smaller than the memory capacity (76880 bytes) of the conventional internal memory. This prevents the circuit scale from increasing.

(8) The controller 10 includes the BIS memory unit 15 for storing all clusters BISc. The BIS syndrome generation circuit 16 reads all clusters BISc from the BIS memory unit 15 in a continuous manner, and generates BIS syndromes based on the read clusters BISc. The BIS syndrome generation circuit 16 generates the BIS syndromes efficiently. Each buffer memory of the BIS memory unit 15 has a memory capacity that may store all BIS clusters (1488 bytes), which is smaller than the capacity of the conventional internal memory (76880 bytes). This prevents the circuit scale from increasing.

(9) Each of the internal memory unit 12, the LDC memory unit 14, the BIS memory unit 15, and the EDC memory unit 40 is formed by two buffer memories. When, for example, one buffer memory of the internal memory unit 12 is used as the data storage buffer, the other buffer memory of the internal memory unit 12 is used as the access buffer. This structure enables data to be stored into the demodulation circuit 11 and data to be read from the internal memory unit 12 in parallel, and enables the disc data to be read from the BD 4 in a continuous manner. In the same manner, this structure enables the intermediate values of the LDC syndromes to be transferred from the LDC syndrome generation circuit 13 and stored in a continuous manner. In the same manner, this structure also enables the clusters BISc to be read from the internal memory unit 12 in a continuous manner. In the same manner, this structure also enables the intermediate values EDCc of the EDC syndromes to be transferred from the EDC syndrome generation circuit 30 and stored in a continuous manner.

In particular, the structure of the internal memory unit 12, which includes the two buffer memories M1 and M2, effectively prevents the circuit scale from increasing. To read a plurality of clusters ECCc from the BD in a continuous manner, the controller 130 shown in FIG. 10 would be required to use two internal memories 131 with a large capacity (76880 bytes). However, the internal memory unit 12 of the first embodiment has a total memory capacity of 4960 bytes. This structure effectively prevents the circuit scale from increasing.

(10) The EDC syndromes EDCS, which are generated by the EDC syndrome generation circuit 30, are all stored into the correction memory unit 53 before corrected by the EDC correction circuit 52. All the EDC syndromes EDCS stored in the correction memory unit 53 are corrected in a continuous manner. This structure improves the processing efficiency.

An optical disc controller 10 (error correction device) according to a second embodiment will now be described with reference to FIGS. 32 to 35. The optical disc controller 10 of the second embodiment includes a descramble circuit 70 and an EDC syndrome generation circuit 80 instead of the descramble circuit 20 and the EDC syndrome generation circuit 30 of the first embodiment.

Figure 32:
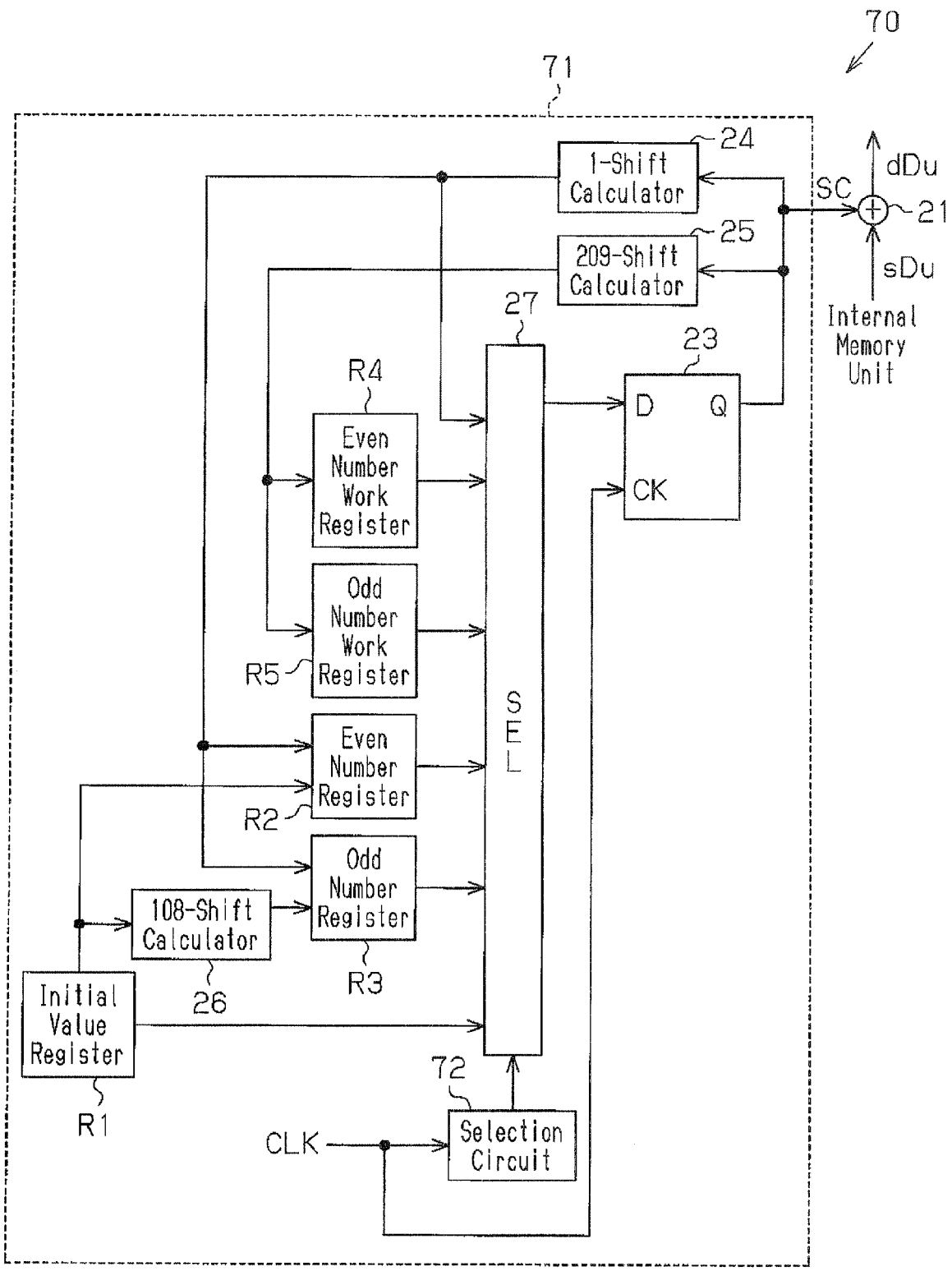
FIG. 32 is a schematic block diagram partially showing a descramble circuit according to a second embodiment.

The circuit structure of the descramble circuit 70 will now be described with reference to FIG. 32. A scrambling-value generation circuit 71 included in the descramble circuit 70 of the second embodiment includes an even-numbered work register R4 and an odd-numbered work register R5, which are not included in the scrambling-value generation circuit 22 of the descramble circuit 20 of the first embodiment.

The even-numbered work register R4 stores a calculated value (scramble value) that is calculated by a 209-shift calculator 25 based on a scramble value SC used to process data of a last row of each column of a last even number data frame DF30 included in a read block RB. The odd-numbered work register R5 stores a calculated value (scramble value) that is calculated by the 209-shift calculator 25 based on a scramble value SC used to process data of a last row of each column of a last odd number data frame DF31 included in a read block RB. Each of the odd-numbered work register R4 and the even-numbered work register R5 provides the scramble value SC, which is stored in the register, to a selector 27.

The selector 27 is provided with a selection signal from a selection circuit 72. Based on the selection signal provided from the selection circuit 72, the selector 27 provides an FF circuit 23 with one of scramble values SC that are provided from a 1-shift calculator 24 and registers R1 to R5. The selection circuit 28 generates a selection signal according to the number of pulses of a clock signal CLK, and provides the selection signal to the selector 27. When, for example, the EOR circuit 21 is provided with data of the first row of the second or subsequent column of each even number data frame, the selection circuit 72 generates a selection signal for outputting the scramble value SC of the even-numbered work register R4 to the EOR circuit 21. When the EOR circuit 21 is provided with data of the first row of the second or subsequent column of each odd number data frame, the selection circuit 72 generates a selection signal for outputting the scramble value SC of the odd-numbered work register R4 to the EOR circuit 21.

Figure 33:
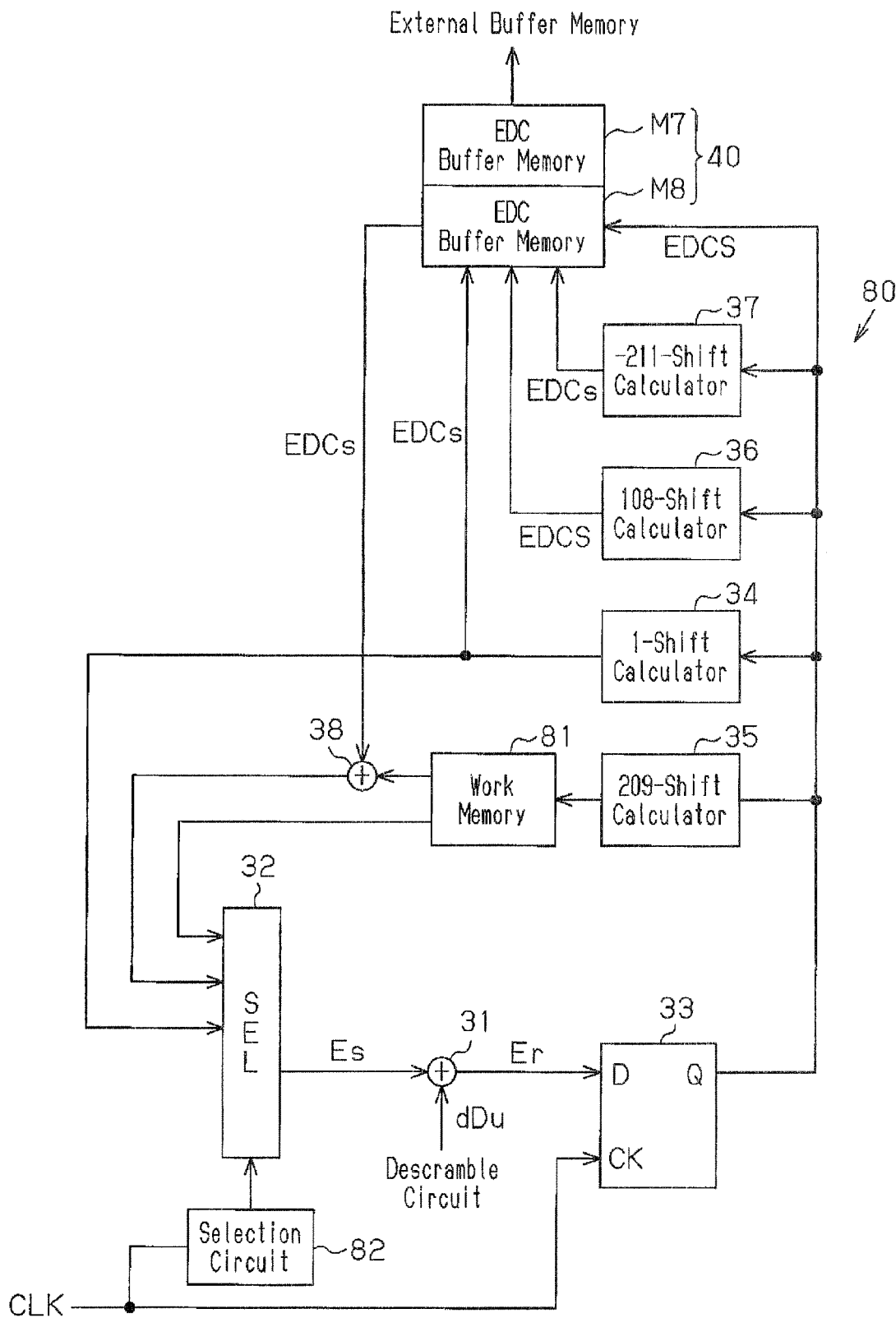
FIG. 33 is a schematic block diagram showing an EDC syndrome generation circuit according to the second embodiment.
Figure 34:
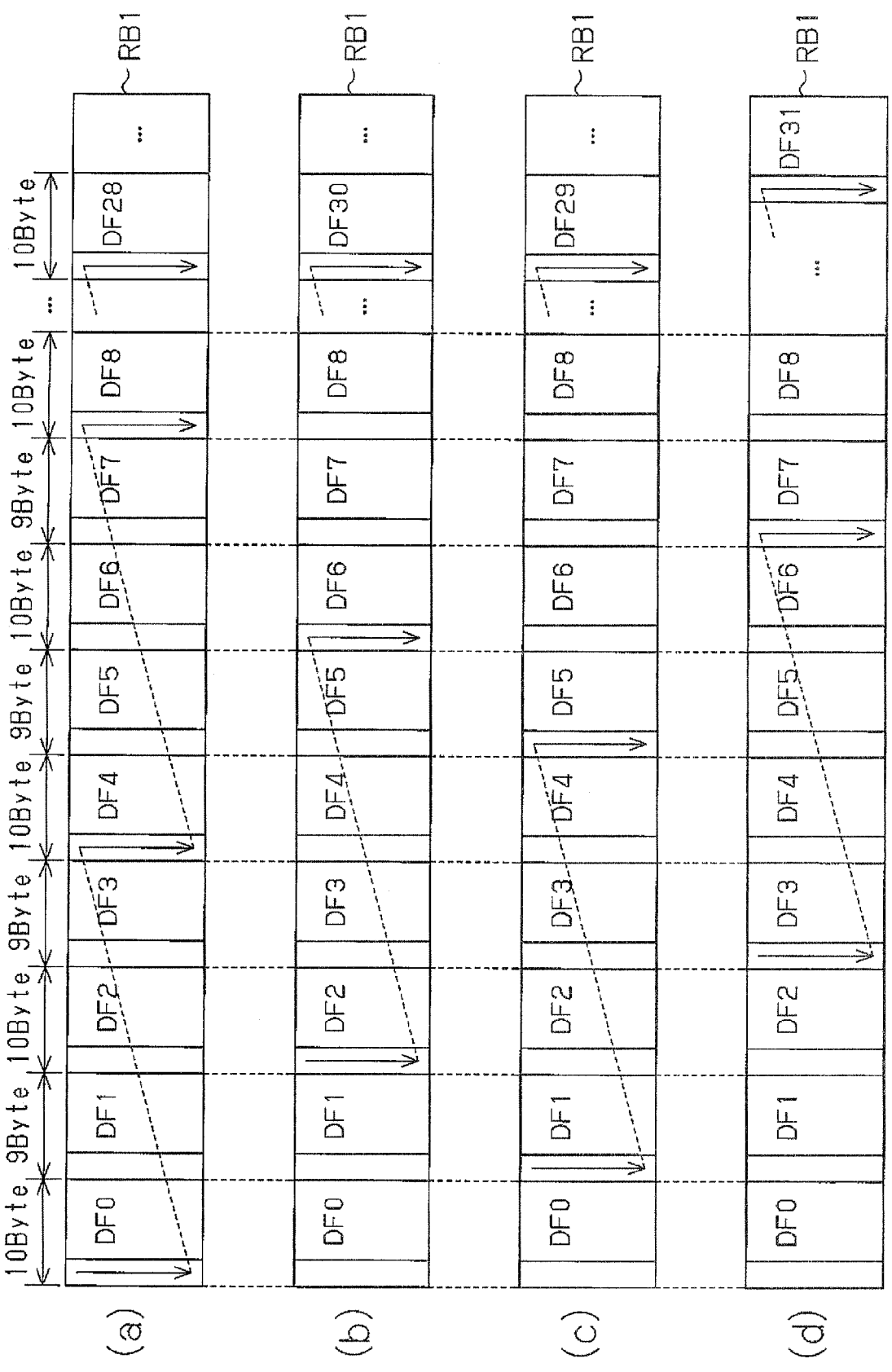
FIGS. 34A, 34B, 34C, and 34D are diagrams describing the order in which data elements are processed in the descramble circuit shown in FIG. 32.

The circuit structure of the EDC syndrome generation circuit 80 will now be described with reference to FIG. 33. The EDC syndrome generation circuit 80 in the second embodiment includes a work memory 81, which is not included in the EDC syndrome generation circuit 30 of the first embodiment.

An EDC calculated value Er(c), which is calculated when data of the last row of each column of each data frame included in the read block RB is input, is stored into the work memory 81 as a shift calculated value Es after stored in the 209-shift calculator 25. The work memory 81 then provides the shift calculated value Es to the EOR circuit 38 and the selector 32.

The selector 32 is provided with a selection signal from the selection circuit 82. Based on the selection signal from the selection circuit 82, the selector 27 selectively provides the EOR circuit 31 with one of scramble values SC provided from the 1-shift calculator 34, the EOR circuit 38, and the work memory 81. The selection circuit 82 generates a selection signal in accordance with the number of pulses of a clock signal CLK, and provides the selector 32 with the selection signal. When, for example, data of the first row of each column of each data frame DF excluding the first and last columns is provided to the EOR circuit 31, the selection circuit 82 generates a selection signal for outputting the shift calculated value Es of the work memory 81 to the EOR circuit 31. When the first data of the first row of the first column of each data frame is provided to the EOR circuit 31, the selection circuit 82 generates a selection signal for stopping the output of the shift calculated value Es from the selector 32. When the data of the first row of the last column of each data frame is provided to the EOR circuit 31, the selection circuit 82 also generates a selection signal for outputting the shift calculated value Es of the EOR circuit 38.

The positions at which the descramble data elements dDu of the data frames DF0 to DF31 are stored in the external buffer memory 6 will now be described with reference to FIG. 19. As shown in FIG. 19, the descramble data elements dDu of the data frames DF0 to DF31 that have been subjected to the descrambling process by the descramble circuit 70 are stored into the external buffer memory 6 as 32 rows of 64 columns of blocks, in which four data frames DF are arranged in the column direction. More specifically, the data frames DF0, DF1, DF2, and DF3 are arranged in the first column of the external buffer memory 6, and the data frames DF4, DF5, DF6, and DF7 are arranged in the second column of the external buffer memory 6. As a result, the data frames DF0, DF4, DF8, DF12, DF16, DF20, DF24, and DF28 are arranged in the first row of the external buffer memory 6, the data frames DF1, DF5, DF9, DF13, DF17, DF21, DF25, and DF29 are arranged in the second row of the external buffer memory 6, the data frames DF2, DF6, DF10, DF14, DF18, DF22, DF26, and DF30 are arranged in the third row of the external buffer memory 6, and the data frames DF3, DF7, DF11, DF15, DF19, DF23, DF27, and DF31 are arranged in the fourth row of the external buffer memory 6.

The operation of the optical disc controller 10 according to the second embodiment will now be described. In particular, the order in which data is processed by the descramble circuit 70 and the EDC syndrome generation circuit 80 will be described.

As shown in FIG. 34A, the descramble circuit 70 reads the scramble data elements sDu of the first column of the data frame DF0 included in the first read block RB1 from the internal memory unit 12 in the column direction of the first read block RB1. The descramble circuit 70 reads the scramble data elements sDu of the first column of the data frame DF4 included in the read block RB1 from the internal memory unit 12 in the column direction of the same block RB1. In the same manner, the descramble circuit 70 reads the scramble data elements sDu of the first column of the data frames DF8, DF12, DF16, DF20, DF24, and DF28 serially in the column direction of the read block RB1. The descramble circuit 70 descrambles the read scramble data elements sDu serially to generate descramble data elements dDu, and stores the descramble data elements dDu into the external buffer memory 6. The descramble circuit 70 also provides the descramble data elements dDu to the EDC syndrome generation circuit 80. The descrambling process is performed in the same manner as in the first embodiment. More specifically, the descramble circuit 70 descrambles the first scramble data element sD0 of the first row of the first column of each even number data frame DF using the initial value S0 of the even number register R2 to generate the descramble data element dD0. Further, the descramble circuit 70 descrambles the scramble data elements sD1 to sD7 of the second and subsequent rows of the first column of each even number data frame DF using the scramble value SC that is obtained by shifting the previously used scramble value by one byte to generate the descramble data elements dD1 to dD7.

FIG. 35 shows a method for storing data from the descramble circuit 70 to the external buffer memory 6. As shown in FIG. 35, the descramble data elements dDu of the first column of the data frames DF0, DF4, DF8, DF12, DF16, DF20, DF24, and DF28 are stored into the same row of the external buffer memory 6 (the first row in this example). More specifically, the data elements of the same column of the eight data frames DF stored into the same row of the external buffer memory 6 are read from the internal memory unit 12 in a continuous manner.

As shown in FIG. 34B, the descramble circuit 70 serially reads the scramble data elements sDu of the first column of the data frames DF2, DF6, DF10, DF14, DF18, DF22, DF26, and DF30 of the read block RB1 in the column direction of the read block RB1. The descramble circuit 70 serially descrambles the read scramble data elements sDu to generate descramble data elements dDu, and stores the descramble data elements dDu into the same row of the external buffer memory 6. Also, the descramble circuit 70 provides the descramble data elements dDu to the EDC syndrome generation circuit 80. The scramble value SC, which is calculated by the 209-shift calculator 25 based on the scramble value SC that is used to generate the scramble data element sD7 of the last row of each column (last row of the first column in this example) of the last even number data frame DF30, is stored into the even-numbered work register R4. As a result, the scramble value $S0*\gamma^7*\gamma^{209}=S0*\gamma^{216}$ is stored into the even-numbered work register R4. In the same manner as in the first embodiment, the scramble value $S0*\gamma^8$, which is calculated by the 1-shift calculator 24 based on the scramble value that is used to process the scramble data element sD7 of the last row of the first column of the last even number data frame DF30, is stored into the even number register R2. The scramble value $S0*\gamma^{216}$ may be stored into the even-numbered work register R4 at the timing when the descrambling process of the data element of the last row of the first column of a selected even number data frame (for example, the data frame DF0) is completed. In the same manner, the scramble value $S0*\gamma^8$ may be stored into the even-numbered work register R2 at the timing when the descrambling process of the data of the last row of the first column of a selected even number data frame (for example, the data frame DF0) is completed.

As shown in FIG. 34C, the descramble circuit 70 reads the scramble data elements sDu of the first column of the data frames DF1, DF5, DF9, DF13, DF17, DF21, DF25, and DF29 included in the read block RB1 serially in the column direction from the internal memory unit 12. The descramble circuit 70 serially descrambles the read scramble data elements sDu to generate descramble data elements sDu, and stores the descramble data elements dDu into the same row of the external buffer memory 6. The descramble circuit 70 also provides the descramble data elements dDu to the EDC syndrome generation circuit 80. The descrambler process is performed in the same manner as in the first embodiment. The descramble circuit 70 descrambles the first scramble data element sD108 of the first column of each odd number data frame DF using the scramble value $S0*\gamma^{108}$ of the odd number register R3 to generate the descramble data element dD108. The descramble circuit 70 descrambles the scramble data elements sD109 to sD115 of the second and subsequent rows of the first column of each odd number data frame DF using the scramble value SC obtained by shifting the previously used scramble value by one byte. This generates the descramble data elements dD109 to dD115.

As shown in FIG. 34D, the descramble circuit 70 serially reads the scramble data elements sDu of the first column of the data frames DF3, DF7, DF11, DF15, DF19, DF23, DF27, and DF31 included in the read block RB1 from the internal memory unit 12 in the column direction of the read block RB1. The descramble circuit 70 then serially descrambles the read scramble data elements sDu to generate the descramble data elements dDu, and stores the descramble data elements dDu into the same row of the external buffer memory 6. The descramble circuit 70 further provides the descramble data elements dDu to the EDC syndrome generation circuit 80. The scramble value SC, which is calculated by the 209-shift calculator 25 based on the scramble value SC that is used to process the scramble data element sD115 of the last row of each column (last row of the first column in this example) of the last odd number data frame DF31, is stored into the odd-numbered work register R5. As a result, the scramble value $S0*\gamma^{115}*\gamma^{209}=S0*\gamma^{324}$ is stored into the odd number register R5. In the same manner as in the first embodiment, the scramble value $S0*\gamma^{116}$, which is calculated by the 1-shift calculator 24 based on the scramble value SC that is used to process the scramble data element sD115 of the last row of the first column of the last odd number data frame, is also stored into the odd number register R3. The scramble value $S0*\gamma^{324}$ may be stored into the odd-numbered work register R5 at the timing when the descrambling process of the data of the last row of the first column of a selected odd number data frame (for example, the data frame DF1) is completed. In the same manner, the scramble value $S0*\gamma^{116}$ may be stored into the odd number register R3 at the timing when the descrambling process of the data of the last row of the first column of a selected odd number data frame (for example, the data frame DF1) is completed.

The descramble circuit 70 serially reads the scramble data elements sDu of the second column of the data frames DF0, DF4, DF8, DF12, DF16, DF20, DF24, and DF28 in the column direction of the read block RB1. The descramble circuit 70 then serially descrambles the read descramble data elements sDu. The descramble circuit 70 uses the scramble value SC ($S0*\gamma^{216}$ in this example) stored in the even-numbered work register R4 to descramble the data element (the scramble data element sD216 in this example) of the first row of the second or subsequent column of each even number data frame. In the same manner, the descramble circuit 70 uses the scramble value $S0*\gamma^{324}$ stored in the odd-numbered work register R5 to descramble the scramble data element sD324 of the first row of the second column of each odd number data frame. In this manner, the scramble values SC of the work registers R4 and R5 are generated by shifting the scramble value used to process the last row of each column of each even number data frame (or each odd number data frame) included in the same read block RB by 209 bytes.

Accordingly, the descrambling process performed in the second embodiment differs from the descrambling process in the first embodiment in the order in which the data elements are processed. More specifically, the values calculated by the 209-shift calculator 25 based on the scramble values used to process the data of the last row of each column are stored into the work registers R4 and R5 in the second embodiment. The values stored into the work registers R4 and R5 are then used in the descrambling process of the data element of the first row of the next column.

The EDC calculation process performed by the EDC syndrome generation circuit 80 will now be described. The EDC syndrome generation circuit 80 is provided from the descramble circuit 70 with descramble data elements dDu in the order in which the descramble data elements dDu are generated. More specifically, the descramble data elements dDu are input to the EDC syndrome generation circuit 80 in the order shown in FIGS. 34A to 34D. The EDC syndrome generation circuit 80 is provided with data of every column (eight bytes) of each data frame DF. When receiving the column data of each data frame DF, the EDC syndrome generation circuit 80 serially calculates the EDC calculated values Er(c) in the same manner as in the first embodiment. For example, when the byte data elements $X^{2051}$ to $X^{2044}$ of the first column of the data frame DF0 (even number data frame) are input serially into the EOR circuit 31, the EDC syndrome generation circuit 80 serially calculates the EDC calculated values Er(c) using the equation shown below.

$$E1(1) = X^{2051}$$
$$E1(2) = \beta^1 \cdot X^{2051\wedge} X^{2050}$$
$$E1(3) = \beta^1 \cdot (\beta^1 \cdot X^{2051\wedge} X^{2050})^{\wedge} X^{2049}$$
$$= \beta^2 \cdot X^{2051\wedge} \beta^1 \cdot X^{2050\wedge} X^{2049}$$
$$\vdots$$
$$E1(8) = \beta^7 \cdot X^{2051\wedge} \beta^6 \cdot X^{2050\wedge} \beta^5 \cdot X^{2049\wedge} \beta^4 \cdot$$
$$X^{2048\wedge} \beta^3 \cdot X^{2047\wedge} \beta^2 \cdot X^{2046\wedge} \beta^1 \cdot X^{2045\wedge} X^{2044}$$

Equation 28

The EDC calculated value Er(c) (the EDC calculated value E1(8) in this example) that is calculated when the data of the last row of each column of each data frame DF (the data frame DF0 in this example) is stored into the work memory 81 as the shift calculated value Es (that is, $\beta^{209}$*E1(8)) after stored in the 209-shift calculator 35. More specifically, the work memory 81 stores the shift calculated value Es of each data frame DF.

The EDC calculation performed when the data of the first row of each column of each data frame DF excluding the first column and the last column is input to the EOR circuit 31 will now be described. When, for example, the data element $X^{1835}$ of the first row of the second column of the data frame DF0 is input to the EOR circuit 31, the selection circuit 82 provides the selector 32 with a selection signal for outputting the shift calculated value Es from the work memory 81 to the EOR circuit 31. As a result, the shift calculated value Es (that is, $\beta^{209}$*E1(8)), which is stored into the work memory 81 when the data of the first column of the data frame DF0 (that is, the data of the immediately preceding column of the same data frame included in the same read block) is input, is stored into the EOR circuit 31. Thus, the EDC calculated value E1(9) of the data element $X^{1835}$ is calculated using the equation shown below.

$$E1(9) = \beta^{209} \cdot E1(8)^{\wedge} X^{1835}$$
$$= \beta^{216} \cdot X^{2051\wedge} \beta^{215} \cdot X^{2050\wedge} \beta^{214} \cdot X^{2049\wedge} \beta^{213} \cdot$$
$$X^{2048\wedge} \beta^{212} \cdot X^{2047\wedge} \beta^{211} \cdot X^{2046\wedge} \beta^{210} \cdot$$
$$X^{2045\wedge} \beta^{209} \cdot X^{2044\wedge} X^{1835}$$

Equation 29

In this manner, every column data of each data frame included in the read block RB is input to the EDC syndrome generation circuit 80 of the second embodiment. As a result, the work memory 81 stores the shift calculated value Es of each data frame that is obtained by weighting using the vector 209-degree vector $\beta^{209}$ the EDC calculated value Er(c) calculated when the last data of each column is input. When the data of the first row of the next column of each data frame included in the same read block RB is input to the EOR circuit 31, the shift calculated value Es of the same data frame stored in the work memory 81 is used in the EDC calculation process. The other calculations performed in the second embodiment are the same as the calculations described in the first embodiment.

The error correction device of the second embodiment has the advantages described below in addition to advantages (1) to (10) of the first embodiment.

(11) The descramble circuit 70 includes the even-numbered work register R4 for storing the scramble value SC used to process the scramble data of the first row of the second or subsequent column of the even number data frame. The descramble circuit 70 also includes the odd-numbered work register R5 for storing the scramble value SC used to process the scramble data of the first row of the second or subsequent column of the odd number data frame. As shown in FIGS. 34A, 34B, 34C, and 34D, even when the data elements of the same column of a plurality of data frames are subjected to the descrambling process, the descrambling process is performed in a continuous manner using the scramble values SC stored in the work registers R4 and R5.

(12) The EDC syndrome generation circuit 80 includes the work memory 81 for storing the EDC calculated value Er(c) of each column provided from the 209-shift calculator 35. Thus, the descrambling process performed using the data processing order shown in FIGS. 34A, 34B, 34C, and 34D is performed in a continuous manner using the scramble values SC stored in the work memory 81.

(13) The descramble circuit 70 reads the descramble data elements dDu in the same column of the eight data frames that are stored in the same row of the external buffer memory 6 (for example, the data frames DF0, DF4, DF8, DF12, DF16, DF20, DF24, and DF28) from the internal memory unit 12 in a continuous manner. The external buffer memory 6 allows data stored in the same row to be accessed in a continuous manner. This function of the external buffer memory 6 improves the efficiency of the descramble circuit 70 that accesses the external buffer memory 6 to store the descramble data elements dDu into the external buffer memory 6.

An optical disc controller 10 (error correction device) according to a third embodiment will now be described with reference to FIGS. 36 to 38. The optical disc controller 10 of the third embodiment includes an EDC syndrome generation circuit 90 instead of the EDC syndrome generation circuit 80 of the second embodiment. A descramble circuit 70 of the third embodiment uses the same data reading order as the order used by the descramble circuit of the second embodiment.

Figure 37:
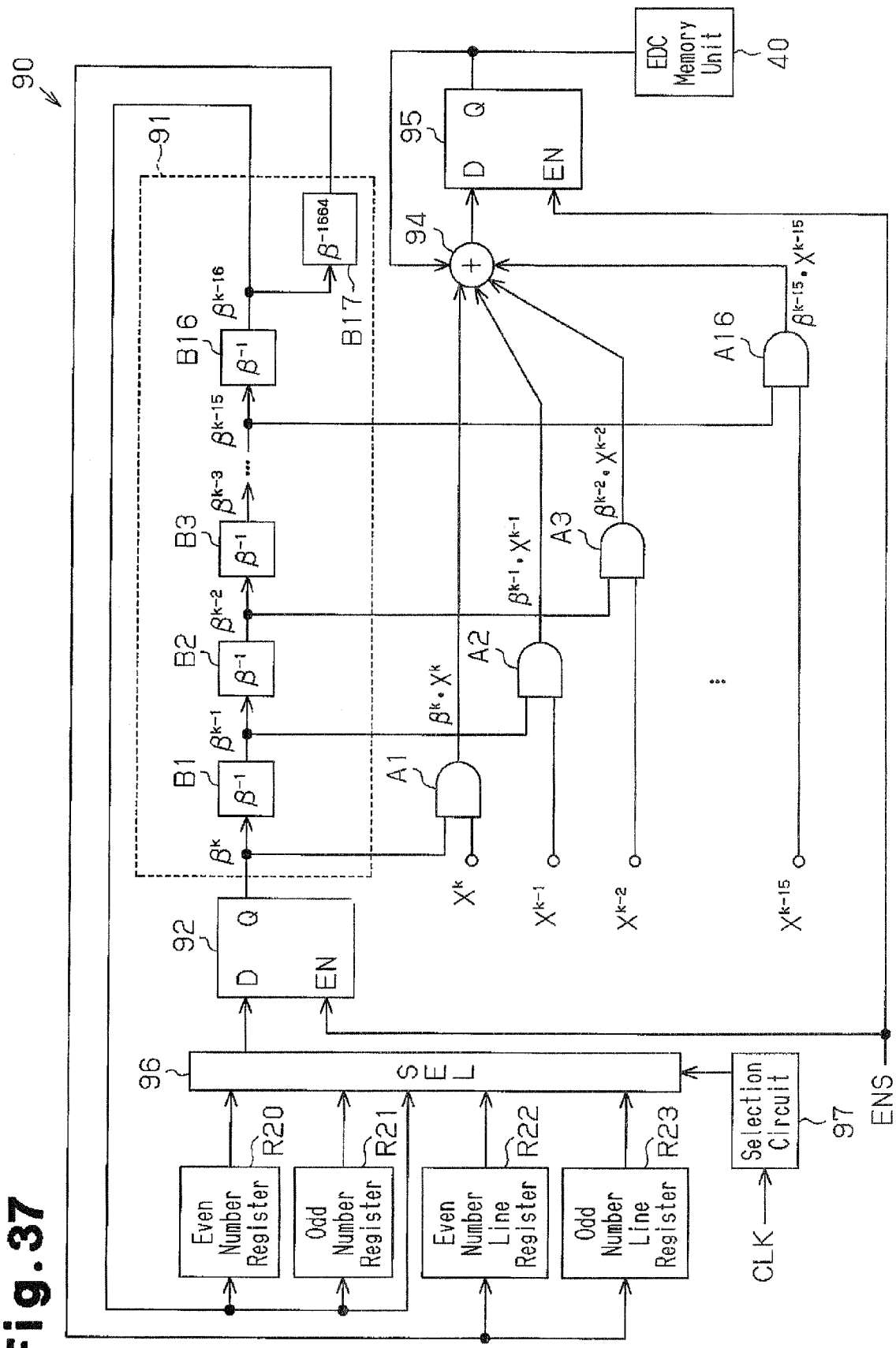
FIG. 37 is a schematic block diagram showing an EDC syndrome generation circuit according to a third embodiment.
Figure 38:
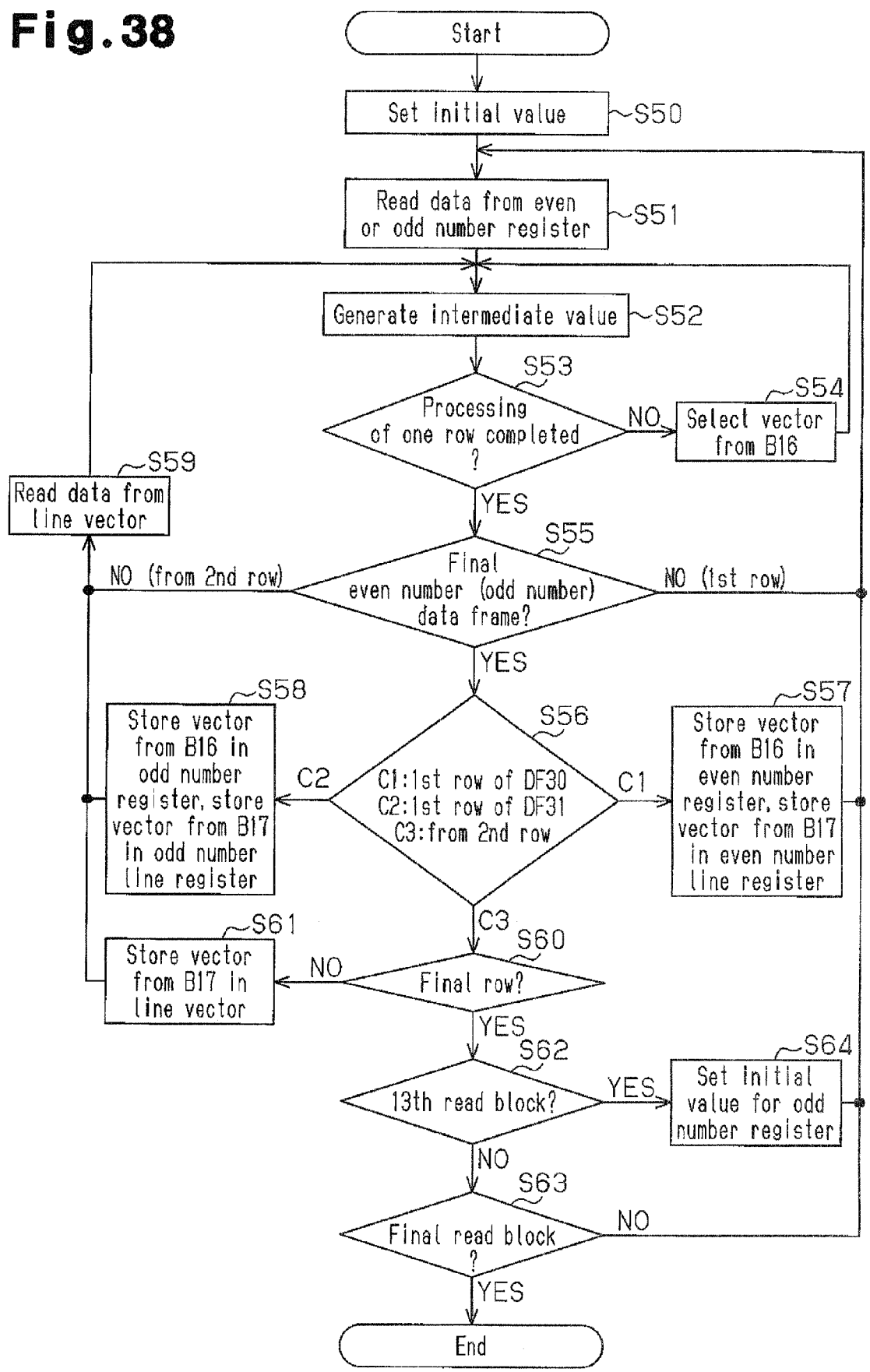
FIG. 38 is a flowchart illustrating an EDC calculation process according to the third embodiment.

As shown in FIG. 37, an EDC syndrome generation circuit 90 includes sixteen AND circuits A1 to A16. Each of the AND circuits A1 to A16 receives 1-bit input data (bit data) $X^k$ from the descramble circuit 70.

The bit data that is provided to each of the AND circuits A1 to A16 will now be described. A single data frame DF has 2052 bytes. In this case, a single data frame DF has 16416 bits (2052 bytes*8). A polynomial (input polynomial) expressing the weighting degree of the 16416-bit descramble data element dDu, which is used when the EDC calculation is performed using the same data processing order as the order used in the EDC adding process, is written using the equation shown below.

$$I(X) = X^{16415} + X^{16414} + X^{16413} + \ldots + X^2 + X^1 + X^0$$

Equation 30

As described above, the EDC calculation is the processing of weighting each degree of the input polynomial using the vector $\beta^k$. Thus, the EDC syndrome EDCS is calculated using the equation shown below. The degree k of the vector $\beta^k$ and the degree n of the vector $\beta^n$ in the first and second embodiments satisfy k=8n.

$$EDCS = \beta^{6415} \cdot X^{16415} \cdot \beta^{16414} \cdot X^{16414} \cdot \beta^{16413} \cdot$$
$$X^{16413} \ldots \cdot \beta^2 \cdot X^2 \cdot \beta^1 \cdot X^1 \cdot X^0$$

Equation 31

In the calculation of the EDC syndrome EDCS, 1-bit data is weighted using the first-degree vector $\beta^k$ (=$\beta^1$) every time when the 1-bit data is processed. Weighting the 1-bit data $X^k$ using the vector $\beta^1$ specifically means shifting the bit data element $X^k$, which is to be weighted, by one bit in accordance with a predetermined generation polynomial G(x) (G(x)= $x^{32}+x^{31}+x^4+1$ in this example). For example, the bit data element $X^{16415}$, which is input at the earliest timing of all the data elements of each data frame DF, is weighted 16415 times using the first-degree vector $\beta^1$. Moreover, the first to twenty seventh read blocks RB1 to RB27, into which the data block DB is divided, are provided serially from the descramble circuit 70 in the third embodiment in the same manner as in the second embodiment. FIG. 36A shows the order in which the byte data elements $X^n$ and the bit data elements $X^k$ of the first and second columns of an even number data frame included in the first read block RB1 are input using the degrees n and k. FIG. 36B shows the order in which the byte data elements $X^n$ and the bit data elements $X^k$ of the first column and the second column of an odd number data frame included in the first read block RB1 are input using the degrees n and k.

As shown in FIG. 36A, the bit data elements $X^k$ are input to the EDC syndrome generation circuit 80 in the order of the data elements $X^{16415}$, $X^{16414}$, ... $X^{16353}$, $X^{16352}$, $X^{14687}$, and $X^{14686}$. More specifically, the bit data elements $X^{16415}$ to $X^{16400}$ ($X^k$ to $X^{k-15}$) of the data frame DF0 included in the read block RB1 are first input to the AND circuits A1 to A16 (refer to FIG. 37). The bit data elements $X^{16399}$ to $X^{16384}$ of the data frame DF0 are next input to the AND circuits A1 to A16. The bit data elements $X^{16387}$ to $X^{16368}$ of the data frame DF0 are then input to the AND circuits A1 to A16. The bit data elements $X^{16367}$ to $X^{16352}$ of the data frame DF0 are then input to the AND circuits A1 to A16. When the bit data elements arranged in the first column of all the data frames DF0 to DF31 included in the first read block RB1 are input completely, the bit data elements $X^{14686}$ to $X^{14672}$ of the second column of the data frame DF0 included in the read block RB1 are input to the AND circuits A1 to A16. In this manner, the data elements are input to the AND circuits in the order different from the order in which the data elements are input in the EDC appending process. In this case, the data elements would fail to be weighted correctly using the vector β. Therefore, the EDC syndromes would fail to be generated correctly.

To overcome this problem, the EDC syndrome generation circuit 90 of the third embodiment includes a vector generation circuit 91. The vector generation circuit 91 generates a vector $\beta^k$ with a desired degree k in accordance with the bit data $X^k$. The vector generation circuit 91 includes sixteen −1-bit shift ($\beta^{-1}$) calculators B1 to B16 (first inverse-shift calculator group) and a single −1664-bit shift ($\beta^{-1664}$) calculator B17. The vector generation circuit 91 generates eighteen vectors β based on the vector $\beta^k$ provided from a vector register 92.

Figure 39:
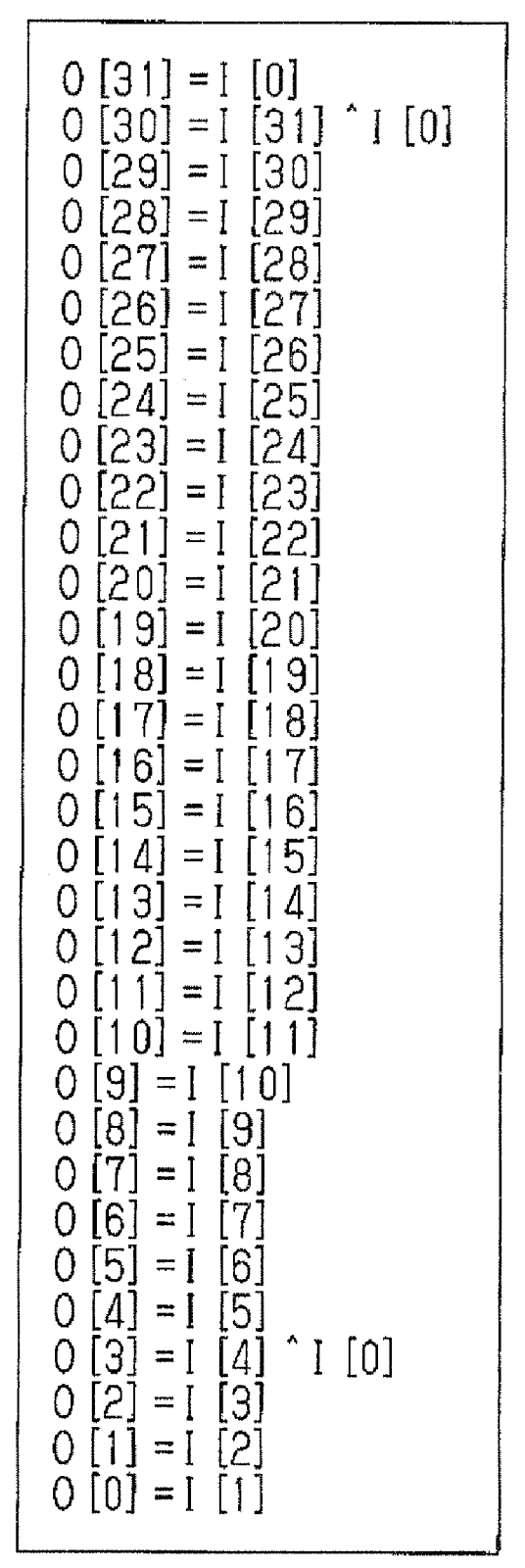

The $\beta^{-1}$ calculators B1 to B16 generate the vector $\beta^{k-1}$ in response to the vector $\beta^k$ provided from the vector register 92 or from a preceding-stage $\beta^{-1}$ calculator. More specifically, the $\beta^{-1}$ calculators B1 to B16 generate a new vector by inversely shifting an input vector by one bit in accordance with the generation polynomial G(x). FIG. 39 shows a logic equation representing the value O[31:0], which is output from the $\beta^{-1}$ shift calculators B1 to B16 when the value I[31:0] is input to the $\beta^{-1}$ shift calculators B1 to B16.

For example, when the vector $\beta^k$ is input to the $\beta^{-1}$ calculator B1 from the vector register 92, the $\beta^{-1}$ calculators B1 to B16 respectively generate vectors $\beta^{k-1}$ to $\beta^{k-16}$. The vector $\beta^k$, which is provided to the $\beta^{-1}$ calculator B1, is also provided to the AND circuit A1. The vector $\beta^{k-1}$, which is output from the $\beta^{-1}$ calculator B1, is also provided to the AND circuit A2. The vector $\beta^{k-2}$, which is output from the $\beta^{-1}$ calculator B2, is also provided to the AND circuit A3. In the same manner, the vectors $\beta^{k-3}$ to $\beta^{k-15}$, which are output from the $\beta^{-1}$ calculators B3 to B15, are provided to the AND circuits A4 to A16. The $\beta^{-1}$ calculator B16 provides the vector $\beta^{k-16}$ to the $\beta^{-1664}$ calculator B17, an even number register R20, an odd number register R21, and a selector 96.

Figure 40:
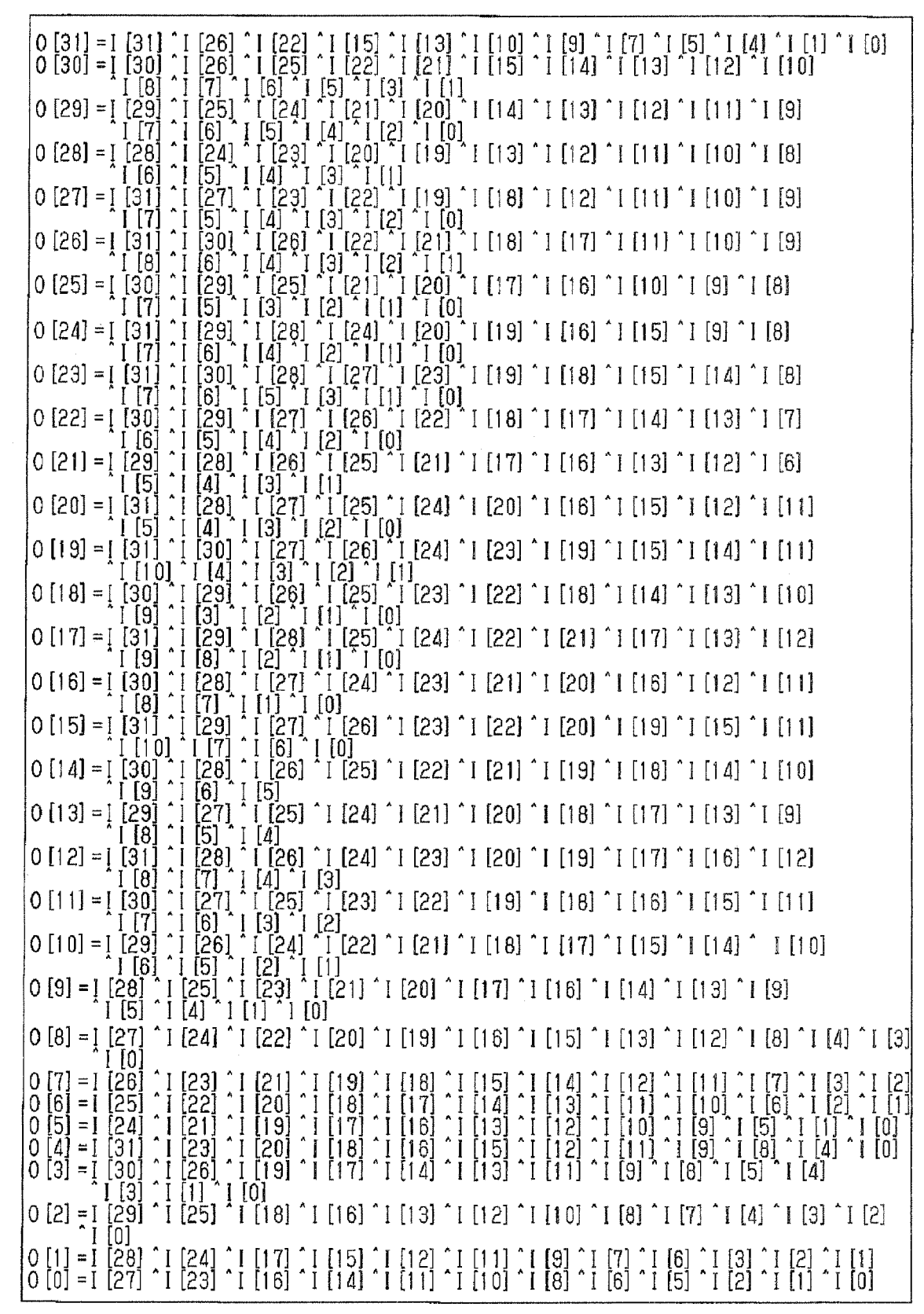

The $\beta^{-1664}$ calculator B17 generates the vector $\beta^{k-16-1664}$ based on the vector $\beta^{k-16}$, which is provided from the $\beta^{-1}$ calculator B16, and provides the vector $\beta^{k-16-1664}$ to an even number line register R22, an odd number line register R23, and the selector 96. More specifically, the $\beta^{-1664}$ calculator B17 generates a new vector by inversely shifting an input vector by 1664 bits in accordance with the generation polynomial G(x). FIG. 40 shows a logic equation representing the value O[31:0], which is output from the $\beta^{-1664}$ shift calculator B17 when the value I[31:0] is input to the $\beta^{-1664}$ shift calculator B17.

The AND circuits A1 to A16 exclusively-OR extension data elements, which are generated by extending the bit data elements $X^k$ to $X^{k-15}$ to 32-bit data, and the vectors $\beta^k$ to $\beta^{k-15}$, which are provided from the vector generation circuit 91. The AND circuits A1 to A16 then provide the calculation results to the EOR circuit 94. The 32-bit extension data is obtained by changing the values of all the bits 0 to 31 to the values of $X^n$.

The EOR circuit 94 performs an exclusive OR operation on the sixteen calculation results of the AND circuits A1 to A16, and provides the calculation result to the syndrome register 95. The syndrome register 95 provides the calculation result of the EOR circuit 94 to the EOR circuit 94 and the EDC memory unit 40 as an intermediate value EDCs based on an enable signal ENS, which is input to an EN terminal of the syndrome register 95. The EDC memory unit 40 has the same structure as the EDC memory unit 40 in the first and second embodiments. The EDC memory unit 40 stores the intermediate value EDCs of the EDC syndrome of each of the data frames DF0 to DF31 and the final EDC syndrome EDCS.

The selector 96 outputs one of a plurality of vectors $\beta^k$, which are provided from the $\beta^{-1}$ calculator B16 and the registers R20 to R23, to the vector register 92 based on a selection signal from the selection circuit 97. The vector register 92 outputs the vector $\beta^k$ provided from the selector 96 to the vector generation circuit 91 based on an enable signal ENS, which is input to an EN terminal of the vector register 92.

At the initial setting, the even number register R20 stores the vector $\beta^{16415}$, which is calculated in advance in accordance with the predetermined generation polynomial G(x). During operation, the even number register R20 stores the vector β that is output from the $\beta^{-1}$ calculator B16 when the calculation process of the bit data element X of the last row of the first column of the last even number data frame (or a selected even number data frame) is completed. At the initial setting, the odd number register R21 stores the vector $\beta^{15551}$, which is calculated in advance in accordance with the predetermined generation polynomial G(x). During operation, the odd number register R21 stores the vector β that is output from the $\beta^{-1}$ calculator B16 when the calculation process of the bit data element X of the last row of the first column included in the last odd number data frame (or a selected even number data frame) is completed.

The even number line register R22 stores the vector β output from the $\beta^{-1664}$ calculator B17 when the EDC calculation process of the bit data element X of the last row of each column of the last even number data frame (or a selected even number data frame) is completed. The odd number line register R23 stores the vector β output from the $β^{-1664}$ calculator B17 when the EDC calculation process of the bit data element of the last row of each column of the last odd number data frame (or a selected odd number data frame) is completed.

The selection circuit 97 generates a selection signal in accordance with the number of pulses of a clock signal CLK, and provides the selection signal to the selector 96. For example, the selection circuit 97 generates a selection signal for outputting the vector β of the even number register R20 to the vector register 92 as the vector $β^k$ when data of 16 bits starting from the first bit of the first row of the first column of each even number data frame is provided to the AND circuits A1 to A16. The selection circuit 97 generates a selection signal for outputting the vector β of the even number register R21 to the vector register 92 as the vector $β^k$ when data of 16 bits starting from the first bit of the first row of the first column of each odd number data frame is provided to the AND circuits A1 to A16. The selection circuit 97 generates a selection signal for outputting the vector β of the even number line register R22 to the vector register 92 as the vector $β^k$ when data of 16 bits starting from the bit of the first row of the second or subsequent column of each even number data frame is provided to the AND circuits A1 to A16. The selection circuit 97 generates a selection signal for outputting the vector β of the odd number line register R23 to the vector register 92 as the vector $β^k$ when data of 16 bits starting from the bit of the first row of the second or subsequent column of each odd number data frame is provided to the AND circuits A1 to A16. Also, the selection circuit 97 generates a selection signal for outputting the vector β of the $β^{-1}$ calculator B16 to the vector register 92 as the vector $β^k$ when the data of 16 bits starting from the next bit included in each read block RB in the column direction (that is, the bit data of the seventeenth and subsequent rows) is provided to the selection circuit 97.

The operation of the EDC syndrome generation circuit 90 will now be described with reference to FIG. 38.

In step S50, the initial value is set at each of the even number register R20 and the odd number register R21. More specifically, the even number register R20 stores the vector $β^{16415}$ with the same degree as the first bit data element $X^{16415}$ of each even number data frame included in the first read block RB1. The odd number register R21 stores the vector $β^{15551}$ with the same degree as the first bit data element $X^{15551}$ of each odd number data frame included in the first read block RB1.

Subsequently, the selection circuit 97 provides a selection signal for outputting the vector β of the even number register R20 or the odd number register R21 to the vector register 92 (step S51). The selection circuit 97 generates a selection signal for providing the vector β of the even number register R20 to the vector register 92 in the EDC calculation process of the even number data frame and providing the vector β of the odd number register R21 to the vector register 92 in the EDC calculation process of the odd number data frame. When the present data frame DF is the data frame DF0 (even number data frame), the selection circuit 97 generates a selection signal for providing the vector $β^{16415}$ of the even number register R20 to the vector register 92.

In step S52, the bit data elements $X^{16415}$ to $X^{16400}$ of 16 bits starting from the first bit data element $X^{16415}$ of the data frame DF0 are provided from the descramble circuit 70 to the AND circuits A1 to A16. The vector generation circuit 91 provides the vectors $β^{16415}$ to $β^{16400}$ respectively to the AND circuits A1 to A16. The EOR circuit 94 performs an exclusive OR operation on the calculation results of the AND circuits A1 to A16 to calculate an intermediate value EDCs of the EDC syndrome using the equation shown below.

$$EDCs = β^{16415} \cdot X^{16415 \wedge} β^{16414} \cdot X^{16414 \wedge} β^{16413} \cdot X^{16413 \wedge} β^{16412} \cdot \\ X^{16412 \wedge} β^{16411} \cdot X^{16411 \wedge} β^{16410} \cdot X^{16410 \wedge} β^{16409} \cdot \\ X^{16409 \wedge} β^{16408} \cdot X^{16408 \wedge} β^{16407} \cdot X^{16407 \wedge} β^{16406} \cdot \\ X^{16406 \wedge} β^{16405} \cdot X^{16405 \wedge} β^{16404} \cdot X^{16404 \wedge} β^{16403} \cdot \\ X^{16403 \wedge} β^{16402} \cdot X^{16402 \wedge} β^{16401} \cdot X^{16401 \wedge} β^{16400} \cdot X^{16400}$$

Equation 32

The intermediate value EDCs is provided to the EDC memory unit 40 and the EOR circuit 94 after stored in the syndrome register 95.

In step S53, the selection circuit 97 determines whether the data elements of a single column (64 bits) included in the read block RB have been subjected to the EDC calculation process in accordance with the number of pulses of a clock signal. When all the data elements have not yet undergone the EDC calculation process (NO in step S53), the selection circuit 97 provides the selector 96 with a selection signal for outputting the vector β of the $β^{-1}$ calculator B16 to the vector register 92 (step S54). In this case, the vector $β^{16399}$ is provided to the vector register 92 from the $β^-$ calculator B16 via the selector 96. Thus, the vectors $β^{16399}$ to $β^{16384}$ are provided from the vector generation circuit 91 respectively to the AND circuits A1 to A16. The AND circuits A1 to A16 are also respectively provided with the bit data elements $X^{16399}$ to $X^{16384}$ from the descramble circuit 70. The EOR circuit 94 performs an exclusive OR operation on the calculation results of the AND circuits A1 to A16 and the intermediate value EDCs of the immediately preceding data elements to calculate the intermediate value EDCs using the equation shown below.

$$EDCs = β^{16415} \cdot X^{16415 \wedge} β^{16414} \cdot X^{16414 \wedge} \\ β^{16413} \cdot X^{16413 \wedge} β^{16412} \cdot X^{16412 \wedge} β^{16411} \cdot \\ X^{16411 \wedge} β^{16410} \cdot X^{16410 \wedge} β^{16409} \cdot X^{16409 \wedge} β^{16408} \cdot \\ X^{16408 \wedge} β^{16407} \cdot X^{16407 \wedge} β^{16406} \cdot X^{16406 \wedge} β^{16405} \cdot \\ X^{16405 \wedge} β^{16404} \cdot X^{16404 \wedge} β^{16403} \cdot X^{16403 \wedge} β^{16402} \cdot \\ X^{16402 \wedge} β^{16401} \cdot X^{16401 \wedge} β^{16400} X^{16400 \wedge} β^{16399} \cdot \\ X^{16399 \wedge} β^{16398} \cdot X^{16398 \wedge} β^{16397} \cdot X^{16397 \wedge} β^{16396} \cdot \\ X^{16396 \wedge} β^{16395} \cdot X^{16395 \wedge} β^{16394} \cdot X^{16394 \wedge} β^{16393} \cdot \\ X^{16393 \wedge} β^{16392} \cdot X^{16392 \wedge} β^{16391} \cdot X^{16391 \wedge} β^{16390} \cdot \\ X^{16290 \wedge} β^{16389} \cdot X^{16389 \wedge} β^{16388} \cdot X^{16388 \wedge} β^{16387} \cdot \\ X^{16387 \wedge} β^{16386} \cdot X^{16386 \wedge} β^{16385} \cdot X^{16385 \wedge} β^{16384} \cdot X^{16384}$$

Equation 33

The processing in steps S52 to S54 is repeated until all the bit data elements of the single column included in the read block RB are subjected to the EDC calculation process. In this manner, when the bit data elements are read in the same order as the data processing order used in the EDC appending process, that is, when the bit data elements arranged in the column direction are input to the EDC syndrome generation circuit 90, the vector generation circuit 91 is provided with the vector β from the $β^{-1}$ calculator B16.

The intermediate values EDCs, which are calculated when the 16-bit data elements $X^{16367}$ to $X^{16352}$ including the 16-bit data element $X^{16352}$ of the last row of the first column of the data frame DF0 included in the first read block RB1 are provided to the AND circuits A1 to A16, are stored into the EDC memory unit 40. In step S55, the selection circuit 97 determines whether the data frame DF that is presently being processed is the last even number data frame DF30 or the last odd number data frame DF31. In this example, the data element that is presently being processed is the data element of the first column of the data frame DF0. In this case, the processing proceeds to step S51. The data elements of the same column of the next data frame (that is, the first column of the data frame DF4) are subjected to the EDC calculation process in the same manner as the data elements of the data frame DF0.

The processing in steps S51 to S55 is performed repeatedly. More specifically, the data elements of the first column of the data frames DF4, DF8, DF12, DF16, DF20, DF24, DF28, DF2, DF6, DF10, DF14, DF18, DF22, DF26, and DF30 (refer to FIGS. 34A and 34B) are serially subjected to the EDC calculation process. When the intermediate value EDCs is calculated based on the 16-bit data elements $X^{16367}$ to $X^{16352}$ including the bit data element $X^{16352}$ of the last row of the first column of the data frame DF30 (YES in step S55), the processing proceeds to step S56.

The selection circuit 97 determines which one of the conditions C1 to C3 that the presently processed data element satisfies. When all the data elements of the first column of the last even number data frame DF30 have been subjected to the EDC calculation process (condition C1), the processing proceeds to step S57. When all the data elements of the first column of the last odd number data frame DF31 have been subjected to the EDC calculation process (condition C2), the processing proceeds to step S58. When all the data elements of the second or subsequent column of the last data frame have been subjected to the EDC calculation process (condition C3), the processing proceeds to step S59. In this example, all the data elements of the first column of the data frame DF30 have been subjected to the EDC calculation process (condition C1). Thus, the vector β of the $β^{-1}$ calculator B16 is stored into the even number register R20, and the vector β of the $β^{-1664}$ calculator B17 is stored into the even number register R22 (step S57). More specifically, when the present read block is the first read block RB1, the vector $β^{16351}$ is stored into the even number register R20 and the vector $β^{14687}$ is stored into the even number line register R22. The processing then returns to step S51. The data elements of the first column of the data frame DF1 (odd number data frame) included in the first read block RB1 are subjected to the EDC calculation process. As a result, the initial value vector $β^{15551}$ of the odd number register R21 is stored into the vector register 92. Thereafter, the processing in steps S52 to S54 is repeated until all the data elements of the first column of the data frame DF1 are subjected to the EDC calculation process in the same manner as the data elements of the even number data frame. When the intermediate value EDCs is calculated based on the 16-bit data elements $X^{15503}$ to $X^{15488}$ including the bit data element $X^{16352}$ of the last row of the first column of the data frame DF1, the processing proceeds to step S55.

Thereafter, the processing in steps S51 to S55 is repeated. More specifically, the data elements of the first column of the data frames DF5, DF9, DF13, DF17, DF21, DF25, DF29, DF3, DF7, DF11, DF15, DF19, DF23, DF27, and DF31 are subjected to the EDC calculation process serially in the stated order (refer to FIGS. 34C and 34D). When the intermediate value EDCs is calculated based on the 16-bit data elements $X^{16367}$ to $X^{16352}$ including the bit data element $X^{16352}$ of the last row of the first column of the data frame DF31 (YES in step S55 and the condition C2 is satisfied in step S56), the processing proceeds to step S58. The vector β ($β^{15487}$ in this example) of the $β^{-1}$ calculator B16 is stored into the odd number register R21, and the vector β ($β^{13823}$ in this example) of the $β^{-1664}$ calculator B17 is stored into the odd number line register R23 (step S58).

The selection circuit 97 provides the selector 96 with a selection signal for outputting the vector β of the even number line register R22 or the odd number line register R23 to the vector register 92 (step S59). The selection circuit 97 generates a selection signal for providing the vector register 92 with the vector β of the even number line register R22 in the EDC calculation process of the even number data frame EDC and providing the vector register 92 with the vector β of the odd number line register R23 in the EDC calculation process of the odd number data frame. In this example, the data elements of the second column of the data frame DF0 included in the first read block RB1 are subsequently subjected to the EDC calculation process. As a result, the vector $β^{14687}$ of the even number line register R22 is stored into the vector register 92 via the selector 96. As a result, the AND circuits A1 to A16 are respectively provided with the vectors $β^{14687}$ to $β^{14672}$ from the vector generation circuit 91 in step S52. The AND circuits A1 to A16 are further respectively provided with the 16-bit data elements $X^{14687}$ to $X^{14672}$ including the bit data element $X^{14687}$ of the first row of the second column of the data frame DF0. The EOR circuit 94 performs an exclusive OR operation on the calculation results of the AND circuits A1 to A16 and the intermediate value EDCs of the same data frame stored in the EDC memory unit 40 to calculate a new intermediate value EDCs.

In this manner, the bit data element $X^k$ of the first row of the second or subsequent column of the even number data frame is multiplied by the vector $β^k$, which is obtained by the $β^{-1}$ calculator B16 and the $β^{-1664}$ calculator B17 by shifting the vector $β^{k+1665}$, by which the bit data element $X^{k+1665}$ of the last row of the immediately preceding column of the even number data frame is multiplied. In the same manner, the bit data element $X^k$ of the first row of the second or subsequent column of the odd number data frame is multiplied by the vector $β^k$, which is obtained by the $β^{-1}$ calculator B16 and the $β^{-1664}$ calculator B17 by shifting the vector $β^{k+1665}$, by which the bit data element $X^{k+1665}$ of the last row of the immediately preceding column of the odd number data frame is multiplied. For example, the bit data element $X^{14687}$ of the first row of the second column of the data frame DF0 included in the first read block RB1 is processed in the EDC appending process at the timing delayed by the time corresponding to 1665 bits with respect to the bit data element $X^{16352}$ of the last row of the first column of the data frame DF0, which is calculated as (the total number of bits of the data block DB in the column direction, or 1728 bits)−(the total number of bits of the single read block in the column direction)+1=1665 bits. More specifically, the bit data element $X^{14687}$ is weighted using the vector $β^1$ 1665 times less than the number of times by which the bit data $X^{16352}$ is weighted using the vector $β^1$. As described above, the bit data element $X^k$ of the first row of each column of the second or subsequent column is multiplied using the vector $β^k$ that is obtained by inversely shifting, by 1665 bits, the vector $β^{k+1665}$, by which the bit data element $X^{k+1665}$ of the last row of the immediately preceding column is multiplied.

Thereafter, the processing in steps S52 to S54 is repeated. When the intermediate value EDCs is calculated based on the 16-bit data elements $X^{14639}$ to $X^{14624}$ including the bit data element $X^{14624}$ of the last row of the second column of the data frame DF0 included in the first read block RB1, the processing proceeds to step S55. In this example, the data elements of the second column of the data frame DF0, which is neither the last even number data frame DF30 or the last odd number data frame, are processed. Thus, the processing proceeds to step S59. The data elements of the second column of the data frame DF4 are processed next. The vector $\beta^{14687}$ of the even number line register R22 is provided to the vector register 92.

Subsequently, the processing in steps S51 to S55 is repeated. More specifically, the data elements of the second column of the data frames DF4, DF8, DF12, DF16, DF20, DF24, DF28, DF2, DF6, DF10, DF14, DF18, DF22, DF26, and DF30 are subjected to the EDC calculation process serially in the stated order. When the intermediate value EDCs is calculated based on the 16-bit data elements $X^{16367}$ to $X^{16352}$ including the bit data element $X^{16352}$ of the last row of the second column of the data frame DF30 (YES in step S55 and the condition C3 is satisfied in step S56), the processing proceeds to step S61. In step S61, the vector $\beta$ ($\beta^{12959}$ in this example) of the $\beta^{-1664}$ calculator B17 is stored into the even number register R22.

The data elements of the second column of the data frame DF1 are processed next. The vector $\beta^{13823}$ of the odd number line register R21 is provided to the vector register 92. Thereafter, the EDC calculation process of the odd number data frame is performed in the same manner as the EDC calculation process of the even number data frame. When all the data elements of the second column of the data frame DF31 have been subjected to the EDC calculation process, the processing proceeds to step S61. In step S61, the vector $\beta$ of the $\beta^{-1664}$ calculator B17 ($\beta^{-12095}$ in this example) is stored into the odd number line register R23.

Thereafter, the data elements of the third or subsequent column of each data frame included in the first read block RB1 are subjected to the EDC calculation process in the same manner. When the data elements of the last column ($304^{th}$ column) of the last odd number data frame DF31 included in the first read block RB1 are subjected to the EDC calculation process (YES in step S60), the processing proceeds to step S62. In step S62, the selection circuit 97 determines whether the read block that has been subjected to the EDC calculation process is the third read block RB13. When the read block that has been subjected to the EDC calculation process is not the thirteenth read block RB13 (NO in step S62), the processing proceeds to step S63. The selection circuit 97 then determines whether the last read block RB27 has been subjected to the EDC calculation process (step S63). Thereafter, the processing in steps S50 to S63 is repeated until all the data elements included in the read blocks RB2 to RB13 are subjected to the EDC calculation process. When all the data elements included in the thirteenth read block RB13 have been subjected to the EDC calculation process (YES in step S62), the processing proceeds to step S64.

The bit data element of the first row of the first column of each odd number data frame included in the fourteenth read block RB14 is the first bit data element $X^{16415}$, which is provided at the earliest timing of all the data elements of each odd number data frame when the data elements are subjected to the EDC calculation process in the same order as the order used in the EDC appending process. Thus, before the EDC calculation process of the fourteenth read block RB14 is started, the first-degree vector $\beta^{16415}$, which has the same degree as the first bit data element $X^{16415}$ of each odd number data frame, is stored into the odd number register R22 as the initial value in step S64.

Thereafter, the processing in steps S50 to S63 is repeated. The data elements of the fourteenth to twenty seventh read blocks RB14 to RB27 are subjected to the EDC calculation process.

The error correction device of the third embodiment has the advantage described below in addition to the advantages (1) to (13) described in the first and second embodiments.

(14) The EDC syndrome generation circuit 90 includes the sixteen AND circuits A1 to A16 and the vector generation circuit 91. The bit data element $X^k$ that is provided to each of the AND circuits A1 to A16 is multiplied by the vector $\beta^k$ with the desired degree k. This structure enables the EDC syndrome EDCS to be generated without requiring special calculations, such as the first correction calculation and the second correction calculation, which are required in the EDC calculation process of the first and second embodiments.

An optical disc controller 10 (error correction device) according to a fourth embodiment will now be described with reference to FIG. 41. The optical disc controller of the fourth embodiment includes a demodulation circuit 11a, an internal memory unit 12e, and a BIS memory unit 15a instead of the demodulation circuit 11, the internal memory unit 12, and the BIS memory unit 15 of the first embodiment. Also, the BIS memory unit 15a differs in its coupling structure from the BIS memory unit in the second embodiment.

Figure 41:
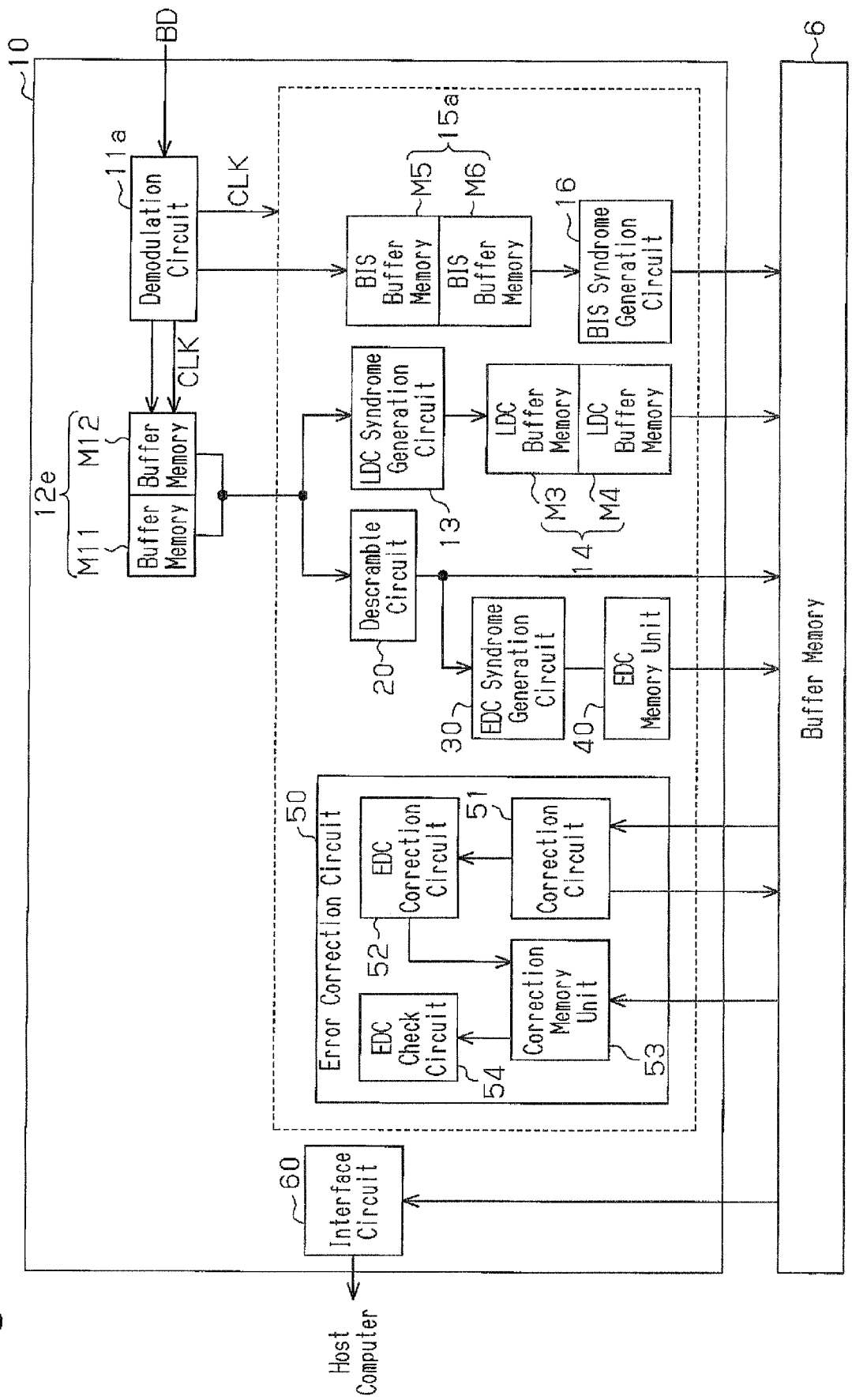
FIG. 41 is a schematic block diagram showing an optical disc controller according to a fourth embodiment.

As shown in FIG. 41, disc data, which is read from a BD 4, is input serially into the demodulation circuit 11a of the optical disc controller 10 via an input and output drive circuit 5 (refer to FIG. 11). The demodulation circuit 11a generates a cluster ECCc (refer to FIG. 7B), which is demodulated data, based on the disc data. The demodulation circuit 11a categorizes the cluster ECCc as a cluster LDCc or a cluster BISc, and stores the cluster LDCc into the internal memory unit 12e (LDC data memory unit) and stores the cluster BISc into the BIS memory unit 15a.

The internal memory unit 12e includes two buffer memories M11 and M12. Each of the buffer memories M11 and M12 has a memory capacity that may store data of a predetermined number of bytes (2432 bytes in the fourth embodiment). In the fourth embodiment, the cluster LDCc (75392 bytes) included in the cluster ECCs is divided into 31 divisional clusters (75392/2432). The 2432-byte data is then stored into each of the buffer memories M11 and M12. In other words, the 16 rows of 152 columns of divisional clusters (2432 bytes), which are generated by dividing the cluster LDCc by every 16 rows, are stored into each of the buffer memories M11 and M12. Each divisional cluster corresponds to a block that is obtained by removing the cluster BISc from the divisional cluster DECC shown in FIG. 13.

The BIS memory unit 15a stores the cluster BISc, which is transferred from the demodulation circuit 11a. The BIS memory unit 15a has the same structure as the BIS memory unit of the first embodiment, and provides the cluster BISc to the BIS syndrome generation circuit 16 after storing the entire data of the cluster BISc.

The error correction device of the fourth embodiment has the advantage described below in addition to the advantages (1) to (10) of the first embodiment.

(15) The cluster BISc transferred from the demodulation circuit 11a is stored directly into the BIS memory unit 15a. This simplifies the circuit structure of the controller 10. Further, the divisional cluster DECC including only the cluster LDCc is stored into the internal memory unit 12e. This may eliminate the need by the BIS memory unit 15a to access the internal memory unit 12e, and reduces the entire amount of access to the internal memory unit 12e.

An optical disc controller 10 (error correction device) according to a fifth embodiment will now be described with reference to FIG. 42. The optical disc controller 10 of the fifth embodiment includes a descramble circuit 115, a BIS syndrome generation circuit 16a, an EDC syndrome generation circuit 30a, a correction circuit 51a, and an EDC correction circuit 52a instead of the descramble circuit 20, the BIS syndrome generation circuit 16, the EDC syndrome generation circuit 30, the correction circuit 51, and the EDC correction circuit 52.

Figure 42:
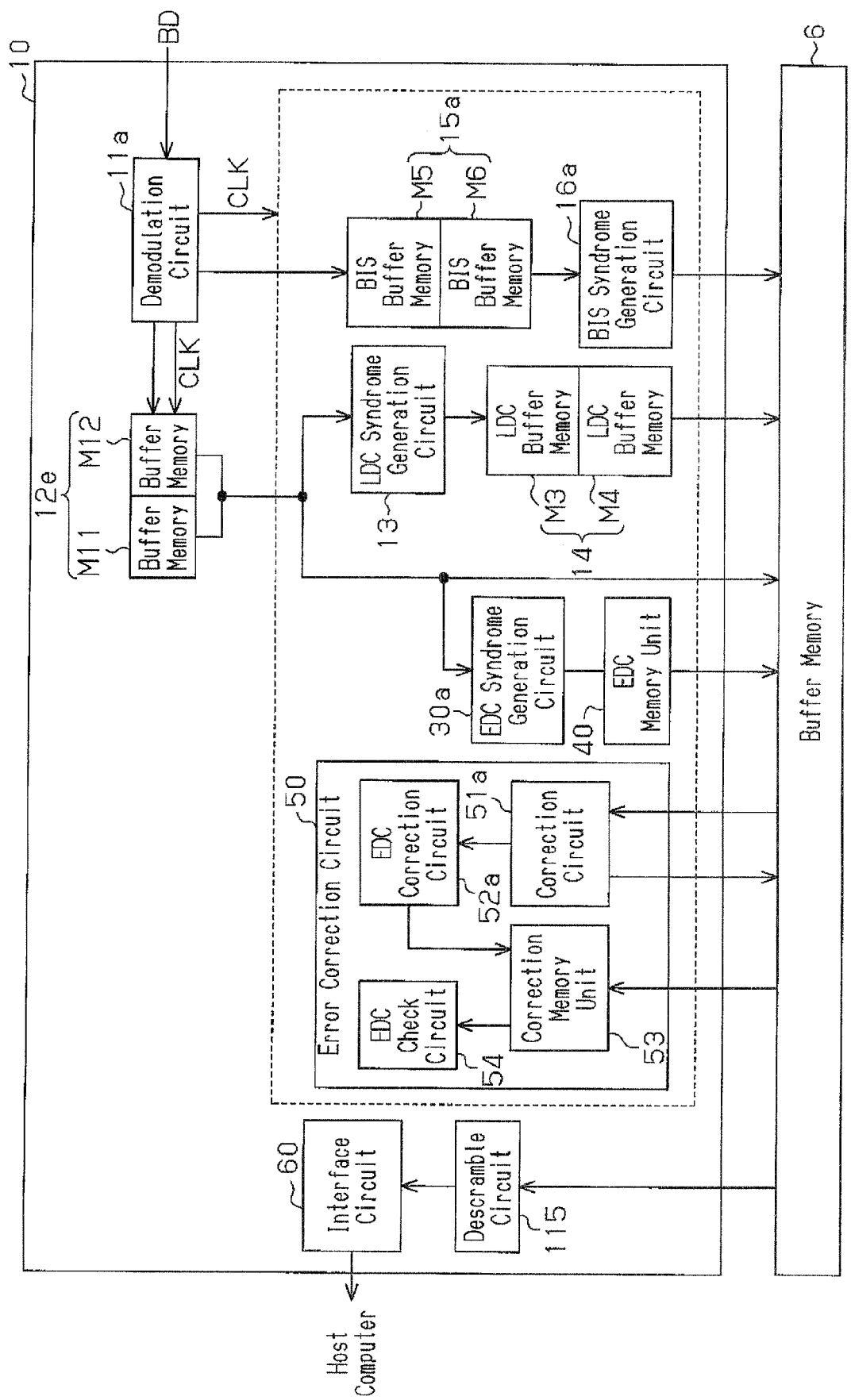
FIG. 42 is a schematic block diagram showing an optical disc controller according to a fifth embodiment.

As shown in FIG. 42, the first to twenty seventh read blocks RB1 to RB27 (scrambled data elements sDu) that are stored serially into an internal memory unit 12e are provided to an external buffer memory 6 and an EDC syndrome generation circuit 30a.

The EDC syndrome generation circuit 30a serially reads the first to twenty-seventh read blocks RB1 to RB27 from the internal memory unit 12e, and generates an EDC syndrome based on the scramble data element sDu of each data frame DF and stores the EDC syndrome into an EDC memory unit 40. The EDC syndrome generation circuit 30a has substantially the same structure as the EDC syndrome generation circuit 30 shown in FIG. 18. However, the EOR circuit 31 is provided with the scramble data element sDu (byte data) from the internal memory unit 12e instead the descramble data element dDu. The EDC syndrome generation circuit 30a may be replaced by an EDC syndrome generation circuit 80 shown in FIG. 33 or an EDC syndrome generation circuit 90 shown in FIG. 37.

The EDC memory unit 40 stores the final EDC syndrome of the scramble data element sDu of each data frame DF into the external buffer memory 6 in the same manner as in the first embodiment.

The BIS syndrome generation circuit 16a reads a cluster BISc from the BIS memory unit 15a, and generates a BIS syndrome based on the cluster BISc. The BIS syndrome generation circuit 16a stores the BIS syndrome and the cluster BISc into the external buffer memory 6.

The correction circuit 51a included in the error correction circuit 50 subjects the data frame DF, which includes the scramble data element sDu stored in the external buffer memory 6, to error correction based on the LED syndrome and the BIS syndrome read from the external buffer memory 6. The correction circuit 51a calculates an error position and an error value based on each syndrome, and provides the error position and the error value to the EDC correction circuit 52a. The correction circuit 51a reads the scramble value (initial value S0) included in the cluster BISc that has been subjected to the error correction from the external buffer memory 6, and provides the initial value S0 to the EDC correction circuit 52a.

The EDC correction circuit 52a calculates a scramble value SC based on the initial value S0, which is provided from the correction circuit 51a. The EDC correction circuit 52a performs the EDC syndrome correction based on the calculated scramble value SC, in addition to the EDC syndrome correction performed based on the error position and the error value provided from the correction circuit 51.

When the EDC checking circuit 54 determines that the error correction has been completed successfully, the descramble circuit 115 with the same structure as the conventional descramble circuit reads the scramble data elements sDu that have been subjected to the error correction from the external buffer memory 6 in the same order as the order used in the scrambling process. The descramble circuit 115 reads the scramble value (initial value S0) in the cluster BISc that has been subjected to the error correction from the external buffer memory 6, and serially generates the scramble values SC based on the initial value S0. The descramble circuit 115 then serially descrambles the read scramble data elements sDu, and outputs the descramble data elements dDu to the interface circuit 60.

The error correction device of the fifth embodiment has the advantage described below in addition to the advantage (15) in the fourth embodiment.

(16) The descramble circuit 20 of the fourth embodiment performs the descrambling process using, as the scramble value, address information of the BD 4, which is used by the demodulation circuit 11a when reading data, or a value in the cluster BISc that has not yet undergone the error correction. In this case, when the data may contain an error before the data is subjected to the error correction, the address information used by the demodulation circuit 11 is used as the scramble value SC. However, when the demodulation circuit 11 fails to read the address correctly, the scramble value SC used by the demodulation circuit 11 may be an erroneous scramble value SC. In this case, the descrambling process may be performed incorrectly although the error correction and the EDC checking are completed successfully.

To solve this problem, the descramble circuit 115 of the fifth embodiment uses the value in the cluster BISc that has been subjected to the error correction as the scramble value SC. In this case, the descramble circuit 115 descrambles the data whose error correction and EDC checking have been completed by the error correction circuit 50. This enables more correct data to be transmitted to a host computer.

It should be apparent to those skilled in the art that the aforementioned embodiments may be embodied in many other specific forms without departing from the spirit or scope of the embodiments. Particularly, it should be understood that the embodiments may be embodied in the following forms.

Figure 43:
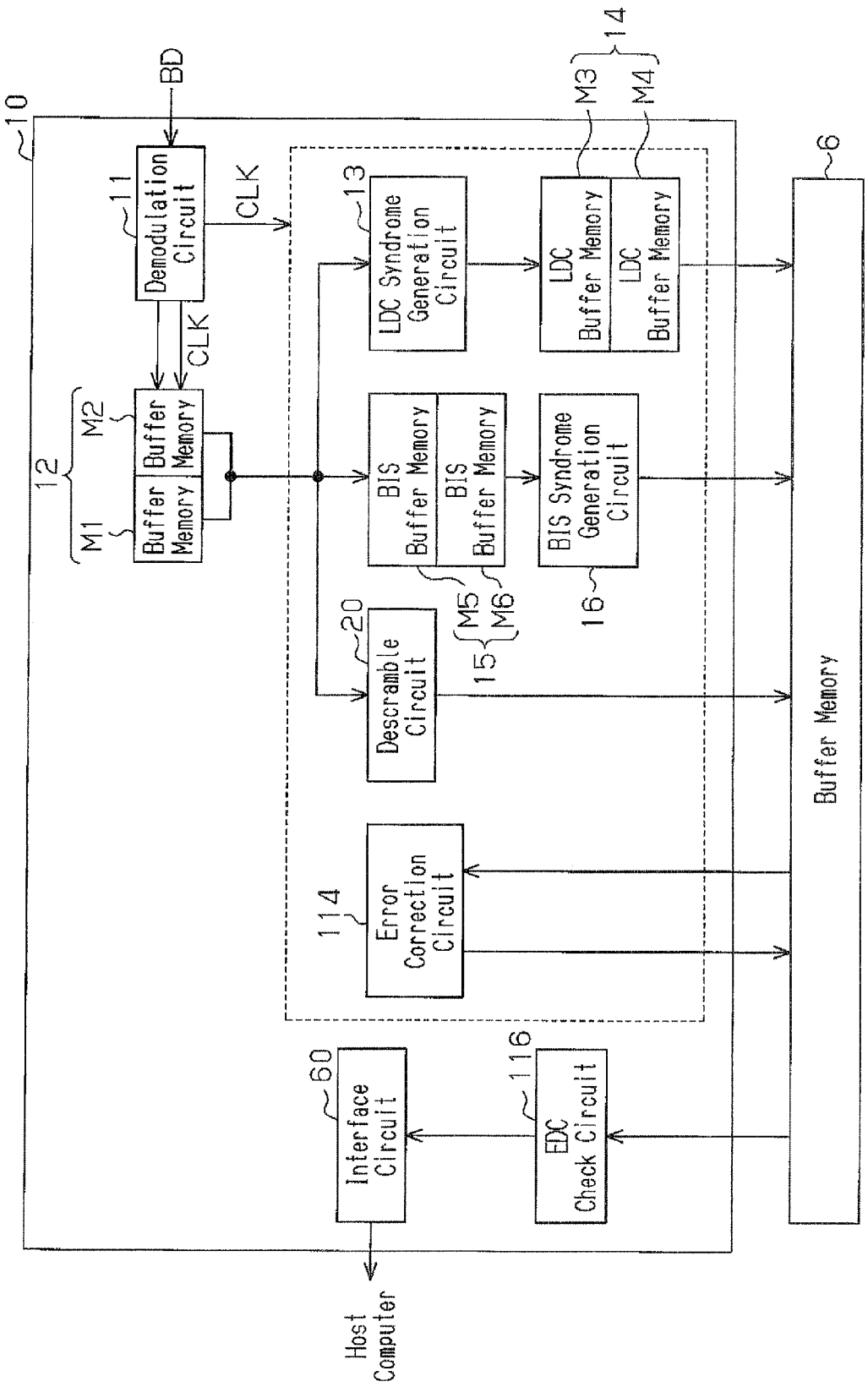
FIG. 43 is a schematic block diagram showing an optical disc controller according to another example.

In the above embodiments, the EDC syndrome generation circuits 30, 80, and 90 generate the EDC syndromes EDCS based on the descramble data elements dDu input from the descramble circuits 20 and 70. However, the embodiments should not be limited to this structure. For example, as shown in FIG. 43, an EDC checking circuit 116 may have the same structure as the conventional EDC checking circuit. The EDC checking circuit 116 with this structure also performs the EDC checking (EDC syndrome generation) based on the descramble data that has been subjected to the error correction.

The controller 10 of the fourth and fifth embodiments may include the descramble circuit 70 and the EDC syndrome generation circuit 80 of the second embodiment or the EDC syndrome generation circuit 90 of the third embodiment.

In the first embodiment, the descramble circuit 20 and the EDC syndrome generation circuit 30 may access the internal memory unit 12 independently of each other. In this case, the scramble data element sDu in the divisional cluster DECC is input from the internal memory unit 12 into the EOR circuit 21 of the descramble circuit 20 and the EOR circuit 31 of the EDC syndrome generation circuit 30 at substantially the same timing.

In each of the above embodiments, the size of the divisional cluster DECC stored in each of the buffer memories M1 and M2 of the internal memory unit 12 should not be limited to any particular size. For example, the divisional cluster DECC may have a data size of 32 rows of 155 columns. In this case, each of the buffer memories M1 and M2 included in the internal memory unit 12 is required to have a memory capacity that may store a single divisional cluster DECC. In this case, the number of rows of a single read block RB is changed. When the number of rows of the read block RB is changed, the numbers of shift bytes (shift bit number) of the 209-shift calculator 25 of the descramble circuits 20 and 70, the 209-shift calculator 35 of the EDC syndrome generation circuits 30 and 80, and the $\beta^{-1664}$ calculator B17 of the EDC syndrome generation circuit 90 are changed.

The data processing order used in the descramble circuit 70 of the third embodiment may be changed to the same data processing order as the order used in the first embodiment. More specifically, the descramble circuit 70 of the third embodiment may read the scramble data elements in the same order as the data arrangement order of the data elements of each read block DB, and may perform the descrambling process in the order in which the scramble data elements are read. In this case, the even number line register R22 and the odd number line register R23 of the EDC syndrome generation circuit 90 may be eliminated.

The data processing order used in the descramble circuit 70 of the second and third embodiments should not be limited to the order described above. For example, as shown in FIG. 34A, the data elements of the first column may be first subjected to the descrambling process in the order of the data frames DF0, DF4, DF8, DF12, DF16, DF20, DF24, and DF28 (even number data frame group). The data elements of the first column may then be subjected to the descrambling process in the order of the data frames DF1, DF5, DF9, DF13, DF17, DF21, DF25, and DF29 (odd number data frame group).

Alternatively, the descramble circuit 70 may subject the data elements of the second column of the even number data frame group to the descrambling process after subjecting the data elements of the first column of the even number data frame group to the descrambling process shown in FIGS. 34A and 34B. More specifically, the descramble circuit 70 may start the descrambling process of the odd number data frame after completing the descrambling process of all the even number data frames. In this case, the even-numbered work register R4 and the odd-numbered work register R5 included in the descramble circuit 70 of the second embodiment may be changed to a common work register. In the same manner, the even number line register R22 and the odd number line register R23 included in the EDC syndrome generation circuit 90 of the third embodiment may be changed to a common line register.

In each of the above embodiments, the size of each data frame DF stored in the external buffer memory 6 should not be limited to a block size of 32 rows of 64 columns. For example, the size of each data frame DF may be a block size of 64 rows of 32 columns. In this case, all the even number data frames may be stored in the row direction of the external buffer memory 6. Further, all the odd number data frames may be stored in the row direction of the external buffer memory 6. This enables the descramble circuit 70 to store the 128-byte (8 by 16) descramble data elements into the same row after descrambling the scramble data elements in the same column of, for example, each of the data frames DF0, DF2, DF4, DF6, ..., DF28, and DF30 in a continuous manner.

The descramble circuits 20 and 70 of the first and second embodiments may not include the 108-shift calculator 26. In this case, for example, the scramble value S0*$\beta^{108}$ obtained by shifting the initial value S0 of the scramble value SC by 108 bytes in accordance with the generation polynomial $\Phi(x)$ is prepared in advance in a memory.

The descramble circuits 20 and 70 of the first and second embodiments may not include the even number register R2 and the odd number register R3. Alternatively, the EDC syndrome generation circuit 90 of the third embodiment may not include the even number register R20 and the odd number register R21. In this case, the scramble values SC (vector $\beta^k$) of the first scramble data element (first bit data element) of the first row of the first column of each even number data frame and each odd number data frame are stored in advance in a memory.

The EDC syndrome generation circuits 30 and 80 of the first and second embodiments may not include the –211-shift calculator 37. In this case, the EDC syndrome generation circuit may calculate the EDC calculated value E14(76) of the first to fourteenth read blocks RB1 to RB14 or the EDC calculated value E14(76) of the byte data element $X^0$ input to the EOR circuit 31 independently of the intermediate value EDCs. Subsequently, the EDC syndrome generation circuit subjects the data elements of the fifteenth to twenty seventh read blocks RB15 to RB27 to the EDC calculation process without reading the EDC calculated value E14(76). Finally, the EDC syndrome generation circuit subjects the EDC calculated value E14(76) of the byte data element $X^8$ of the last row of the last column of each even number data frame included in the twenty seventh read block RB27 to the first correction calculation, and performs an exclusive OR operation on the calculation result and the EDC calculated value E14(76) to generate the EDC syndrome EDCS using the equation (1) in the same manner as described above.

The correction memory unit 53 may be eliminated in each of the above embodiments. In this case, the EDC correction circuit 52 corrects the EDC syndrome EDCS while reading the EDC syndrome EDCS from the external buffer memory 6.

In the above embodiments, the internal memory unit 12, the LDC memory unit 14, the BIS memory unit 15, and the EDC memory unit 40 should not be limited to the structures shown in FIG. 15. Preferably, each of the memory units 12, 14, 15, and 40 uses one buffer memory to store data (to store a syndrome) and uses the other buffer memory for access purpose (to output data or to output a syndrome).

In each of the above embodiments, each of the internal memory unit 12, the LDC memory unit 14, the BIS memory unit 15, and the EDC memory unit 40 may be formed by a single buffer memory or by three or more buffer memories. When each memory unit is formed by a single buffer memory, the buffer memory preferably stores data and reads data in parallel.

The LDC memory unit 14 may be eliminated in each of the above embodiments. In this case, the LDC syndrome generation circuit 13 preferably includes LDC syndrome calculators corresponding to all columns (304 columns) of the parity-appended block PB in the LDC syndrome generation circuit 13. Also, the intermediate value of the LDC syndrome generated by the LDC syndrome generation circuit 13 may be stored into the external buffer memory 6.

The BIS memory unit 15 may be eliminated in each of the above embodiments. In this case, the BIS syndrome generation circuit 16 directly reads the cluster BISc from the internal memory unit 12. In this case, for example, the intermediate value of the BIS syndrome generated by the BIS syndrome generation circuit 16 is stored into the external buffer memory 6. Also, a syndrome memory for storing an intermediate value of a BIS syndrome may be arranged between the BIS syndrome generation circuit 16 and the external buffer memory 6.

The EDC memory unit 40 may be eliminated in each of the above embodiments. In this case, EDC syndrome calculators (for example, the EOR circuit 31 or various calculators 34 to 37) corresponding to all data frames (30 data frames) are preferably arranged in the EDC syndrome generation circuits 30, 80, and 90.

Therefore, the present examples and embodiments are to be considered as illustrative and not restrictive and the invention is not to be limited to the details given herein, but may be modified within the scope and equivalence of the appended claims.

An error correction device and a descramble circuit that reduce the amount of access to an external memory while preventing the circuit scale of the device and the circuit from increasing due to the need to increase the capacity of an internal memory is provided.

One aspect is an error correction device including a demodulation circuit which demodulates modulated data to generate a cluster. The cluster includes a parity-appended block that has been subjected to interleaving. The parity-appended block includes a data block, which has a plurality of data elements arranged in rows and columns to form a predetermined number of data frames, and a parity, which is appended to the data block in a column direction. The data block includes scramble data that is generated by scrambling each data frame. An internal memory unit stores at least one of a plurality of divisional clusters divided from the cluster. A syndrome calculation result generation circuit reads the parity-appended block while de-interleaving each of the plurality of divisional clusters using the internal memory unit and generating a syndrome calculation result for each column of the parity-appended block. A descramble circuit reads the data block as a plurality of read blocks while de-interleaving each of the plurality of divisional clusters using the internal memory unit and descrambles the scramble data of each read block to generate descramble data. An error correction circuit performs error correction on the descramble data based on the syndrome calculation result. The descramble circuit includes a first exclusive OR circuit which applies a predetermined scramble value to a data element of the descramble data read from the internal memory unit to calculate the data element of the scramble data. A first shift calculator generates a first calculated value by shifting the scramble value by one byte in accordance with a first generation polynomial. A second shift calculator generates a second calculated value by shifting the scramble value by a number of bytes corresponding to {(total number of bytes of the data block in the column direction)+1−(total number of bytes of each read block in the column direction)} in accordance with the first generation polynomial. A first selector provides the first exclusive OR circuit, the first shift calculator, and the second shift calculator with the first calculated value or the second calculated value as the scramble value in accordance with the data element of the scramble data that is input to the first exclusive OR circuit.

A further aspect is an error correction device including a demodulation circuit which demodulates modulated data to generate a cluster. The cluster includes a parity-appended block that has been subjected to interleaving. The parity-appended block includes a data block, which has a plurality of data elements arranged in rows and columns to form a predetermined number of data frames, and a parity, which is appended to the data block in a column direction. The data block includes scramble data that is generated by scrambling each data frame. An internal memory unit stores at least one of a plurality of divisional clusters divided from the cluster. A syndrome calculation result generation circuit reads the parity-appended block while de-interleaving each of the plurality of divisional clusters using the internal memory unit and generates a syndrome calculation result for each column of the parity-appended block. An EDC syndrome generation circuit reads the data block as a plurality of read blocks while de-interleaving each of the divisional clusters using the internal memory unit and generating an error detecting code syndrome or an intermediate value of the error detecting code syndrome based on the scramble data of each read block. An EDC memory unit stores the error detecting code syndrome or the intermediate value of the error detecting code syndrome generated by the EDC syndrome generation circuit. An error correction circuit performs error correction on the scramble data based on the syndrome calculation result. The EDC syndrome generation circuit includes a first exclusive OR circuit which receives a 1-byte data element of the scramble data from the internal memory unit and performs an exclusive OR operation on the 1-byte data element and a predetermined shift calculated value to generate an error detecting code calculated value. A first weighting circuit generates a first weighted value by shifting weighting of the error detecting code calculated value by one byte in accordance with a second generation polynomial and stores the first weighted value into the EDC memory unit. A second weighting circuit generates a second weighted value by shifting weighting of the error detecting code calculated value by a number of bytes corresponding to {(total number of bytes of the data block in the column direction)+1−(total number of bytes of each read block in the column direction)} in accordance with the second generation polynomial. A third weighting circuit generates a third weighting value by shifting weighting of the error detecting code calculated value by 108 bytes in accordance with the second generation polynomial and stores the third weighted value into the EDC memory unit as the error detecting code syndrome. A second exclusive OR circuit performs an exclusive OR operation on the first weighted value and the second weighted value to generate a fourth weighted value. A selector provides the first exclusive OR circuit with one selected from a group consisting of the first weighted value, the second weighted value, and the fourth weighted value as the shift calculated value in accordance with the data element of the scramble data that is input to the first exclusive OR circuit.

Another aspect is an error correction device including a demodulation circuit which demodulates modulated data to generate a cluster. The cluster includes a parity-appended block that has been subjected to interleaving. The parity-appended block includes a data block, which has a plurality of data elements arranged in rows and columns to form a predetermined number of data frames, and a parity, which is appended to the data block in a column direction. The data block includes scramble data that is generated by scrambling each data frame. An internal memory unit stores at least one of a plurality of divisional clusters divided from the cluster. A syndrome calculation result generation circuit reads the parity-appended block while de-interleaving each of the plurality of divisional clusters using the internal memory unit and generates a syndrome calculation result for each column of the parity-appended block. An EDC syndrome generation circuit reads the data block as a plurality of read blocks while de-interleaving each of the divisional clusters using the internal memory unit and generates an error detecting code syndrome or an intermediate value of the error detecting code syndrome based on the scramble data of each read block. An EDC memory unit stores the error detecting code syndrome or the intermediate value of the error detecting code syndrome generated by the EDC syndrome generation circuit. An error correction circuit performs error correction on the scramble data based on the syndrome calculation result. The EDC syndrome generation circuit includes a vector generation circuit which calculates a vector that is a weighting coefficient for the error detecting code syndrome. The vector generation circuit includes an N number of first inverse-shift calculators, which are connected in series, generate a first vector by inversely shifting an input vector that is input to an initial-stage first inverse-shift calculator by N bits in accordance with a second generation polynomial, and outputs the first vector from a last-stage first inverse-shift calculator. A second inverse-shift calculator generates a second vector by inversely shifting the first vector by a number of bits corresponding to {(total number of bits of the data block in the column direction)−(total number of bits of each read block in the column direction) in accordance with the second generation polynomial. An N number of AND circuits each generate a calculation result based on a vector input value that is input to a corresponding one of the N number of first inverse-shift calculators in accordance with the input vector and a corresponding one of N-bit data elements of the descramble data that are serially provided from the descramble circuit. An exclusive OR circuit performs an exclusive OR operation on an N number of calculation results of the N number of AND circuits and generates an intermediate value of the error detecting code syndrome. A selector provides the initial-stage first inverse-shift calculator with the first vector or the second vector as the input vector in accordance with a data element of the descramble data that is input to each of the N number of AND circuits.

Still another aspect is a reading device for reading demodulated data that has been written to an optical disc. The reading device is provided with an error correction device including a demodulation circuit which demodulates modulated data to generate a cluster. The cluster includes a parity-appended block that has been subjected to interleaving. The parity-appended block includes a data block, which has a plurality of data elements arranged in rows and columns to form a predetermined number of data frames, and a parity, which is appended to the data block in a column direction. The data block includes scramble data that is generated by scrambling each data frame. An internal memory unit stores at least one of a plurality of divisional clusters divided from the cluster. A syndrome calculation result generation circuit reads the parity-appended block while de-interleaving each of the plurality of divisional clusters using the internal memory unit and generating a syndrome calculation result for each column of the parity-appended block. A descramble circuit reads the data block as a plurality of read blocks while de-interleaving each of the plurality of divisional clusters using the internal memory unit and descrambles the scramble data of each read block to generate descramble data. An error correction circuit performs error correction on the descramble data based on the syndrome calculation result. The descramble circuit includes a first exclusive OR circuit which applies a predetermined scramble value to a data element of the descramble data read from the internal memory unit to calculate the data element of the scramble data. A first shift calculator generates a first calculated value by shifting the scramble value by one byte in accordance with a first generation polynomial. A second shift calculator generates a second calculated value by shifting the scramble value by a number of bytes corresponding to {(total number of bytes of the data block in the column direction)+ 1−(total number of bytes of each read block in the column direction)} in accordance with the first generation polynomial. A first selector provides the first exclusive OR circuit, the first shift calculator, and the second shift calculator with the first calculated value or the second calculated value as the scramble value in accordance with the data element of the scramble data that is input to the first exclusive OR circuit.

Yet a further aspect is a descramble circuit for generating descramble data from scramble data read from an optical disc. The descramble circuit includes an exclusive OR circuit which calculates a data element of the descramble data by applying a predetermined scramble value to a data element of the scramble data. The scramble data is stored in the optical disc in data block including a plurality of data elements arranged in rows and columns. The descramble circuit reads the scramble data of the data block as a plurality of read blocks. A first shift calculator generates a first calculated value by shifting the scramble value by one byte in accordance with a first generation polynomial. A second shift calculator generates a second calculated value by shifting the scramble value by a number of bytes corresponding to {(total number of bytes of the data block in the column direction)+ 1−(total number of bytes of each read block in the column direction)} in accordance with the first generation polynomial. A selector provides the first exclusive OR circuit, the first shift calculator, and the second shift calculator with the first calculated value or the second calculated value as the scramble value in accordance with the data element of the scramble data that is input to the first exclusive OR circuit.

Other aspects and advantages will become apparent from the following description, taken in conjunction with the accompanying drawings, illustrating by way of example the principles of the embodiments.

In an error correction device of aforementioned embodiment, the EDC syndrome generation circuit may include a vector generation circuit which generates a vector that is a weighting coefficient for the error detecting code syndrome, the vector generation circuit having, an N number of first inverse-shift calculators which are coupled in series, generate a first vector by inversely shifting an input vector that is input to an initial-stage first inverse-shift calculator by N bits in accordance with a second generation polynomial, and output the first vector from a last-stage first inverse-shift calculator, and a second inverse-shift calculator which generates a second vector by inversely shifting the first vector by a number of bits corresponding to {(total number of bits of the data block in the column direction)−(total number of bits of each read block in the column direction)} in accordance with the second generation polynomial, an N number of AND circuits, each of which generates a calculation result based on a vector input value that is input to a corresponding one of the N first inverse-shift calculators in accordance with the input vector and a corresponding one of N-bit data elements of the descramble data serially provided from the descramble circuit, a fourth exclusive OR circuit which performs an exclusive OR operation on an N number of calculation results of the N number of AND circuits and generates an intermediate value of the error detecting code syndrome, and a third selector for providing the initial-stage first inverse-shift calculator with the first vector or the second vector as the input vector in accordance with a data element of the descramble data that is input to each of the N number of AND circuits.

In an error correction device of aforementioned embodiment, the predetermined number of data frames may include a plurality of even number data frames and a plurality of odd number data frames that are arranged alternately in the data block, with the plurality of even number data frames including a head data frame that is processed first in the predetermined number of data frames, the EDC syndrome generation circuit further including a second even number register which stores the first vector that is calculated based on a vector by which a last bit arranged in a last row of a first column of a single even number data frame in each read block is multiplied, and a second odd number register which stores the first vector that is calculated based on a vector by which a last bit arranged in a last row of a first column of a single odd number data frame in each read block is multiplied, and the third selector provides the initial-stage first inverse-shift calculator with one selected from a group consisting of the first vector output from the last-stage first inverse-shift calculator, the second vector output from the second inverse-shift calculator, the first vector stored in the second even number register, and the first vector stored in the second odd number register as the input vector in accordance with the data element of the descramble data that is input to each of the N number of AND circuits.

In an error correction device of aforementioned embodiment, the second even number register may store a 16415-degree first initial vector that is generated in accordance with the second generation polynomial when a calculation process of the error detecting code is started, and the second odd number register stores a 15551-degree second initial vector that is generated in accordance with the second generation polynomial when the calculation process of the error detecting code is started.

In an error correction device of aforementioned embodiment, the EDC syndrome generation circuit may further include an even number line register which stores the second vector that is calculated based on a vector by which a last bit arranged in a last row of each column of a single even number data frame in each read block is multiplied, and an odd number line register which stores the second vector that is calculated based on a vector by which a last bit arranged in a last row of each column of a single odd number data frame in each read block is multiplied, and the third selector provides the initial-stage first inverse-shift calculator with one selected from a group consisting of the first vector output from the last-stage first inverse-shift calculator, the first vector stored in the second even number register, the first vector stored in the second odd number register, the second vector stored in the even number line register, and the second vector stored in the odd number line register as the input vector in accordance with the data element of the descramble data that is input to the N number of AND circuits.

In an error correction device of aforementioned embodiment, the third selector may select the first vector stored in the second even number register when an N-bit data element including a bit arranged in a first row of a first column of each even number data frame in each read block is input to the N number of AND circuits, select the first vector stored in the second odd number register when an N-bit data element including a bit arranged in a first row of a first column of each odd number data frame in each read block is input to the N number of AND circuits, select the second vector stored in the even number line register when an N-bit data element including a bit arranged in a first row of a second or subsequent column of each even number data frame in each read block is input to the N number of AND circuits, select the second vector stored in the odd number line register when an N-bit data element including a bit arranged in a first row of a second or subsequent column of each odd number data frame in each read block is input to the N number of AND circuits and select the first vector output from the last-stage first inverse-shift calculator when an N-bit data element including a bit arranged in an (N+1)th row of each column of each data frame in each read block is input to the N number of AND circuits.

In an error correction device of aforementioned embodiment may further includes an EDC syndrome generation circuit which generates an error detecting code syndrome based on the descramble data that has been undergone the error correction.

In an error correction device of aforementioned embodiment, the cluster may include a long-distance code cluster and a burst indicator subcode cluster, and each divisional cluster includes at least part of the long-distance code cluster, the error correction device further including a BIS memory unit which stores the burst indicator subcode cluster, and a BIS syndrome generation circuit for reading the burst indicator subcode cluster from the BIS memory unit and generating a burst indicator subcode syndrome based on the burst indicator subcode cluster.

In an error correction device of aforementioned embodiment, the internal memory unit may include a first buffer memory and a second buffer memory that are used in parallel, and when the first buffer memory is used as a storage buffer for storing a single divisional cluster, the second buffer memory is used as an access buffer for reading a single divisional cluster previously stored in the second buffer memory.

In an error correction device of aforementioned embodiment, the cluster may include a long-distance code cluster and a burst indicator subcode cluster, each divisional cluster may include part of the long-distance code cluster and part of the burst indicator subcode cluster, and the internal memory unit may include a first buffer memory and a second buffer memory that are used in parallel and when the first buffer memory may be used as a storage buffer for storing a single divisional cluster, the second buffer memory is used as an access buffer for reading a single divisional cluster previously stored in the second buffer memory.

An error correction device of aforementioned embodiment may include a BIS memory unit which stores the burst indicator subcode cluster of at least the single divisional cluster, and a BIS syndrome generation circuit which reads the burst indicator subcode cluster from the BIS memory unit and generates a burst indicator subcode syndrome based on the burst indicator subcode cluster.

In an error correction device of aforementioned embodiment, the BIS memory unit may include a first BIS buffer memory and a second BIS buffer memory that are used in parallel, and when the first BIS buffer memory may be used as a storage buffer for storing a burst indicator subcode cluster of the single divisional cluster, the second BIS buffer memory is used as an access buffer for reading a burst indicator subcode cluster of the single divisional cluster previously stored in the second BIS buffer memory.

An error correction device of aforementioned embodiment may include an LDC memory unit which stores an intermediate value of the syndrome calculation result generated by the syndrome calculation result generation circuit.

In an error correction device of aforementioned embodiment, the LDC memory unit may include a first long-distance code buffer memory and a second long-distance code buffer memory that are used in parallel; and when the first LDC buffer memory may be used as a storage buffer for storing an intermediate value of the syndrome calculation result, the second LDC buffer memory is used as an access buffer for reading the intermediate value last stored into the second LDC buffer memory as the syndrome calculation result.

An error correction device of aforementioned embodiment may include a correction memory unit which stores the error detecting code syndrome that is generated by the EDC syndrome generation circuit, wherein the error correction circuit may include an EDC correction circuit which calculates an error position and an error value of scramble data of each data frame based on the syndrome calculation result and corrects the error detecting code syndrome based on the error position and the error value.

An error correction device of another embodiments includes a demodulation circuit which demodulates modulated data to generate a cluster, wherein: the cluster includes a parity-appended block that has been subjected to interleaving, with the parity-appended block including a data block, which has a plurality of data elements arranged in rows and columns to form a predetermined number of data frames, and a parity, which is appended to the data block in a column direction, with the data block including scramble data that is generated by scrambling each data frame, and an internal memory unit which stores at least one of a plurality of divisional clusters divided from the cluster, a syndrome calculation result generation circuit which reads the parity-appended block while de-interleaving each of the plurality of divisional clusters using the internal memory unit and generates a syndrome calculation result for each column of the parity-appended block, an EDC syndrome generation circuit which reads the data block as a plurality of read blocks while de-interleaving each of the divisional clusters using the internal memory unit and generating an error detecting code syndrome or an intermediate value of the error detecting code syndrome based on the scramble data of each read block, an EDC memory unit which stores the error detecting code syndrome or the intermediate value of the error detecting code syndrome generated by the EDC syndrome generation circuit, and an error correction circuit which performs error correction on the scramble data based on the syndrome calculation result, wherein the EDC syndrome generation circuit includes a first exclusive OR circuit which receives a 1-byte data element of the scramble data from the internal memory unit and performs an exclusive OR operation on the 1-byte data element and a predetermined shift calculated value to generate an error detecting code calculated value, a first weighting circuit which generates a first weighted value by shifting weighting of the error detecting code calculated value by one byte in accordance with a second generation polynomial and stores the first weighted value into the EDC memory unit, a second weighting circuit which generates a second weighted value by shifting weighting of the error detecting code calculated value by a number of bytes corresponding to {(total number of bytes of the data block in the column direction)+1−(total number of bytes of each read block in the column direction)} in accordance with the second generation polynomial, a third weighting circuit which generates a third weighting value by shifting weighting of the error detecting code calculated value by 108 bytes in accordance with the second generation polynomial and stores the third weighted value into the EDC memory unit as the error detecting code syndrome, a second exclusive OR circuit which performs an exclusive OR operation on the first weighted value and the second weighted value to generate a fourth weighted value, and a selector which provides the first exclusive OR circuit with one selected from a group consisting of the first weighted value, the second weighted value, and the fourth weighted value as the shift calculated value in accordance with the data element of the scramble data that is input to the first exclusive OR circuit.

In an aforementioned embodiment, the EDC memory unit is coupled to an external memory, and the error correction circuit includes a correction memory unit which stores the error detecting code syndrome that has been transferred from the EDC syndrome generation circuit via the EDC memory unit and stored into the external memory, a correction circuit which calculates an error position and an error value of the scramble data in each data frame based on the syndrome calculation result, and an EDC correction circuit which corrects the error detecting code syndrome based on the error position and the error value of the scramble data and a scramble value used to generate the scramble data.

In an aforementioned embodiment, the cluster includes a burst indicator subcode cluster, and the EDC correction circuit uses a value in the burst indicator subcode cluster as the scramble value.

In an aforementioned embodiment, the EDC syndrome generation circuit reads a data element of the scramble data in each read block in accordance with an arrangement of the data elements in the data block.

In an aforementioned embodiment, the EDC syndrome generation circuit is coupled to an external memory storing the predetermined number of data frames in rows and columns, and the EDC syndrome generation circuit serially reads data elements of the scramble data arranged in the same column of a selected number of data frames among the predetermined number of data frames in each read block and stores the selected number of data frames into the same row of the external memory.

In an aforementioned embodiment, the EDC syndrome generation circuit further includes a fourth weighting circuit which generates a fifth weighted value by inversely shifting weighting of the error detecting code calculated value by 211 bytes in accordance with the second generation polynomial and stores the fifth weighted value into the EDC memory unit as an intermediate value of the error detecting code syndrome.

An error correction device of another embodiments includes a demodulation circuit which demodulates modulated data to generate a cluster, wherein the cluster includes a parity-appended block that has been subjected to interleaving, the parity-appended block includes a data block, which has a plurality of data elements arranged in rows and columns to form a predetermined number of data frames, and a parity, which is appended to the data block in a column direction, and the data block includes scramble data that is generated by scrambling each data frame, an internal memory unit which stores at least one of a plurality of divisional clusters divided from the cluster, a syndrome calculation result generation circuit which reads the parity-appended block while de-interleaving each of the plurality of divisional clusters using the internal memory unit and generates a syndrome calculation result for each column of the parity-appended block, an EDC syndrome generation circuit which reads the data block as a plurality of read blocks while de-interleaving each of the divisional clusters using the internal memory unit and generates an error detecting code syndrome or an intermediate value of the error detecting code syndrome based on the scramble data of each read block, an EDC memory unit which stores the error detecting code syndrome or the intermediate value of the error detecting code syndrome generated by the EDC syndrome generation circuit, and an error correction circuit which performs error correction on the scramble data based on the syndrome calculation result, wherein the EDC syndrome generation circuit includes a vector generation circuit which calculates a vector that is a weighting coefficient for the error detecting code syndrome, with the vector generation circuit including an N number of first inverse-shift calculators, which are coupled in series, generate a first vector by inversely shifting an input vector that is input to an initial-stage first inverse-shift calculator by N bits in accordance with a second generation polynomial, and outputs the first vector from a last-stage first inverse-shift calculator, and a second inverse-shift calculator which generates a second vector by inversely shifting the first vector by a number of bits corresponding to {(total number of bits of the data block in the column direction)−(total number of bits of each read block in the column direction) in accordance with the second generation polynomial, an N number of AND circuits, each of which generates a calculation result based on a vector input value that is input to a corresponding one of the N number of first inverse-shift calculators in accordance with the input vector and a corresponding one of N-bit data elements of the descramble data that are serially provided from the descramble circuit, an exclusive OR circuit which performs an exclusive OR operation on an N number of calculation results of the N number of AND circuits and generates an intermediate value of the error detecting code syndrome, and a selector which provides the initial-stage first inverse-shift calculator with the first vector or the second vector as the input vector in accordance with a data element of the descramble data that is input to each of the N number of AND circuits.

Example embodiments of the present invention have now been disclosed in accordance with the above advantages. It will be appreciated that these examples are merely illustrative of the invention. Numbers applying embodiments (first, second or third etc.) do not show priorities of the embodiments. Many variations and modifications will be apparent to those skilled in the art.

What is claimed is:

1. An error correction device comprising:
   a demodulation circuit which demodulates modulated data to generate a cluster, wherein the cluster includes a parity-appended block that has been subjected to interleaving, the parity-appended block includes a data block, which has a plurality of data elements arranged in rows and columns to form a predetermined number of data frames, and a parity, which is appended to the data block in a column direction, and the data block includes scramble data that is generated by scrambling each data frame;
   an internal memory unit which stores at least one of a plurality of divisional clusters divided from the cluster;
   a syndrome calculation result generation circuit which reads the parity-appended block while de-interleaving each of the plurality of divisional clusters using the internal memory unit and generating a syndrome calculation result for each column of the parity-appended block;
   a descramble circuit which reads the data block as a plurality of read blocks while de-interleaving each of the plurality of divisional clusters using the internal memory unit and descrambles the scramble data of each read block to generate descramble data; and
   an error correction circuit which performs error correction on the descramble data based on the syndrome calculation result;
   wherein the descramble circuit includes:
      a first exclusive OR circuit which applies a predetermined scramble value to a data element of the descramble data read from the internal memory unit to calculate the data element of the scramble data;
      a first shift calculator which generates a first calculated value by shifting the scramble value by one byte in accordance with a first generation polynomial;
      a second shift calculator which generates a second calculated value by shifting the scramble value by a number of bytes corresponding to {(total number of bytes of the data block in the column direction)+1−(total number of bytes of each read block in the column direction)} in accordance with the first generation polynomial; and
      a first selector which provides the first exclusive OR circuit, the first shift calculator, and the second shift calculator with the first calculated value or the second calculated value as the scramble value in accordance with the data element of the scramble data that is input to the first exclusive OR circuit.

2. The error correction device according to claim 1, wherein:
   the syndrome calculation result generation circuit reads the plurality of data elements and the parity in the column direction of the parity-appended block while de-interleaving each of the divisional clusters stored in the internal memory unit; and
   the descramble circuit reads the plurality of data elements in the column direction of the data block while de-interleaving each of divisional clusters stored in the internal memory unit.

3. The error correction device according to claim 1, wherein:
   the predetermined number of data frames include a plurality of even number data frames and a plurality of odd number data frames that are arranged alternately in the data block, with the plurality of even number data frames including a head data frame that is processed first in the predetermined number of data frames; and
   each of the read blocks partially includes each even number data frame and partially includes each odd number data frame; and
   the descramble circuit further includes:
      a first even number register which stores the first calculated value that is calculated by the first shift calculator based on a scramble value applied to a data element arranged in a last row of a first column of each even number data frame in each read block; and
      a first odd number register for storing the first calculated value that is calculated by the first shift calculator based on a scramble value applied to a data element arranged in a last row of a first column of each odd number data frame in each read block; and
   the first selector provides the first exclusive OR circuit, the first shift calculator, and the second shift calculator with one selected from a group consisting of the first calculated value calculated by the first shift calculator, the second calculated value calculated by the second calculator, the first calculated value stored in the first even number register, and the first calculated value stored in the first odd number register as the scramble value in accordance with the data element of the scramble data that is input to the first exclusive OR circuit.

4. The error correction device according to claim 3, wherein:
   the descramble circuit further includes a third shift calculator for generating a third calculated value by shifting an initial value of the scramble value by 108 bytes in accordance with the first generation polynomial;
   the first even number register stores the initial value of the scramble value when the descrambling process is started; and
   the first odd number register stores the third calculated value when the descrambling process is started.

5. The error correction device according to claim 4, wherein the first selector:
   selects the first calculated value stored in the first even number register or the initial value when a data element arranged in a first row of a first column of each even number data frame in each read block is input to the first exclusive OR circuit;
   selects the first calculated value stored in the first odd number register or the third calculated value when a data element arranged in a first row of a first column of each odd number data frame in each read block is input to the first exclusive OR circuit;

selects the first calculated value calculated by the first shift calculator when a data element arranged in a second or subsequent row of each column of each data frame in each read block is input to the first exclusive OR circuit; and selects the second calculated value calculated by the second shift calculator when a data element arranged in a first row of each of a second or subsequent column of each data frame in each read block is input to the first exclusive OR circuit.

6. The error correction device according to claim 4, wherein:

the descramble circuit further includes:
an even-numbered work register which stores the second calculated value that is calculated by the second shift calculator based on a scramble value applied to a data element arranged in a last row of each column of a single even number data frame in each read block; and
an odd-numbered work register for storing the second calculated value that is calculated by the second shift calculator based on a scramble value applied to a data element arranged in a last row of each column of a single odd number data frame in each read block; and the first selector provides the first exclusive OR circuit, the first shift calculator, and the second shift calculator with one selected from a group consisting of the first calculated value calculated by the first shift calculator, the second calculated value calculated by the second calculator, the first calculated value stored in the first even number register, the first calculated value stored in the first odd number register, the second calculated value stored in the even-numbered work register, and the second calculated value stored in the odd-numbered work register as the scramble value in accordance with the data element of the scramble data that is input to the first exclusive OR circuit.

7. The error correction device according to claim 6, wherein the first selector selects:

the first calculated value stored in the first even number register or the initial value when a data element arranged in a first row of a first column of each even number data frame in each read block is input to the first exclusive OR circuit;

the first calculated value stored in the first odd number register or the third calculated value when a data element arranged in a first row of a first column of each odd number data frame in each read block is input to the first exclusive OR circuit;

the second calculated value stored in the even-numbered work register when a data element arranged in a first row of each of a second or subsequent column of each even number data frame in each read block is input to the first exclusive OR circuit;

the second calculated value stored in the odd-numbered work register when a data element arranged in a first row of each of a second or subsequent column of each odd number data frame in each read block is input to the first exclusive OR circuit; and the first calculated value calculated by the first calculator when a data element arranged in a second or subsequent row of each column of each data frame in each read block is input to the first exclusive OR circuit.

8. The error correction device according to claim 6, wherein:

the descramble circuit is coupled to an external memory storing the predetermined number of data frames in rows and columns; and the descramble circuit serially reads data elements of the scramble data arranged in the same column of a selected number of data frames among the predetermined number of data frames in each read block and stores the selected number of data frames in the same row of the external memory.

9. The error correction device according to claim 1, wherein: the descramble circuit reads data elements of the scramble data in each read block in accordance with an arrangement of the data elements in the data block.

10. The error correction device according to claim 1, further comprising:

an EDC syndrome generation circuit which generates an error detecting code syndrome or an intermediate value of the error detecting code syndrome for each data frame based on the descramble data generated by the descramble circuit; and an EDC memory unit for storing the error detecting code syndrome or the intermediate value of the error detecting code syndrome.

11. The error correction device according to claim 10, wherein the EDC syndrome generation circuit includes:

a second exclusive OR circuit which receives a 1-byte data element of the descramble data from the descramble circuit and performs an exclusive OR operation on the 1-byte data element and a predetermined shift calculated value to generate an error detecting code calculated value;

a first weighting circuit which generates a first weighted value by shifting weighting for the error detecting code calculated value by one byte in accordance with a second generation polynomial and stores the first weighted value into the EDC memory unit as the intermediate value of the error detecting code syndrome;

a second weighting circuit which generates a second weighted value by shifting weighting for the error detecting code calculated value by a number of bytes corresponding to {(total number of bytes of the data block in the column direction)+1−(total number of bytes in the column direction of each read block)} in accordance with the second generation polynomial;

a third weighting circuit which generates a third weighted value by shifting weighting for the error detecting code calculated value by 108 bytes in accordance with the second generation polynomial and stores the third weighted value into the EDC memory unit as the error detecting code syndrome;

a third exclusive OR circuit which generates a fourth weighted value by performing an exclusive OR operation on the first weighted value and the second weighted value; and a second selector which provides the second exclusive OR circuit with one selected from a group consisting of the first weighted value, the second weighted value, and the fourth weighted value as the shift calculated value in accordance with a data element of the descramble data that is input to the second exclusive OR circuit.

12. The error correction device according to claim 11, wherein:

the predetermined number of data frames include a plurality of even number data frames and a plurality of odd number data frames that are arranged alternately in the data block, with the plurality of even number data frames including a head data frame that is processed first in the predetermined number of data frames;

the EDC memory unit stores the first weighted value as the intermediate value of the error detecting code syndrome when the error detecting code calculated value generated based on a data element arranged in a last row of a last column of each data frame in each read block is provided to the first weighting circuit;

the EDC memory unit stores the third weighted value as the error detecting code syndrome when the error detecting code calculated value generated based on a data element arranged in a last row of a last column of each even number data frame in a last read block of the plurality of read blocks is provided to the third weighting circuit; and the EDC memory unit stores the error detecting code calculated value generated based on a data element arranged in a last row of a last column of each odd number data frame in the last read block as the error detecting code syndrome.

13. The error correction device according to claim 11, wherein the EDC syndrome generation circuit further includes:

a fourth weighting circuit which generates a fifth weighted value by inversely shifting weighting for the error detecting code calculated value by 211 bytes in accordance with the second generation polynomial and stores the fifth weighting value into the EDC memory unit as the intermediate value of the error detecting code syndrome.

14. The error correction device according to claim 13, wherein:

the predetermined number of data frames include a plurality of even number data frames and a plurality of odd number data frames that are arranged alternately in the data block, with the plurality of even number data frames including a head data frame that is processed first in the predetermined number of data frames; and the EDC memory unit stores the fifth weighted value as the intermediate value of the error detecting code syndrome when the fourth weighting circuit is provided with the error detecting code calculated value generated based on a last data element to which the error detecting code is appended last in each even number data frame of each read block.

15. The error correction device according to claim 11, wherein the second selector:

selects the first weighted value when a data element arranged in a second or subsequent row of each data frame in each read block is input to the second exclusive OR circuit;

selects the second weighted value when a data element arranged in a first row of each column, excluding a first column and a last column, of each data frame in each read block is input to the second exclusive OR circuit; and the second selector selects the fourth weighted value when a data element arranged in a first row of a last column of each data frame in each read block is input to the second exclusive OR circuit.

16. The error correction device according to claim 11, wherein:

the EDC syndrome generation circuit further includes a work memory for storing the second weighted value calculated based on a data element arranged in a last row of each column of each data frame in each read block, with the work memory providing the third exclusive OR circuit and the second selector with the stored second weighted value; and the second selector provides the second exclusive OR circuit with one selected from a group consisting of the first weighted value, the fourth weighted value, and the second weighted value stored in the work memory as the shift calculated value in accordance with the data element of the scramble data that is input to the second exclusive OR circuit.

17. The error correction device according to claim 16, wherein the second selector:

selects the first weighted value when a data element arranged in a second or subsequent row of each data frame in each read block is input to the second exclusive OR circuit;

selects the second weighted value stored in the work memory when a data element arranged in a first row of each column, excluding a first column and a last column, of each data frame in each read block is input to the second exclusive OR circuit; and selects the fourth weighted value when a data element arranged in a first row of a last column of each data frame in each read block is input to the second exclusive OR circuit.

18. A reading device for reading demodulated data, the reading device comprising:

an error correction device including:

a demodulation circuit which demodulates modulated data to generate a cluster, wherein the cluster includes a parity-appended block that has been subjected to interleaving, the parity-appended block includes a data block, which has a plurality of data elements arranged in rows and columns to form a predetermined number of data frames, and a parity, which is appended to the data block in a column direction, and the data block includes scramble data that is generated by scrambling each data frame;

an internal memory unit which stores at least one of a plurality of divisional clusters divided from the cluster;

a syndrome calculation result generation circuit which reads the parity-appended block while de-interleaving each of the plurality of divisional clusters using the internal memory unit and generating a syndrome calculation result for each column of the parity-appended block;

a descramble circuit which reads the data block as a plurality of read blocks while de-interleaving each of the plurality of divisional clusters using the internal memory unit and descrambles the scramble data of each read block to generate descramble data; and an error correction circuit which performs error correction on the descramble data based on the syndrome calculation result, wherein the descramble circuit includes:

a first exclusive OR circuit which applies a predetermined scramble value to a data element of the descramble data read from the internal memory unit to calculate the data element of the scramble data;

a first shift calculator which generates a first calculated value by shifting the scramble value by one byte in accordance with a first generation polynomial;

a second shift calculator which generates a second calculated value by shifting the scramble value by a number of bytes corresponding to {(total number of bytes of the data block in the column direction)+1−(total number of bytes of each read block in the column direction)} in accordance with the first generation polynomial; and a first selector which provides the first exclusive OR circuit, the first shift calculator, and the second shift calculator with the first calculated value or the second calculated value as the scramble value in accordance with the data element of the scramble data that is input to the first exclusive OR circuit.

19. A descramble circuit for generating descramble data from scramble data read, the descramble circuit comprising:

an exclusive OR circuit which calculates a data element of the descramble data by applying a predetermined scramble value to a data element of the scramble data, wherein the scramble data is stored in the optical disc in data block including a plurality of data elements arranged in rows and columns and the descramble circuit reads the scramble data of the data block as a plurality of read blocks;

a first shift calculator which generates a first calculated value by shifting the scramble value by one byte in accordance with a first generation polynomial;

a second shift calculator which generates a second calculated value by shifting the scramble value by a number of bytes corresponding to {(total number of bytes of the data block in the column direction)+1−(total number of bytes of each read block in the column direction)} in accordance with the first generation polynomial; and a selector which provides the exclusive OR circuit, the first shift calculator, and the second shift calculator with the first calculated value or the second calculated value as the scramble value in accordance with the data element of the scramble data that is input to the exclusive OR circuit.

\* \* \* \* \*